(12) United States Patent
Lauder et al.

(10) Patent No.: US 8,665,044 B2
(45) Date of Patent: Mar. 4, 2014

(54) COVER FOR AN ELECTRONIC DEVICE

(75) Inventors: Andrew Lauder, San Francisco, CA (US); Matthew D. Rohrbach, San Francisco, CA (US); Daniel J. Coster, San Francisco, CA (US); Christopher J. Stringer, Woodside, CA (US); Florence W. Ow, San Francisco, CA (US); Jiang Ai, Cupertino, CA (US); Jonathan P. Ive, San Francisco, CA (US); Elvis M. Kibiti, San Francisco, CA (US); John P. Ternus, Redwood City, CA (US); Sean D. Lubner, Trumbull, CT (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/620,859

(22) Filed: Sep. 15, 2012

(65) Prior Publication Data

US 2013/0100055 A1    Apr. 25, 2013

Related U.S. Application Data

(63) Continuation of application No. 12/971,567, filed on Dec. 17, 2010, now Pat. No. 8,390,411, which is a continuation-in-part of application No. 29/375,197, filed on Sep. 17, 2010, now Pat. No. Des. 658,186.

(60) Provisional application No. 61/384,179, filed on Sep. 17, 2010.

(51) Int. Cl.
| | |
|---|---|
| *H01F 7/00* | (2006.01) |
| *H01F 1/00* | (2006.01) |
| *H01F 7/02* | (2006.01) |
| *B65D 5/52* | (2006.01) |
| *B65D 25/24* | (2006.01) |

(52) U.S. Cl.
USPC .......... 335/219; 335/285; 335/302; 335/303; 335/304; 335/306; 335/205; 361/807; 361/679.01; 361/600; 24/303; 206/45.2; 206/45.23; 206/45.24; 206/320; 206/764; 345/111

(58) Field of Classification Search
USPC ................. 335/219, 285, 302–306, 205–207; 439/38, 218, 217, 39; 24/303; 361/807, 361/679.01, 600; 206/45.2, 45.23, 45.24, 206/305, 320, 764, 765; 345/111
See application file for complete search history.

(56) References Cited

U.S. PATENT DOCUMENTS

| | | | | |
|---|---|---|---|---|
| 5,949,050 | A * | 9/1999 | Fosbenner et al. | 235/449 |
| 2004/0227730 | A1 * | 11/2004 | Sugihara | 345/157 |
| 2005/0248075 | A1 * | 11/2005 | McLaughlin | 269/289 R |
| 2009/0251262 | A1 * | 10/2009 | Fullerton et al. | 335/306 |
| 2009/0251406 | A1 * | 10/2009 | Seibert et al. | 345/156 |

* cited by examiner

*Primary Examiner* — Mohamad Musleh
(74) *Attorney, Agent, or Firm* — Womble Carlyle Sandridge & Rice LLP

(57) ABSTRACT

A magnetic attachment mechanism and method is described. The magnetic attachment mechanism can be used to releasably attach at least two objects together in a preferred configuration without fasteners and without external intervention. The magnetic attachment mechanism can be used to releasably attach an accessory device to an electronic device. The accessory device can be used to augment the functionality of usefulness of the electronic device.

20 Claims, 52 Drawing Sheets

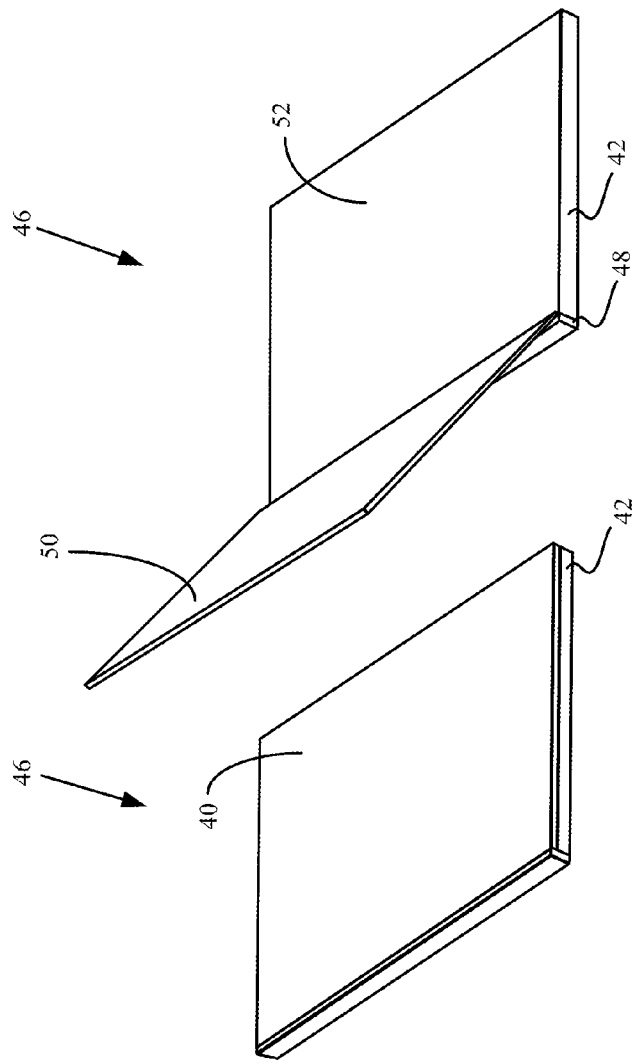
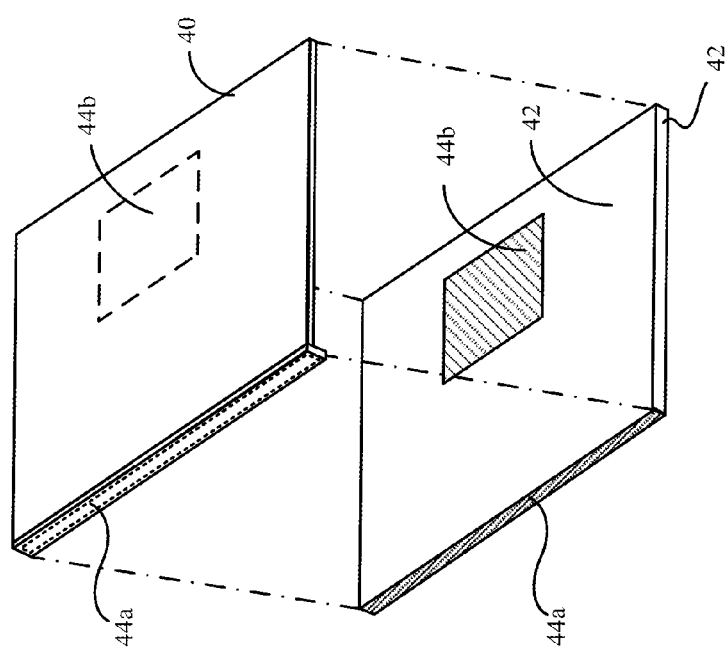
Fig. 4C
Fig. 4B
Fig. 4A

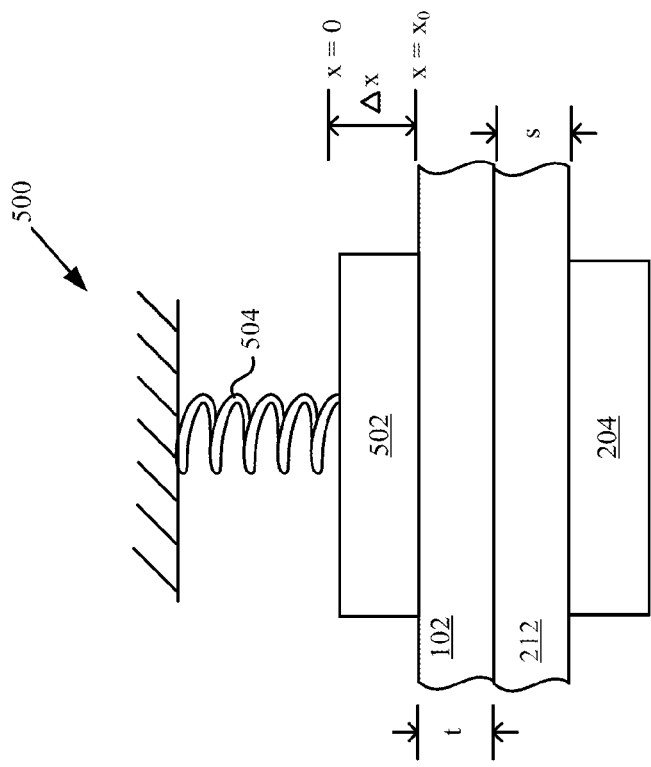
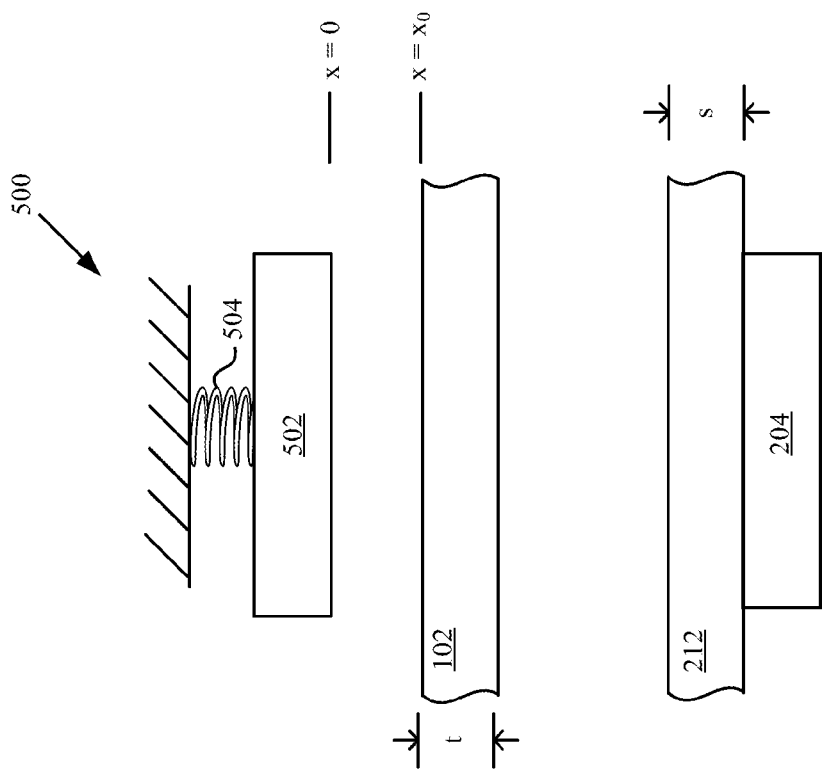
Fig. 9B
Fig. 9A

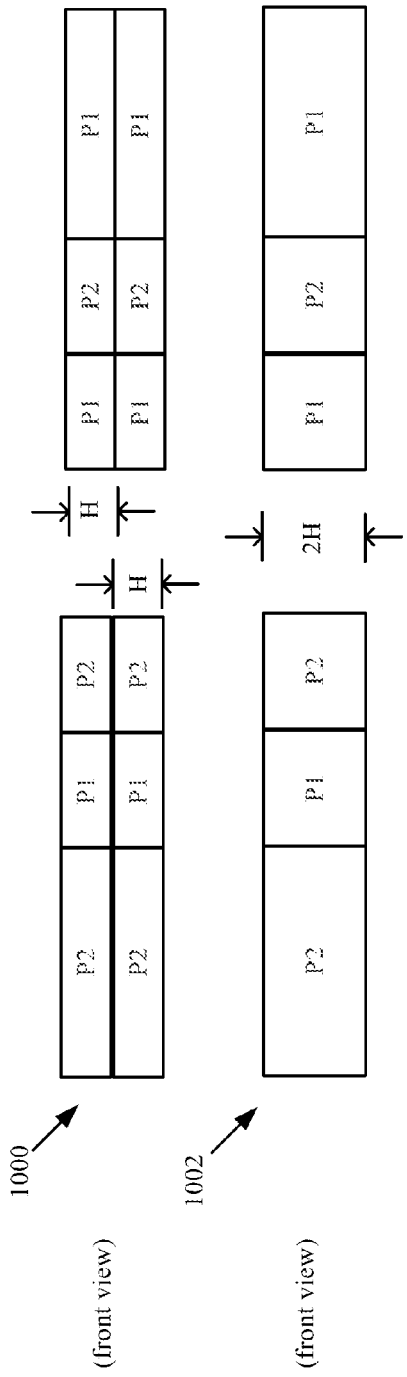
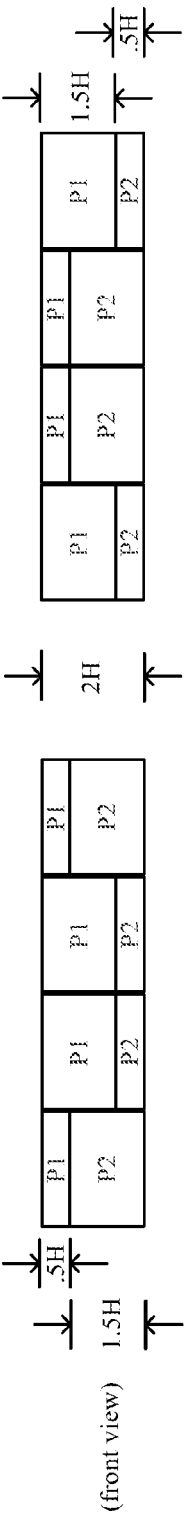
Fig. 14
Fig. 15

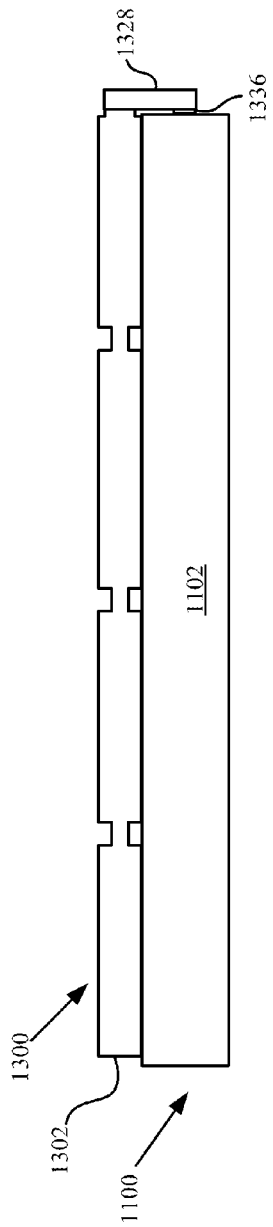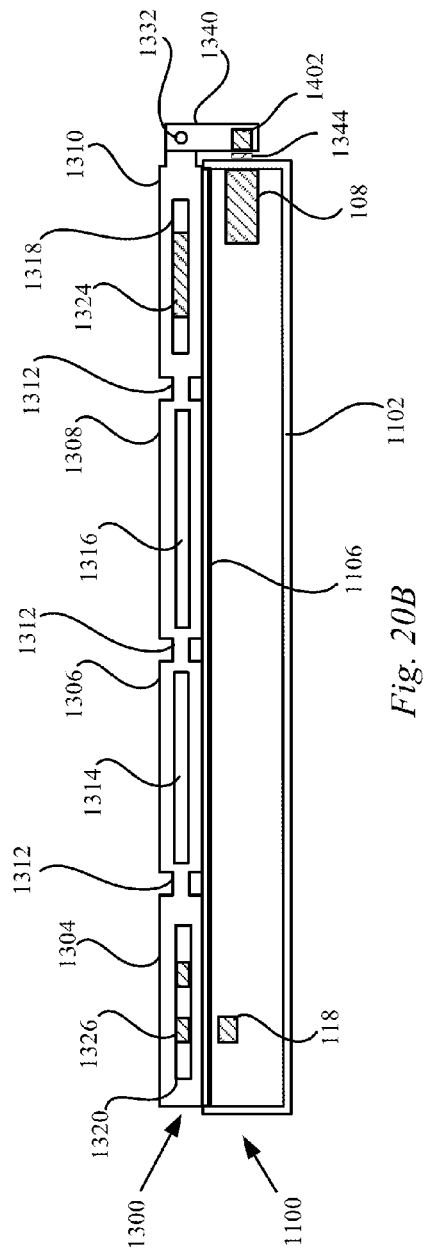
Fig. 20A
Fig. 20B

COVER FOR AN ELECTRONIC DEVICE

CROSS REFERENCE TO RELATED APPLICATIONS

This U.S. Patent Application is a continuation of and claims priority under 35 USC §120 to co-pending U.S. application Ser. No. 12/971,567, filed Dec. 17, 2010 and entitled "Sensor" by Lauder et al. that, in turn, (i) is a Continuation in Part and claims priority under 35 USC §120 to U.S. Design Patent Application No. 29/375,197 that issued as D658,186, filed Sep. 17, 2010 and entitled "Cover" by Akana et al., and (ii) claims priority under 35 U.S.C. 119(e) to U.S. Provisional Patent Application No. 61/384,179, filed Sep. 17, 2010 and entitled "Apparatus and Method for Magnetic Attachment" by Lauder et al., each of which are incorporated by reference in their entirety for all purposes.

FIELD OF THE DESCRIBED EMBODIMENTS

The described embodiments generally relate to portable electronic devices. More particularly, the present embodiments describe various releasable attachment techniques well suited for portable electronic devices.

DESCRIPTION OF THE RELATED ART

Recent advances in portable computing includes the introduction of hand held electronic devices and computing platforms along the lines of the iPad™ tablet manufactured by Apple Inc. of Cupertino, Calif. These handheld computing devices can be configured such that a substantial portion of the electronic device takes the form of a display used for presenting visual content leaving little available space for an attachment mechanism that can be used for attaching an accessory device.

Conventional attachment techniques generally rely upon mechanical fasteners that typically require at least an externally accessible attaching feature on the electronic device to mate with a corresponding attaching feature on the accessory device. The presence of the external attaching feature can detract from the overall look and feel of the handheld computing device as well as add unwanted weight and complexity as well as degrade the appearance of the hand held computing device.

Therefore a mechanism for releasably attaching together at least two objects is desired.

SUMMARY OF THE DESCRIBED EMBODIMENTS

This paper describes various embodiments that relate to a system, method, and apparatus for releasably attaching an accessory to an electronic device.

An electronic device includes at least a housing having side walls and an front facing opening, a display and a topmost protective layer, the display disposed within the front facing opening arranged to present visual content, a first sensor located at a first position in the electronic device, the first sensor arranged to detect a magnetic field propagated by a magnetic element in near proximity to the sensor, and a second sensor located at a second position in the electronic device, wherein the first sensor and the second sensor cooperate to determine if a portion of the display that is fully viewable, and wherein the display presents visual content only in that portion of the display determined by the first and second sensors to be fully viewable.

A consumer product system includes at least an electronic device comprising: a housing having side walls and an front facing opening, a display and a topmost protective layer, the display disposed within the front facing opening arranged to present visual content, a first sensor located at a first position in the electronic device, the first sensor arranged to detect a magnetic field propagated by a magnetic element in near proximity to the sensor, a second sensor located at a second position in the electronic device, wherein the first sensor and the second sensor cooperate to determine if a portion of the display that is fully viewable such that the display presents visual content only in that portion of the display determined by the first and second sensors to be fully viewable.

In another embodiment, a method for intelligently presenting visual content by a display can be performed by determining a portion of the display that is viewable and presenting visual content only at the viewable portion of the display.

A controlled visual system includes at least a display arranged to present visual content, a first sensor, and second sensor that cooperates with the first sensor to alter an operation of the display. In the described embodiment, when the first sensor determines that the display is unviewable, then the first sensor alters the operation of the display consistent with the display being unviewable. On the other hand, when the first sensor and the second sensor cooperate to determine that a portion but not all of the display is viewable, then the first and second sensors alter the operation of the display consistent with presenting visual content only at the viewable portion of the display.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The embodiments will be readily understood by the following detailed description in conjunction with the accompanying drawings, wherein like reference numerals designate like structural elements, and in which:

FIG. 4A is a simplified perspective view of an article that is releasably attachable to an electronic device via the top and side magnetic attachment systems.

FIG. 4B shows a cooperating system of the attached article and the electronic device shown in FIG. 4A in a closed configuration.

FIG. 4C shows the cooperating system of FIG. 4B in an open configuration.

FIG. 9A shows a representative device attachment feature in an inactive state.

FIG. 9B shows the representative device attachment feature of FIG. 9A activated by another magnetic attachment feature.

FIGS. 14 and 15 show various embodiments of magnetic elements used in the keyed magnetic attachment feature.

FIG. 20A shows a side view of the segmented cover assembly shown in FIG. 18 attached to a tablet device.

FIG. 20B-20C show cross section views of the segmented cover assembly and tablet device of FIG. 20A.

DETAILED DESCRIPTION OF SELECTED EMBODIMENTS

Figure 1:
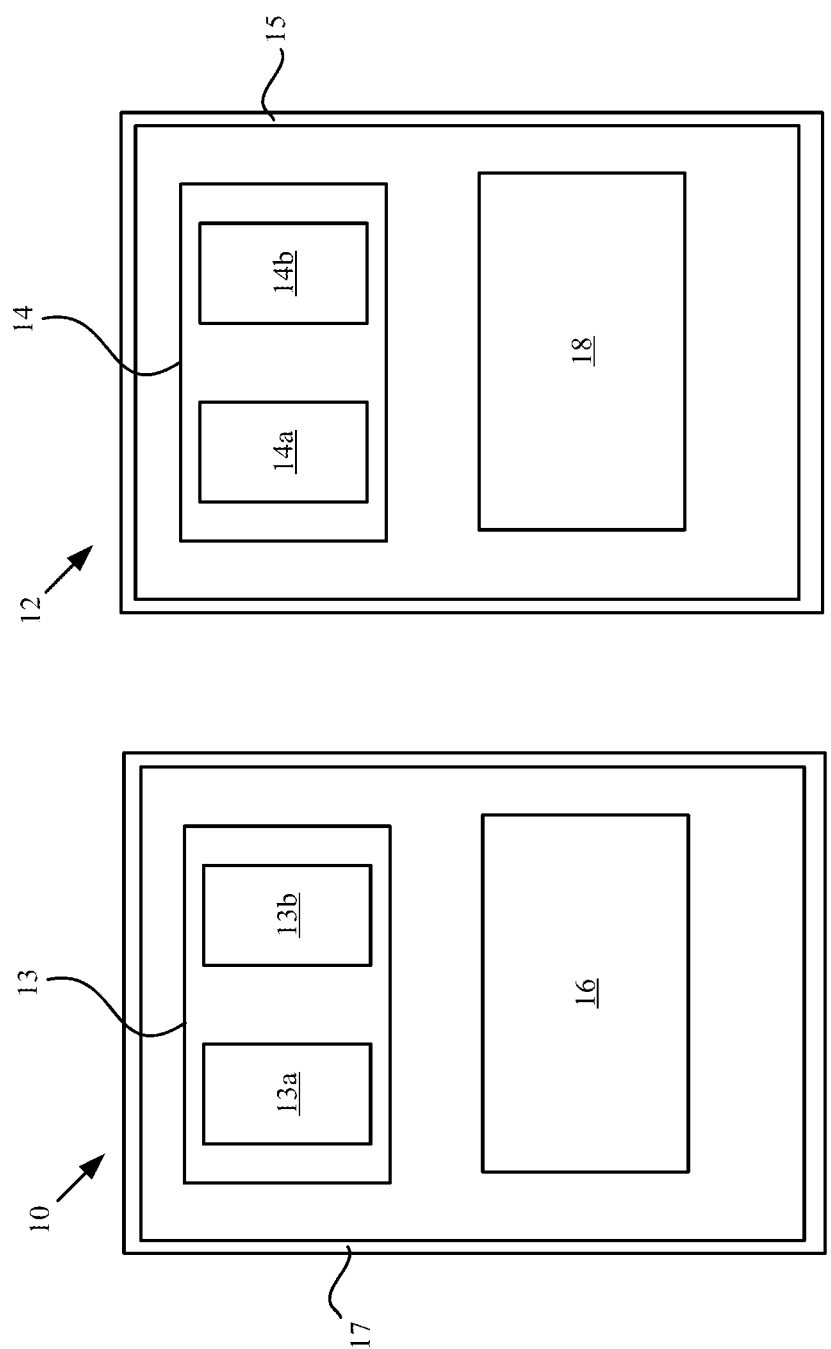
FIG. 1 is a simplified block diagram of an article and an electronic device that can be releasably attached to each other in a desired and repeatable manner.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following description relates in general to a mechanism that can be used to attach together at least two suitably configured objects. In one embodiment, this can be accomplished without the use of conventional fasteners. Each of the objects can include an attachment feature arranged to provide a magnetic field having appropriate properties. When the attachment features are brought into proximity with each other, the magnetic fields can cooperatively interact based upon their respective properties, result in the objects magnetically attaching to each other in a desired and repeatable manner. For example, due at least in part to the cooperative nature of the interaction of the magnetic fields, the objects can attach to each other in a pre-determined position and relative orientation without external intervention. For example, the cooperative magnetic interaction can result in the objects self-aligning and self-centering in a desired orientation.

The objects can remain in the magnetically attached state if and until a releasing force of sufficient magnitude is applied that overcomes the overall net attractive magnetic force. In some cases, however, it can be desirable to detach the objects serially (along the lines of a zipper) in which case, the releasing force only need be of sufficient magnitude to overcome the net magnetic attractive force of one pair of magnetic elements at a time. Connectors such as mechanical fasteners are not required to attach the objects together. Furthermore, to prevent undue interference to the magnetic interaction between the magnetic attachment features, at least a portion of the objects in the vicinity of the magnetic attachment features can be formed of magnetically inactive materials such as plastic or non-ferrous metals such as aluminum or non-magnetic stainless steel.

The objects can take many forms and perform many functions. When magnetically attached to each other, the objects can communicate and interact with each other to form a cooperative system. The cooperating system can perform operations and provide functions that cannot be provided by the separate objects individually. In another embodiment, at least one device can be used as an accessory device. The accessory device can be magnetically attached to at least one electronic device. The accessory device can provide services and functions that can be used to enhance the operability of the electronic device(s). For example, the accessory device can take the form of a protective cover that can be magnetically attached to the electronic device. The protective cover can provide protection to certain aspects (such as a display) of the electronic device while enhancing the overall look and feel of the electronic device. The magnetic attachment mechanism used to magnetically attach the accessory and the electronic device can assure that the cover can only attach to the electronic device in a specific orientation. Moreover, the magnetic attachment mechanism can also assure proper alignment and positioning of the protective cover and the electronic device.

The protective cover can include at least a hinge portion. The hinge portion can be magnetically attached to the electronic device using a magnetic attachment feature. The hinge portion can be pivotally connected to a flap that can be placed upon a portion of the electronic device to be protected. The protective cover can include electronic circuits or other elements (passive or active) that can cooperate with electronic elements in the electronic device. As part of that cooperation, signals can be passed between the protective cover and the electronic device that can, for example, be used to modify operations of the electronic device, operations of electronic circuits or elements of the protective cover, and so forth.

As an example, the electronic device can include a magnetically sensitive circuit such as a Hall Effect sensor and as such can detect the presence of a magnetic field. The Hall Effect sensor can respond to the presence (or absence) of the magnetic field by generating a signal. The signal can be used to alter an operating state of the electronic device. Accordingly, the protective cover can include a magnetic element such as a permanent magnet having a magnetic field that can cause the Hall Effect sensor to generate the signal. The magnetic element can be positioned on the protective cover in a location that triggers the Hall Effect sensor to generate the signal when the cover is placed on or in proximity to a surface of the electronic device. The signal can indicate that the protective cover is in a predetermined position relative to the electronic device that can result in a change in an operating state of the electronic device. For example, with the portion of the protective cover having the magnetic element in proximity to the Hall Effect sensor, the magnetic field from the magnetic element can cause the Hall Effect sensor to generate a signal. The signal can, in turn, be used to alter the operating state to one consistent with the display of the electronic device being fully covered. On the other hand, when the portion of the protective cover having the magnetic element is removed to the point where the Hall Effect sensor no longer responds to the magnetic field of the magnetic element, then the Hall Effect sensor can generate another signal. The other signal can result in the electronic device entering another, different, operating state consistent with at least a portion of the display being uncovered and viewable.

These and other embodiments are discussed below with reference to FIGS. 1-40. However, those skilled in the art will readily appreciate that the detailed description given herein with respect to these figures is for explanatory purposes only and should not be construed as limiting. For the remainder of this discussion, a first and second object each suitably configured to magnetically attach to each other in accordance with the described embodiments will be described. It should be noted, however, that any number and type of suitably configured objects can be magnetically attached to each other in a precise and repeatable manner. In particular, for simplicity and clarity, for the remainder of this discussion, the first object is presumed to take the form of an electronic device and in particular a handheld electronic device.

FIG. 1 is a simplified block diagram of article 10 and electronic device 12 that can be releasably attached to each other in a desired and repeatable manner. More specifically, article 10 and electronic device 12 can attach to each other at a pre-determined position and relative orientation without external intervention and without the use of mechanical fasteners. Article 10 and electronic device 12 can remain attached to each other if and until a releasing force is applied that overcomes the engagement between them. In some cases, however, it can be desirable to detach article 10 and electronic device 12 serially (along the lines of a zipper) in which case, a releasing force can be applied that can undo the engagement between article 10 and electronic device 12 about one attachment component at a time. For example, an attachment component can include a suitably matched pair of magnetic elements, one in article 10 and a second in electronic device 12.

Electronic device 12 can take many forms. For example, electronic device 12 can take the form of a portable electronic device. In some examples, the portable electronic device can include housing 15. Housing 15 can enclose and provide support for components of the portable electronic device.

Housing 15 can also provide support for at least a large and prominent display occupying a substantial portion of a front face of the portable electronic device. The display can be used to present visual content. The visual content can include still images, visual, textual data, as well as graphical data that can include icons used as part of a graphical user interface, or GUI.

In some cases, at least a portion of the display can be touch sensitive. By touch sensitive it is meant that during a touch event, an object (such as a finger, stylus, and so on) can be placed in contact with or in proximity to an upper surface of the display. The particulars of the touch event (location, pressure, duration, and so forth) can be used to provide information to the portable electronic device for processing. In some embodiments, in addition to or in place of information being provided to the portable electronic device, information can be provided by the portable electronic device in a tactile manner using, for example, haptic actuators. It should be appreciated however that this configuration is by way of example and not by way of limitation as the electronic device can be widely varied. In one example, the portable electronic device is a tablet computer such as, for example, the iPad™ manufactured by Apple Inc. of Cupertino, Calif.

Article 10 can be widely varied and can take many forms such as, for example, an accessory or accoutrement of electronic device 12. As an accessory, article 10 can be configured as a cover, a stand, a dock, a hanger, an input/output device and so on. In a particularly useful form, article 10 can take the form of a protective cover that can include a member, such as a flap, that can be positioned over the display of the portable electronic device. Like the electronic device 12, the article 10 can also include housing 17 that can enclose and provide support for components of the article 10.

Either one or both of article 10 and electronic device 12 can include attachment features. For example, article 10 can include attachment system 13 and electronic device 12 can include corresponding attachment system 14. Attachment system 13 can cooperate with corresponding attachment system 14 to attach article 10 and electronic device 12 in a releasable manner. When attached to each other, article 10 and electronic device 12 can operate as a single operating unit. On the other hand, in the detached mode, article 10 and electronic device 12 can act separately, and if desired, as two individual parts. Attachment systems 13 and 14 can be configured in such a way that article 10 and electronic device 12 can attach to each other in a desired and repeatable manner. In other words, attachment systems 13 and 14 can repeatedly align article 10 and electronic device 12 together such that they are consistently in a pre-determined position relative to one another.

The attachment features can be widely varied. The attachment can be provided by various types of couplings including mechanical, electrical, static, magnetic, frictional, and/or the like. In one embodiment, the attachment cannot be seen from the outside of the article and/or electronic device. For example, the article and device can not include external visible attachment features that adversely affect the look and feel or ornamental appearance (e.g., snaps, latches, etc.), but rather attachment features that cannot be seen from the outside of the article or device and thus do not affect the look and feel or ornamental appearance of the article or device. By way of example, the attachment features can be provided by attraction surfaces that do not disturb the external surfaces of the article or device. In one embodiment, at least a portion of the attachment features utilize magnetic attraction to provide some or all of the attaching force.

The attachment systems can include one or more attachment features. If multiple features are used, the manner in which they secure can be the same or different. For example, in one implementation, a first attachment feature utilizes a first attachment means while a second attachment feature utilizes a second attachment means that is different than the first attachment means. For example, the first attachment means can utilize a friction coupling while the second attachment means can utilize magnetism. In another implementation, a first attachment feature utilizes a first attachment means while a second attachment feature utilizes the same or similar attachment means. For example, the first and second attachment means can be provided by magnets. Although, the attachment means can be similar it should be appreciated that the configuration of the features can be different depending on the needs of the system. Further, any number and configuration of attachment means can be used.

In the illustrated embodiment, the attachment systems 13 and 14 each include at least a first set of corresponding attachment features 13a/14a and a second set of corresponding attachment features 13b/14b. Attachment feature 13a can cooperate with corresponding attachment feature 14a to attach article 10 and electronic device in a releasable manner. In one particular implementation this is accomplished with magnetic attraction. Further, attachment feature 13b can cooperate with corresponding attachment feature 14b to further attach article 10 and electronic device in a releasable manner. In one particular implementation this is accomplished with magnetic attraction. By way of example, attachment features 13a/14a can be provided at a first location while attachment features 13b/14b can be provided at a second location.

In a specific example, attachment feature 14a can, in cooperation with attachment feature 13a, secure electronic device 12 to article 10. In another example, attachment feature 13b can secure article 10 to the electronic device 12 using attachment feature 14b. It should be noted that the attachment systems 13 and 14 of this example can be separate or they can cooperate together to produce the attachment. If they cooperate, attachment features 14a and 14b correspond to or mate with one or more attachment features 13a and 13b. In any case, the attachment features in any of these examples can be accomplished through mechanical, static, suction, magnetic attachment and/or the like.

The placement of the attachment systems and the attachment features within the attachment systems can be widely varied. Regarding electronic device 12, attachment system 14 can be placed on front, back, top, bottom, and/or sides. Attachment features 14a and 14b can be placed any location within attachment system 14. Accordingly, attachment features 14a and 14b can be placed anywhere relative to the housing and/or the display. In one example, the attachment features 14a and 14b can provide engagement along one or more of the sides of the housing (e.g., top, bottom, left, right). In another example, attachment features 14a and 14b can provide engagement at the back of electronic device 12. In yet another example, attachment features 14a and 14b can provide engagement at the front (e.g., where, if present, a display is located) of electronic device 12. In some cases, a combination of attachment features can be located at different regions of electronic device 12 as for example at the sides and front. In one embodiment, attachment system 14 including attachment features 14a and 14b do not disturb the surfaces of electronic device 12. Similarly, attachment system 13 and in particular attachment features 13a and 13b do not disturb the surfaces of article 10.

In accordance with one embodiment, the attachment features can include magnetic elements. The magnetic elements can be configured to help in positioning article 10 relative to electronic device 12 into a mating arrangement. The magnetic elements can further help to secure article 10 and electronic device 12 into a mating engagement. It should be noted that the engagement of article 10 and electronic device 12 can be reversed by the application of an appropriate releasing force that allows article 10 and electronic device 12 to separate back into individual objects. However, the magnetic elements can permit the article 10 and electronic device 12 to subsequently resume the mating engagement without the requirement of fasteners of any sort, mechanical or otherwise. In this way, the magnetic elements provide a repeatable and consistent engagement between article 10 and electronic device 12.

Article 10 and electronic device 12 can further include components 16 and 18 respectively. Components 16 and 18 typically depend on the configuration of article 10 and electronic device 12 and can, for example, be mechanical or structural components used to provide support or they can be operational/functional components that can provide a specific set of operations/functions. The components can be dedicated to their respective devices or they may be configured for coupling with aspects of the corresponding article or device (e.g., wired or wireless). Examples of structural components can include frames, walls, fasteners, stiffeners, movement mechanisms (hinge), etc. Examples of operational components can include processors, memory, batteries, antennas, circuitry, sensors, display, inputs, and so on. Depending on their desired configuration, the components can be external (i.e., exposed at the surface) and/or internal (e.g., embedded within housing).

Figure 2A:
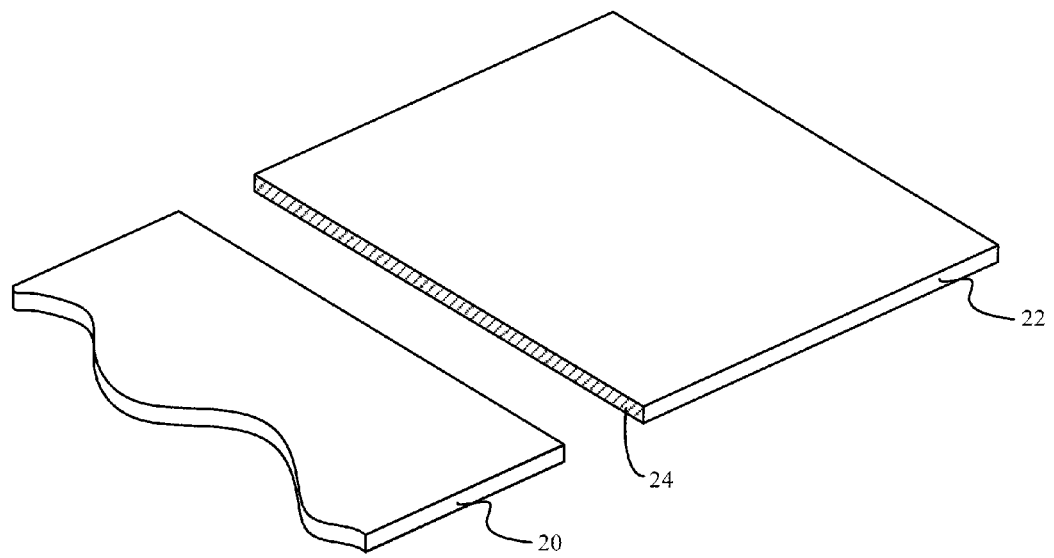
FIG. 2A is a simplified perspective view of an article that can be releasably attached to an electronic device via a side magnetic attachment system, in accordance with one described embodiment.
Figure 2B:
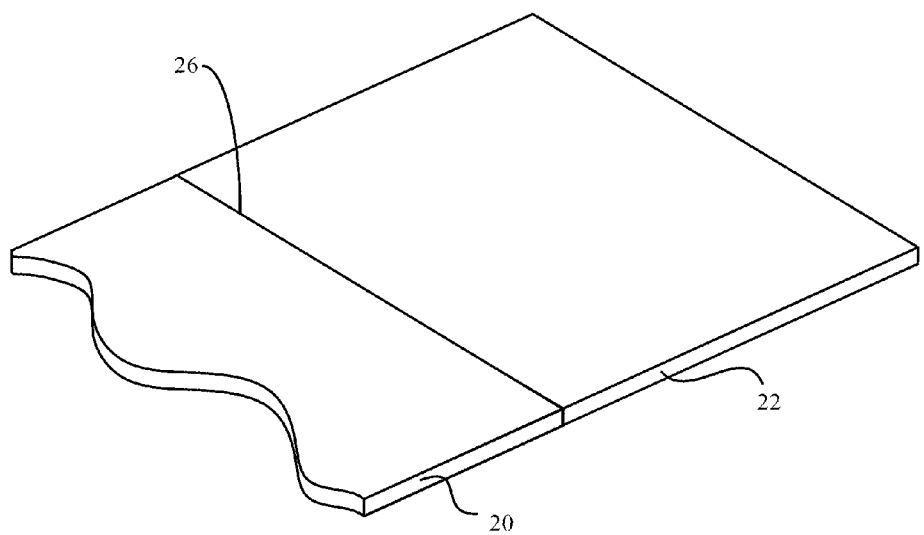
FIG. 2B shows the article and the electronic device of FIG. 2A attached in accordance with the side magnetic attachment system.

FIGS. 2A and 2B are simplified perspective views of article 20 that can be releasably attached to electronic device 22 via a magnetic attachment system, in accordance with one described embodiment. Article 20 and electronic device 22 can generally correspond to those discussed with regards to FIG. 1. In one embodiment, the magnetic attachment system can be embodied as magnetic surface 24 (shown by broken lines or shading) and more particularly as magnetic surface 24 at the sides of electronic device 22. Magnetic surface 24 can provide a magnetic field that can cooperate with a corresponding attachment feature in article 20 when placed in proximity to one another. The magnetic field can establish a net magnetic attractive force that can pull article 20 and electronic device 22 together into the mating engagement along engagement surface 26 as shown in FIG. 2B.

In other words, the magnetic field provided by magnetic surface 24 can have properties such that the net magnetic attractive force between article 20 and electronic device 22 is substantially perpendicular to engagement surface 26. Moreover, the magnetic field can result in the net magnetic attractive force between article 20 and electronic device 22 being applied uniformly along engagement surface 26. In order to release article 20 and electronic device 22, a releasing force can be applied to the two conjoined objects in order to overcome a net magnetic attractive force provided by the magnetic attachment system.

It also should be appreciated that although only one side wall is shown, in some cases different sidewalls and possibly a combination of sidewalls may be used depending on the needs of the attachment interface. It should be noted that the use of magnetic attachment precludes the need for mechanical attachments such as fasteners. Moreover, the lack of mechanical attachments and the uniformity of the overall magnetic attractive force can leave the surfaces of article 20 and electronic device 22 undisturbed helping to create an appearance of oneness by in which article 20 and electronic device 22 can appear as a single, unified entity. The uniformity in appearance can improve the overall aesthetic appeal of both article 20 and electronic device 22.

In one embodiment, a magnetic surface can be created by embedding magnetically attractable elements in the form of the magnetic attachment feature within the sidewalls of electronic device 22 and/or article 20. That is, the magnetically attractable elements can be disposed within article 20 and electronic device 22 as for example within the housing of electronic device 22. In this configuration, the housing can be formed of non-magnetic material such as plastic or non-ferrous metal such as aluminum. In this way, magnetic force lines can be configured to work through the walls of the housing. The magnetic attachment features do not disturb the physical appearance of the external surfaces of article 20 and electronic device 22. The magnetically attractable elements in article 20 and electronic device 22 can be arranged to produce magnetic fields that can cooperate with each other to generate a magnetic attractive force that attaches article 20 and electronic device 22 together in the mating engagement. The magnetic attractive force being configured to generate a magnetic attraction force normal to engagement surface 26 between electronic device 22 and article 20.

The magnetic attractive force between corresponding magnetic elements in article 20 and electronic device 22 can also be uniformly applied along engagement surface 26. The uniformity of the overall magnetic attractive force along engagement surface 26 can be a result of the uniformity of the separation distance between corresponding magnetic elements in article 20 and electronic device 22. The uniformity can also be a result of the consistency of magnetic flux density between corresponding magnetic elements in article 20 and electronic device 22. The uniformity of net magnetic attachment can be facilitated by the surfaces of article 20 and electronic device 22 each forming a well matched fit to each other. For example, one surface can be flat or have a concave geometry whereas the other surface can have a matching conforming convex geometry. In this way, by fitting tightly together, a separation distance between each of the corresponding magnetic elements in article 20 and electronic device 22 can be reduced to a minimum. The conformity of surface shapes can also enhance the overall look and feel of article 20 and electronic device 22 by reducing or eliminating the appearance of a seam at engagement surface 26. This seamless quality can provide an illusion of a single entity when article 20 and electronic device 22 are attached to each other.

In addition to enhancing the overall look and feel, the consistency of the separation distance between the magnetic elements can render the attachment force between article 20 and electronic device 22 uniform along engagement surface 26. In this way, the engagement force can be uniformly distributed across engagement surface 26 preventing buckling, weak spots, and so on that might otherwise affect the overall integrity of the engagement between article 20 and electronic device 22.

Figure 3A:
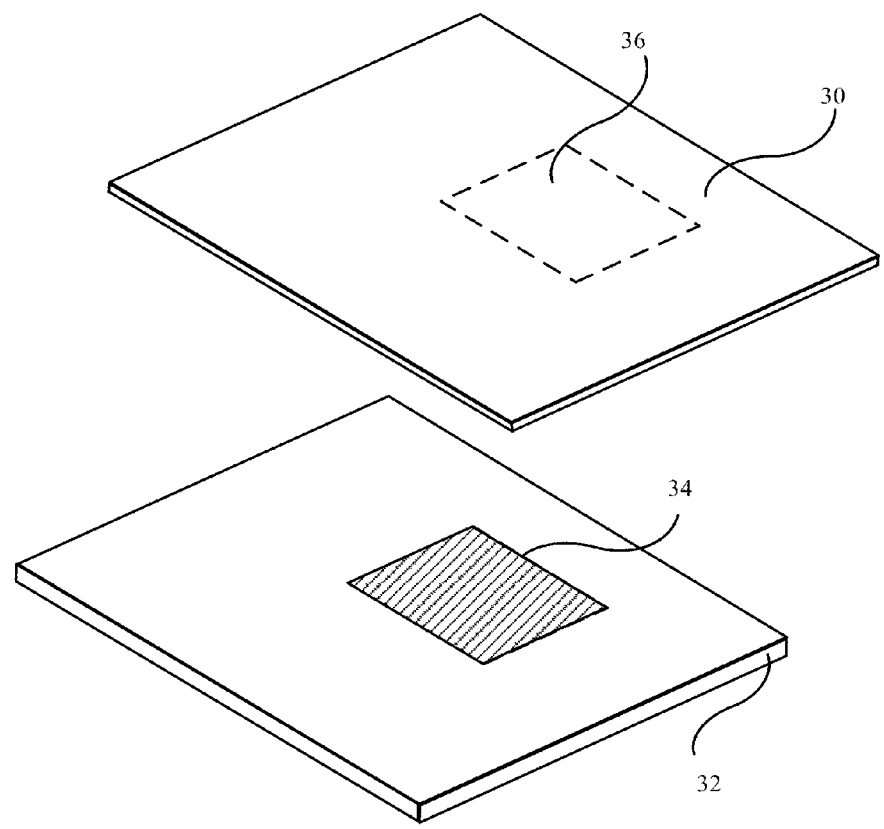
FIG. 3A is a simplified perspective view of an article that is releasably attachable to an electronic device via a top magnetic attachment system in accordance with one described embodiment.
Figure 3B:
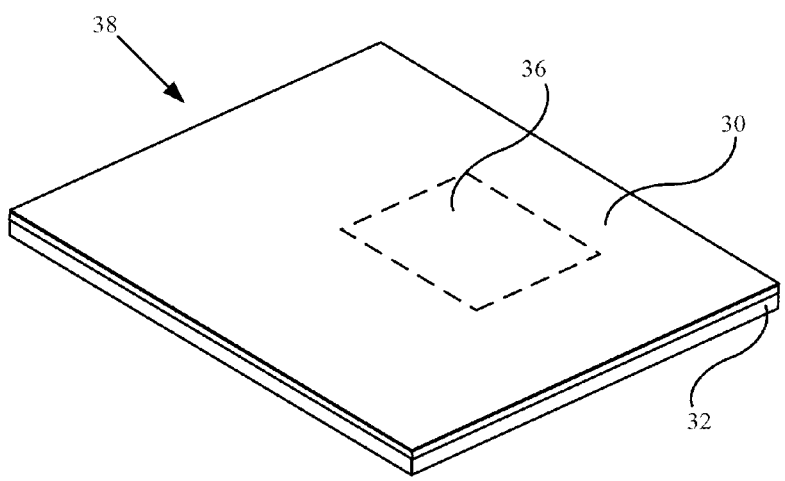
FIG. 3B shows the article and the electronic device of FIG. 3A magnetically attached to each to each other to form a cooperating system using the top magnetic attachment system.

FIGS. 3A and 3B are simplified perspective views of article 30 that can be releasably attached to an electronic device 32 via magnetic attachment system 34 and corresponding attachment system 36. It should be noted that this particular embodiment is similar to the embodiment described in FIGS. 2A, 2B except that the magnetic surfaces that were previously located at the side walls are now located on a face of electronic device 32 and, optionally, an opposing face on article 30. For example, in the case of an electronic device including a display, the magnetic elements of magnetic attachment system 34 can be embedded behind the display surface.

FIG. 3B shows article 30 and electronic device 32 magnetically attached to each to each other to form cooperating system 38. As part of system 38, electronic device 32 and article 30 can cooperate with each other to provide features not available by article 30 or electronic device 32 separately. For example, article 30 can take the form of a cover that can provide protective features. In one embodiment, protective cover can be used to support and protect electronic device 32 while being transported or stored (e.g., cover the display surface). Due to the releasable nature of the magnetic attachment between magnetic attachment systems 34 and 36, article 30 can be easily detached when electronic device 32 is to be used and subsequently re-attached when desired.

The placement of the magnetic elements can be such that only certain magnetically sensitive elements within electronic device 32 are affected by the magnetic field generated by the embedded magnetic elements. For example, a Hall Effect sensor can be used to detect whether or not article 30 is magnetically attached to and covering all or a portion of the display of electronic device 32 using the magnetic field generated by a magnetic element located in article 30. On the other hand, a magnetically sensitive element in electronic device 32 such as a compass that relies upon an external magnetic field (i.e., such as that provided by the Earth), must not be unduly affected by magnetic field lines generated by the embedded magnetic elements. Therefore, the magnetic elements can be limited to those locations in electronic device 32 positioned away from magnetically sensitive elements such as the compass.

FIGS. 4A and 4C are simplified perspective views of article 40 that can be releasably attached to electronic device 42 via a magnetic system 44. This embodiment is similar to that shown in FIGS. 2A, 2B and 3A, 3B in that magnetic system 44 can include multiple magnetically attractable elements and that article 40 and electronic device 42 generally correspond to those mentioned in previous Figures. For example, one set of magnetically attractable magnetic elements 44a can be placed relative to a side of article 40 and electronic device 42 while a second set of magnetically attractable elements 44b can be placed relative to a face of article 40 and electronic device 42. As shown in FIG. 4B, cooperating system 46 can be formed by placing article 40 and electronic device 42 in proximity to each other such that magnetic elements 44a on the sides of article 40 and electronic device 42 magnetically attract each other in addition to magnetic elements 44b located at the face of electronic device 42 and article 40. The overall magnetic attraction generated at the side and face can be sufficient to retain article 40 and electronic device 42 in a mating engagement to form cooperating system 46.

In one embodiment, as shown in FIG. 4C, cooperating system 46 is presented in an open configuration in which article 40 is used as a cover for electronic device 42 that can be opened and closed. That is, article 40 can act as a protective cover of electronic device 42. In this embodiment, article 40 can include binding 48 that attaches along the side of electronic device 42 and flap 50 that attaches to the front face of electronic device 42 and more particularly, top face 52. Top face 52 can correspond to a display. In one implementation, flap 50 can move relative to binding 48. The moving can be widely varied. In one example, flap 50 can pivot relative to binding 48. The pivot can be widely varied. In one example, the pivot can be enabled by a hinge mechanism. In another example, the pivot can be enabled by a fold. Furthermore, the flap can be rigid, semi-rigid or flexible. In this manner, article 40 can form an open configuration where flap 50 is positioned away from electronic device 42 (display 52 can be viewed) and a closed configuration where flap 50 is positioned adjacent electronic device 42 (display 52 is covered as represented by closed embodiment of FIG. 4B).

In one embodiment, binding 48 is only located on one side while flap 50 is only located at top face 52. In so doing, the other surfaces of electronic device 42 are left exposed. As a result, the beauty of the electronic device may be shown off while the article is attached to the electronic device. Further, it may leave better access for I/O and connectivity related functionality (e.g., buttons, connectors, etc.).

Although the purpose of the magnetic elements is similar, i.e., attach article to electronic device, it should be appreciated that these mechanisms can widely vary. In some cases, the magnetic fields may be configured differently. By way of example, the side mounted magnetic surface may provide a first magnetic force and the front facing magnetic surface may provide a second magnetic force that is different than the first magnetic force. This may be in part due to different holding requirements as well as different surface areas, i.e., available space, and its effect on internal components of the electronic device. In one example, the side mounted magnetic surface provides a greater holding force for securing the article to the electronic device, i.e., it is the primary securing force while the front facing magnetic surface is the secondary securing force.

In one example, flap 50 includes multiple sections that are semi-rigid and bend relative to one another so as to make the flap movable and flexible. In one embodiment, flap 50 can be folded into one or more different configurations, and in some cases can be held in these configurations using a magnetic system similar to what is described above. These and other embodiments will be described in greater detail below. Moreover, it should be appreciated that the described embodiments are not limited to covers and that other configurations can be used including for example as an accessory device used as a hanging apparatus, as a support mechanism for the electronic device to improve viewing the display and as a support mechanism for or inputting touch events at a touch sensitive portion of the display, and so on.

Figure 5:
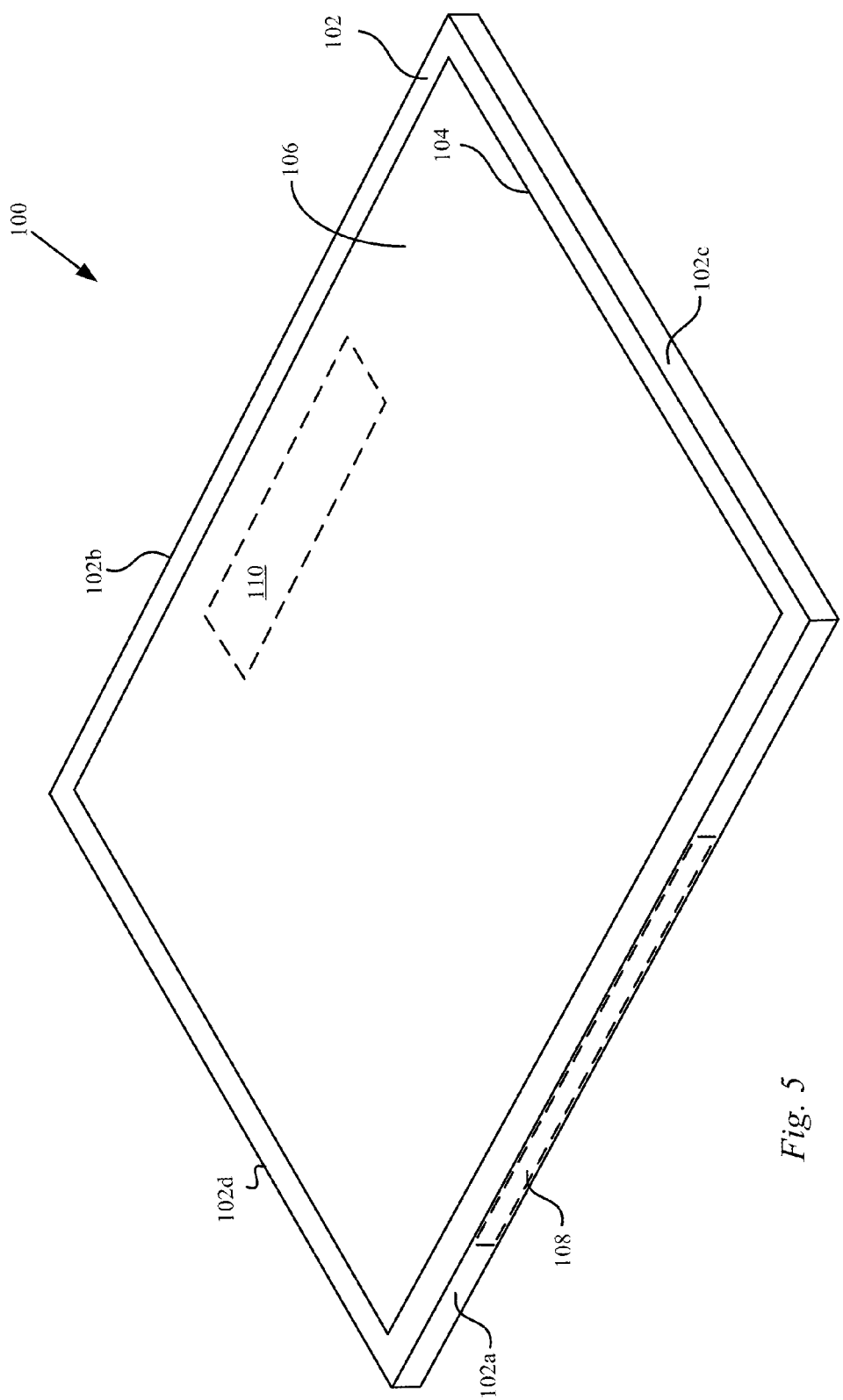
FIG. 5 shows a top perspective view of an electronic device in accordance with the described embodiments.

The electronic device and article can take many forms. For the remainder of this discussion, the electronic device is described in terms of a handheld portable computing device. Accordingly, FIG. 5 shows a top perspective view of electronic device 100 in accordance with the described embodiments. Electronic device 100 can process data and more particularly media data such as audio, visual, images, etc. By way of example, electronic device 100 can generally correspond to a device that can perform as a smart phone, a music player, a game player, a visual player, a personal digital assistant (PDA), a tablet computer and the like. Electronic device 100 can also be hand held. With regards to being handheld, electronic device 100 can be held in one hand while being operated by the other hand (i.e., no reference surface such as a desktop is needed). Hence, electronic device 100 can be held in one hand while operational input commands can be provided by the other hand. The operational input commands can include operating a volume switch, a hold switch, or by providing inputs to a touch sensitive surface such as a touch sensitive display device or a touch pad.

Electronic device 100 can include housing 102. In some embodiments, housing 102 can take the form of a single piece housing formed of any number of materials such as plastic or non-magnetic metal which can be forged, molded, or otherwise formed into a desired shape. In those cases where electronic device 100 has a metal housing and incorporates radio frequency (RF) based functionality, a portion of housing 102 can include radio transparent materials such as ceramic, or plastic. Housing 102 can be configured to enclose a number of internal components. For example, housing 102 can enclose and support various structural and electrical components (including integrated circuit chips) to provide computing operations for electronic device 100. The integrated circuits can take the form of chips, chip sets, or modules any of which can be surface mounted to a printed circuit board, or PCB, or other support structure. For example, a main logic board (MLB) can have integrated circuits mounted thereon that can include at least a microprocessor, semi-conductor memory (such as FLASH), and various support circuits and so on. Housing 102 can include opening 104 for placing internal components and as necessary can be sized to accommodate display assembly for presenting visual content, the display assembly being covered and protected by protective layer 106. In some cases, the display assembly can be touch sensitive allowing tactile inputs that can be used to provide control signals to electronic device 100. In some cases, the display assembly may be a large prominent display area that covers a majority of the real estate on the front of the electronic device.

Electronic device 100 can include a magnetic attachment system that can be used to magnetically attach electronic device 100 to at least one other suitably configured object. The magnetic attachment system can include a number of magnetic attachment features distributed within and in some cases connected to housing 102. For example, the magnetic attachment system can include first magnetic attachment feature 108 and second magnetic attachment feature 110 located on different sides of electronic device 100. In particular, first magnetic attachment feature 108 can be located in proximity to side wall 102a of housing 102. Second magnetic attachment feature 110 can be located within opening 104 near side wall 102b of housing 102. In those embodiments where electronic device 100 includes a display with cover glass substantially filling opening 104, second attachment feature 110 can be placed beneath the cover glass.

The placement of first magnetic attachment feature 108 at side wall 102a can facilitate the use of magnetic attachment feature 108 to magnetically attach electronic device 100 to another suitably configured object such as another electronic device or an accessory device. Accordingly, without loss of generality, first magnetic attachment feature 108 will henceforth be referred to as device attachment feature 108.

The placement of second magnetic attachment feature 110, on the other hand, can facilitate the use of second magnetic attachment feature 110 to secure aspects of another device attached to electronic device 100 by way of device attachment feature 108. In this way, the overall attachment between the other device and electronic device 100 can be more secure than attaching through first attachment feature 108 alone. Accordingly, and again without loss of generality, second attachment feature 110 will henceforth be referred to as securing attachment feature 110.

Although not expressly shown, it is understood that the various magnetic attachment features of the magnetic attachment system can be located at any appropriate location of housing 102. For example, magnetic attachment features can be located at an interior bottom surface of housing 102 or along sides 102c and 102d of housing 102.

Figure 6:
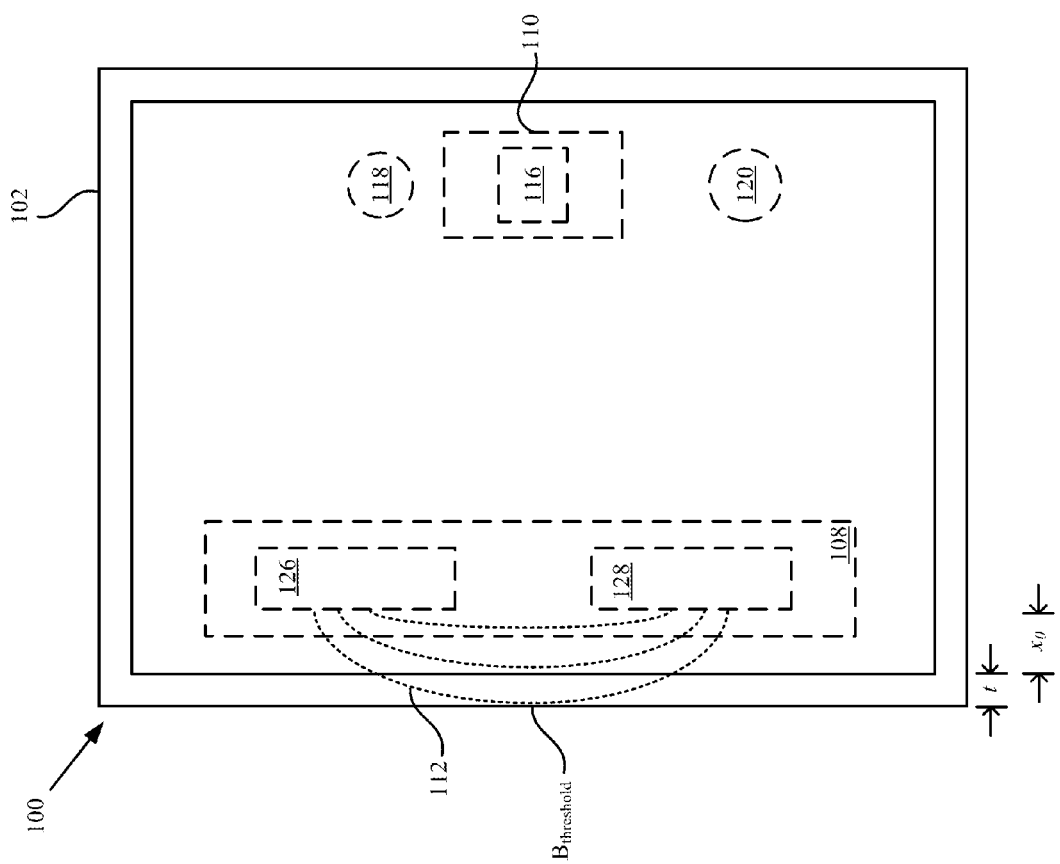
FIG. 6 shows another embodiment of a magnetic attachment feature.

As shown in FIG. 6, device attachment feature 108 and securing attachment feature 110 can each include one or more magnetic elements. In one example, device attachment feature 108 can multiple magnetic elements that can magnetically interact with each other to provide magnetic field 112 (only a portion of which is shown). In other words, the properties (shape, field strength, and so on) of magnetic field 112 can be based upon the interaction of the magnetic fields generated by each of the magnetic elements. In this way, the properties of magnetic field 112 can be altered simply by arranging the properties (i.e., physical layout, relative size, constituent magnetic polarities) of each of the magnetic elements. For example, each of the magnetic elements can have varying sizes and can be disposed along an axis. In this way, the magnetic properties of each of the plurality of magnetic elements can act together to establish the overall properties of magnetic field 112.

In some cases, the portion of magnetic field 112 that is used in the magnetic attachment between device attachment feature 108 and another device can be enhanced with the use of a magnetic shunt (not shown). The magnetic shunt can be formed of magnetically active material, such as steel or iron, and be placed in a position that causes magnetic field lines that would otherwise be directed away from the attachment region to be at least partially re-directed towards the attachment region. The re-direction of the magnetic field lines can have the effect of increasing the average magnetic flux density in the attachment region.

Device attachment feature 108 can operate in an active state as in well as an inactive state. Magnetic flux density $B_{112}$ can equal or exceed a magnetic flux density threshold $B_{threshold}$ inside the exterior surface of housing 102 but not outside in the inactive state. In other words, magnetic flux density $B_{112}$ of magnetic field 112 at an exterior surface of housing 102 is less than a magnetic flux density threshold $B_{threshold}$. Magnetic flux density threshold $B_{threshold}$ representing a magnetic flux value below which magnetically sensitive devices (such a magnetic strip on a credit card) can remain substantially unaffected. In addition, the presence of a magnetically active material (such as steel) in the region outside of electronic device 100 will not by itself trigger device attachment feature 108 to transition from the inactive state to the active state.

As noted above, when device attachment feature 108 is inactive, magnetic flux density $B_{112}$ of magnetic field 112 at the exterior surface of side 102a of housing 102 is less than magnetic flux density threshold $B_{threshold}$. More particularly, with regards to device attachment feature 108, magnetic flux density $B_{112}$ can vary as a function of distance x (i.e., $B=B_{112}(x)$) from the magnetic elements. Therefore, when device attachment feature 112 is inactive, magnetic flux density $B_{112}(x)$ can satisfy Eq. (1).

$$B_{112}(x=x_o+t)<B_{threshold}, \qquad \text{Eq. (1)}$$

where t is thickness of housing 102 at side 102a, and $x_o$ distance from interior of side 102a to the magnetic elements.

When device attachment feature 108 is inactive, any magnetic flux leakage in the near region outside of electronic device 100 (i.e., $B_{112}(x>x_o+t)$) is low enough that there is little likelihood that magnetically sensitive devices in the near region are adversely affected. However, it should be noted that even in the inactive state, magnetic field 112 can have a value of magnet flux $B_{112}(x=x_o+t)$ that satisfies Eq (1), and yet is sufficiently high to interact with the magnetic field of another device placed in relatively close proximity thereto. In this way, the other appropriately configured magnetic attachment feature in the other device can be used to activate device magnetic attachment feature 108 even though Eq. (1) is satisfied.

The properties of magnetic field 112 can include at least field strength, magnetic polarity, and so on. The properties of magnetic field 112 can be based upon the combination of the magnetic fields from each of the magnetic elements included in magnetic attachment feature 108. The combined magnetic fields can form in the aggregate magnetic field 112. For example, the magnetic elements can be arranged in such a way that the combination of the respective magnetic fields results in magnetic field 112 having desirable magnetic field properties (such as field strength). For example, the combination of one arrangement of magnetic elements can result in magnetic field 112 having characteristics (such a polarity and strength) that are for the most part symmetric about a particular axis (such as a geometric center line).

On the other hand, the magnetic elements can be arranged in such a way that the combination of the magnetic fields of the magnetic elements can result in magnetic field 112 having at least one property that is anti-symmetric about the center line. For example, a magnetic element on one side of the centerline can be positioned with a North magnetic pole pointing up whereas a corresponding magnetic element on the other side of the centerline can be arranged with a South magnetic pole pointing up. Hence, the magnetic properties of magnetic field 112 can be adjusted in any manner deemed appropriate to provide a desired mating engagement. For example, the magnetic properties of magnetic field 112 can be modified by arranging the magnetic elements in such a way that magnetic field 112 can cooperatively interact with another magnetic field (from another magnetic attachment system, for example). The cooperative interaction between the two magnetic fields can result in the two objects being magnetically attached to each other in a well-defined, precise, and repeatable manner.

The properties of magnetic field 112 can be stable. By stable it is meant that the properties of the magnetic field can remain essentially unchanged for an extended period of time. Hence, a stable version of magnetic field 112 can be created using magnetic elements having properties that are essentially constant (or nearly constant) over an extended period of time or at least any changes in one component is offset by a corresponding change in another component. The magnetic elements can be physically arranged in a fixed or at least substantially fixed configuration with respect other magnetic elements. For example, the magnetic elements can each have fixed sizes and polarities arranged in a specific order relative to each other providing the desired properties (shape, strength, polarity, etc.) of magnetic field 112. Hence, depending upon the properties and the nature of the magnetic elements, the shape of magnetic field 112 can remain substantially unchanged over the extended period of time (such as the anticipated operating life of electronic device 100).

In some embodiments, however, the properties of magnetic field 112 can be varied by modifying a magnetic or other physical property of at least one of the magnetic elements. When at least one magnetic element has magnetic properties (e.g., a polarity or field strength) that can be modified, the resulting magnetic field can also be modified. Accordingly, in some embodiments at least one of the magnetic elements can be characterized as having dynamic magnetic properties. By dynamic it is meant that at least one magnetic property, such as polarity, can be modified. In this way, the magnetic field properties of the resulting magnetic field can also vary. The resulting magnetic field, in turn, can alter the magnetic characteristics of magnetic field 112 that, in turn, can alter how the magnetic attachment system causes the objects to magnetically attach to each other (alignment, orientation, centering, and so forth). An electromagnet is one example of such a magnetic element whose magnetic properties can be modified as desired. Other examples include a malleable non-magnetic substrate impregnated with magnetic dopant (such as magnetite). In this way, the malleable substrate can be formed into a physical shape that can affect the nature of the magnetic field produced by the magnetic dopant material.

Turning now to other aspects of the magnetic attachment system, securing attachment feature 110 can include one or more of magnetic elements 116. When a plurality of magnetic elements is used, the arrangement of the plurality of magnetic elements 116 can be widely varied and can magnetically interact with a cooperating feature on another device. In one embodiment, the plurality of magnetic elements 116 associated with securing feature 110 can assist in securing at least a portion of another device otherwise attached to electronic device 100 by way of device attachment feature 108.

At least some of the plurality of magnetic elements 116 can have a fixed size and polarity (along the lines of a simple bar magnet) whereas other of the plurality of magnetic elements 116 can have magnetic properties that can vary (such as an electromagnet) while still others can be shaped to provide specific magnetic characteristics. For example, at least one of the plurality of magnetic elements 116 can be positioned and shaped (if need be) to interact with a magnetically responsive circuit included in the other device. Hence, the magnetically responsive circuit can respond to the presence (or absence) of a particular magnetic element(s) of securing feature 110. An example of the magnetically responsive circuit is described above with regards to the Hall Effect sensor 118.

It should be noted that the magnetic field generated by magnetic elements 116 should not extend so far that magnetically sensitive circuits within electronic device 100 (such as Hall Effect sensor 118) are adversely affected. This is particularly important since the magnetic field is not generally contained within housing 102 since at least a portion of the magnetic field must extend in the z direction in order to interact with the magnetically active portion of other devices. Therefore, the magnetic field in $\{x,y\}$ must be limited in extent to avoid magnetically sensitive circuits such as Hall Effect sensor 118 and compass 120.

In a particular implementation, the magnetic elements of device attachment feature 108 can be grouped into distinct magnetic regions. In this way, the magnetic fields from the magnetic regions can superpose to form magnetic field 112. The magnetic regions can include various magnetic elements that can be arranged into groups represented by magnetic elements 126 and 128. By grouping the magnetic element into separate magnetic regions, the ability of the magnetic attachment system to provide a magnetic field having desired characteristics can be substantially enhanced. Magnetic elements 126 and 128 can interact with each other to form magnetic field 112. In the one embodiment, the interaction can take the form of combination of magnetic properties of each of magnetic elements 126 and 128. In some cases, the arrangement of magnetic elements 126 and 128 can be related to each other in order to provide magnetic field 112 with desired characteristics. For example, magnetic elements 126 can 128 can be arranged in such a way relative to one another that magnetic field 112 is anti-symmetric (or symmetric) about a horizontal center line of magnetic attachment feature 108. In another embodiment, magnetic field 112 can be anti-symmetric (or symmetric) about a vertical center line of attachment feature 108. In still another embodiment, magnetic field 112 can be anti-symmetric (or symmetric) both horizontally and vertically.

Figure 7A:
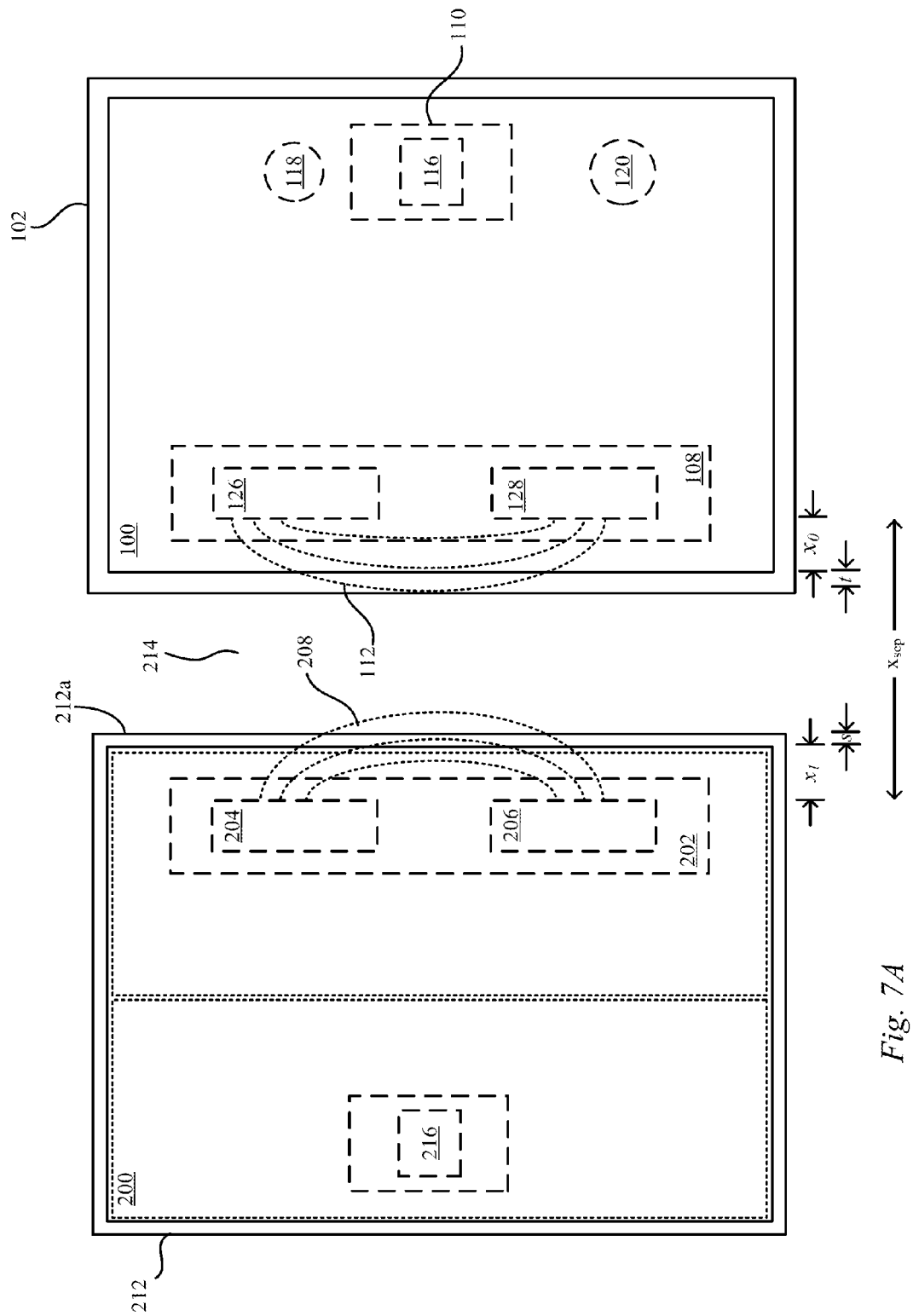
FIG. 7A shows an electronic device in proximity to another object in the form of an accessory device having a magnetic attachment feature.

FIG. 7A shows electronic device 100 in proximity to object 200 having magnetic attachment feature 202. Magnetic attachment feature 202 of object 200 can include magnetic elements each generating an individual magnetic field that can interact with the other to form in the aggregate a resulting magnetic field. The resulting magnetic field can have magnetic characteristics (such as field strength and shape) that can interact with magnetic field 112 of electronic device 100 to attach electronic device 100 and object 200 together in a well-defined, precise, and repeatable manner without mechanical fasteners and nor require external assistance. It should be noted that magnetic field 208 can be about 2500 Gauss whereas magnetic field 112 can be on the order of about 1400 Gauss when device attachment feature 108 is inactive.

Object 200 can take many forms including an accessory, peripheral, electronic device or the like. In one embodiment, object 200 can take the form of an electronic device along the lines of electronic device 100. Accordingly, electronic device 100 and electronic device 200 can be magnetically attached to each other using device attachment feature 108 and magnetic attachment feature 202 to form a cooperative electronic system. The cooperative electronic system can be one in which electronic elements in electronic device 100 and corresponding electronic elements in electronic device 200 cooperate with the other to perform functions that cannot be performed by either of the electronic devices separately. In one embodiment, information can be passed between electronic devices 100 and 200.

More specifically, magnetic attachment feature 202 can include at least magnetic elements 204 and 206 each of which can generate magnetic fields that cooperate with each other to provide magnetic field 208 (only a portion of which is shown). The properties of magnetic field 208 can be based upon the interaction of each of the plurality of magnetic elements 204 and 206. In this way, magnetic field 208 can have properties based upon the physical layout, relative size, and constituent magnetic polarities of each of the plurality of magnetic elements 204 and 206. For example, magnetic elements 204 and 206 can be disposed along a center line and have magnetic properties that superpose to provide magnetic field 208 with desired properties. Magnetic flux density $B_{208}$ of magnetic field 208 of object 200 can vary as a function of distance x (i.e., $B=B_{208}(x)$) from magnetic elements 204 and 206.

When object 200 takes the form of an electronic device such as electronic device 100, then magnetic flux density $B_{208}$ satisfies Eq. (1). However, when object 200 takes the form of an accessory device, then unlike magnetic flux density $B_{112}$ of electronic device 100, which satisfies Eq. (1), magnetic flux density $B_{208}(x)$ of accessory device 200 can satisfy Eq. (2).

$$B_{208}(x=x_1+s) > B_{threshold} \qquad \text{Eq. (2)}$$

where s is thickness of housing 212 at side 212a, and
$x_1$ interior separation distance.

In this way, accessory device 200 can magnetically interact with electronic device 100 further removed from electronic device 100 than would otherwise be possible. Hence, accessory device 200 can be placed near but not necessarily close to electronic device 100 in order for electronic device 100 and object 200 to magnetically attach to each other in a well-defined, predictable, and repeatable manner.

In addition to magnetic attachment feature 202, accessory device 200 can further include magnetic attachment feature 216 that can be used to interact with securing attachment feature 110. Magnetic attachment feature 216 can include a variety of magnetically active components. Some of the magnetic elements can take the form of magnetic elements arranged to cooperatively interact with corresponding magnetic elements in securing attachment feature 110. Other of the magnetic element can be more passive in nature in that they provide a mechanism for completing a magnetic circuit with magnetically active elements in securing attachment feature 110. An example of a magnetically passive element is a ferromagnetic material, such as iron or steel, that can be interact with a magnetic element actively providing an associated magnetic field. In this way, the ferromagnetic material can interact with the magnetic field to complete a magnetic circuit between the passive element in attachment feature 216 and the active element in securing attachment feature 110.

Figure 7B:
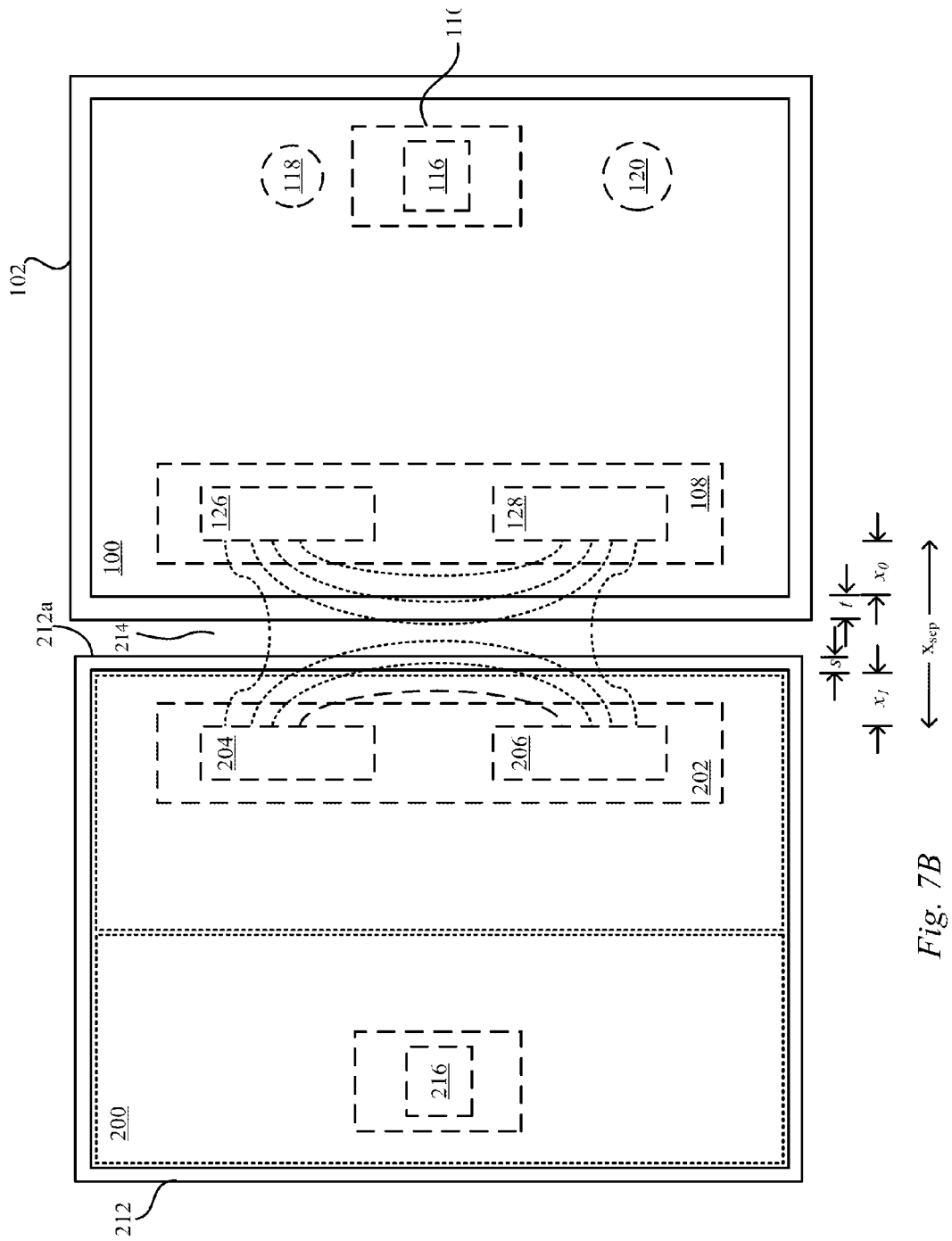
FIG. 7B shows a graphical representation of magnetic interaction between the electronic device and the accessory device of FIG. 7A in accordance with the described embodiments.

FIG. 7B shows that accessory device 200 can be used to provide support functions and services for electronic device 100. By allowing a portion of magnetic field 208 having magnetic flux density $B_{208}$ satisfying Eq. (2) to extend into region 214, magnetic attractive force $F_{net}$ between device attachment feature 108 and accessory attachment feature 202 can be created where net attractive force $F_{net}$ satisfies Eq. (3a) and Eq. (3b).

$$F_{net} = (L_{total}) \cdot B^2 / \mu_0 \qquad \text{Eq. (3a)}$$

$$B/B_0 = f(x_{sep}) \qquad \text{Eq (3b)}$$

where
$L_{total}$ is total surface area of magnetic elements
B is total magnetic flux density ($B_{208}+B_{112}$)
$x_{sep}$ is separation distance between magnetic elements,
$B_0$ is magnetic flux density at surface of magnetic regions.

Net magnetic attraction force $F_{net}$ due to the interaction of magnetic field 208 and magnetic field 112, attachment feature 202 can be used to activate device attachment feature 108. Moreover, when device attachment feature 108 is activated, magnetic flux density $B_{112}$ now satisfies Eq. (4).

$$B_{112}(x=x_0+t) > B_{threshold}, \qquad \text{Eq. (4) in active state.}$$

Figure 7C:
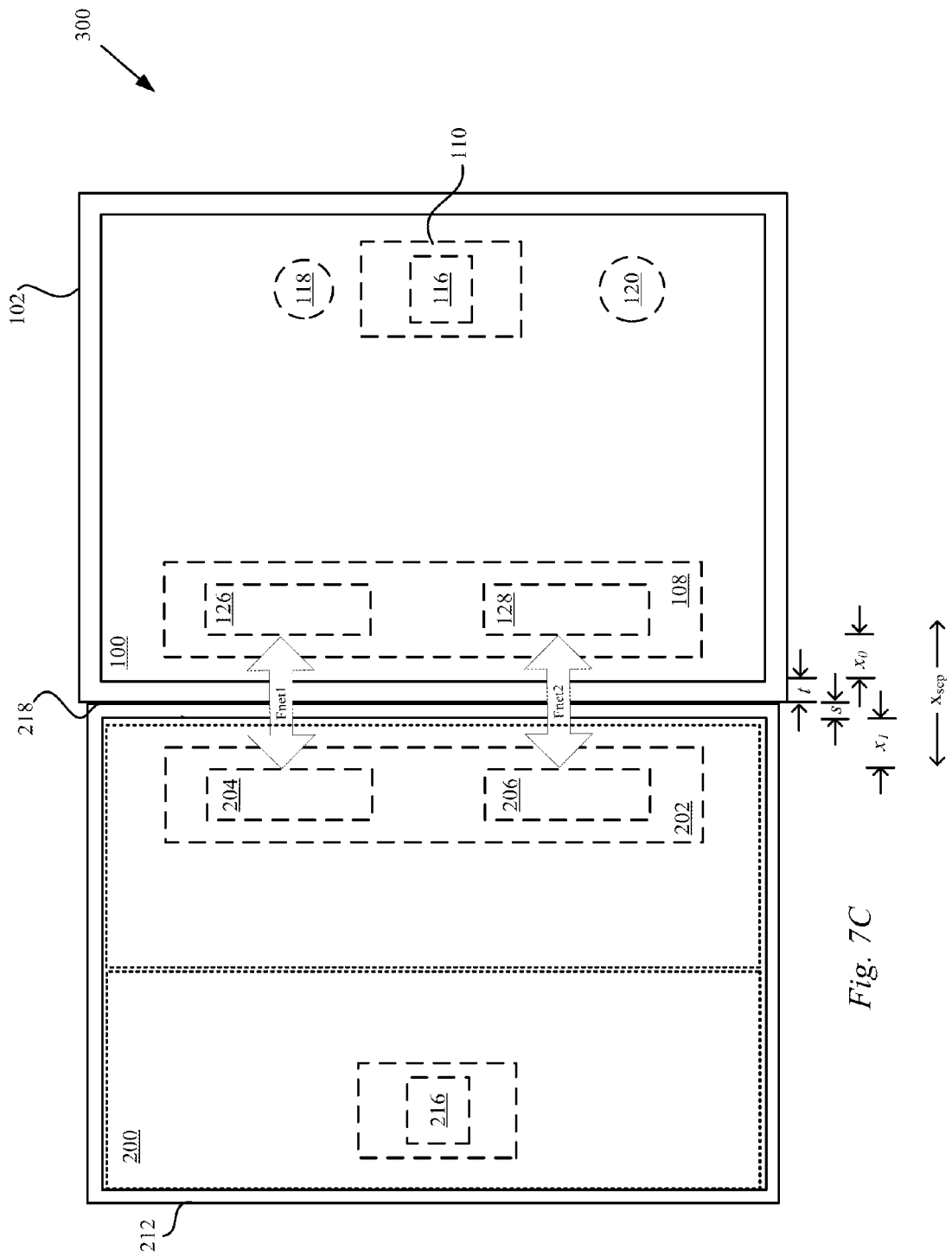
FIG. 7C shows a graphical representation of a cooperating system formed by the magnetic attachment of the accessory device and the electronic device as shown in FIGS. 7A and 7B.

This increase in magnetic flux density $B_{112}$ in region 214 can result in a substantial increase in net magnetic attractive force $F_{net}$ between accessory device 200 and electronic device 100. Moreover, since net attractive force $F_{net}$ varies with total magnetic flux density B ($B_{208}+B_{112}$) and flux density B in general can vary inversely with the separation distance (i.e., Eq. 3(b)), as electronic device 100 and accessory device 200 approach each other and separation distance $x_{sep}$ decreases to a limiting value consistent with physical contact of electronic device 100 and accessory device 200, the increase in net attractive force $F_{net}$ can increase sharply in a relatively short amount of time. This sharp increase in net attractive force $F_{net}$ can cause the devices to quickly snap together in what can be referred to as "snapping into place" as shown in FIG. 7C showing cooperating system 300 in the form of electronic device 100 magnetically attached to accessory device 200 along engagement surface 218. It should be noted that in a representative embodiment, the magnetic elements in device attachment feature 108 can be N52 type magnets whereas magnetic elements in attachment feature 216 can be N35 type magnets. Moreover, the net magnetic attractive force can be on the order of about 10 newtons to at least 20 newtons where it can require about 3 newtons to activate device attachment feature 108.

The overall magnetic attractive force $F_{NET}$ between device 100 and device 200 at engagement surface 218 can be derived as the summation of all the net magnetic attractive forces $F_{neti}$ for all actively coupled magnetic elements. In other words, the overall net magnetic attractive force $F_{NET}$ satisfies Eq. (5).

$$F_{NET} = \Sigma_1^n F_{neti} \qquad \text{Eq. (5)}$$

where $F_{neti}$ is the net magnetic attractive force for each of n components. In one embodiment, net magnetic attractive force $F_{neti}$ is substantially perpendicular to that portion of engagement surface 218 intersected by magnetic field 112 and magnetic field 208.

In order to assure that overall magnetic attachment force $F_{NET}$ is uniform along the engagement surface between device 100 and device 200, the separation distances between each corresponding magnetic element in attachment features 108 and 202 are well controlled. The separation distance can be well controlled by, for example, shaping the magnetic elements to conform to the shape of the devices. For example, if device 100 has a spline (curved) shaped housing, the magnetic elements in device 100 can be shaped to conform to the curved shape. In addition, the magnetic elements can be formed in such a way that the magnetic vectors of corresponding magnetic elements align with each other. In this way, the magnitude and direction of the net magnetic attractive force can be controlled as desired.

One result of the aligning of the magnetic vectors is that the direction of the net magnetic force between each magnetic element can be well controlled. Moreover, by reducing the separation distance between corresponding magnetic elements to a minimum, the net attractive magnetic force $F_{neti}$ between each magnetic element can be maximized. In addition, maintaining a substantially uniform separation distance between the various magnetic elements, a correspondingly uniform magnetic attachment force can be provided along engagement surface 218. Moreover, by appropriately adjusting the corresponding magnetic vectors, $F_{net}$ can be applied normally to the engagement surface.

In addition to minimizing the separation distance between corresponding magnetic elements, the magnetic flux density between the corresponding magnetic elements can be increased by using magnetic shunts. A magnetic shunt formed of magnetically active material such as iron or steel can be placed on or near a magnetic element having the effect of directing magnetic flux lines in a desired direction. In this way, for example, magnetic flux lines that would otherwise propagate in a direction away from a corresponding magnetic element can be partially re-directed towards a desired direction, such as towards a magnetic attachment region between the devices thereby increasing the overall magnetic flux density. Hence, increasing the available magnetic flux density between the magnetic elements can result in a substantial increase in the net magnetic attractive force.

Figure 8A:
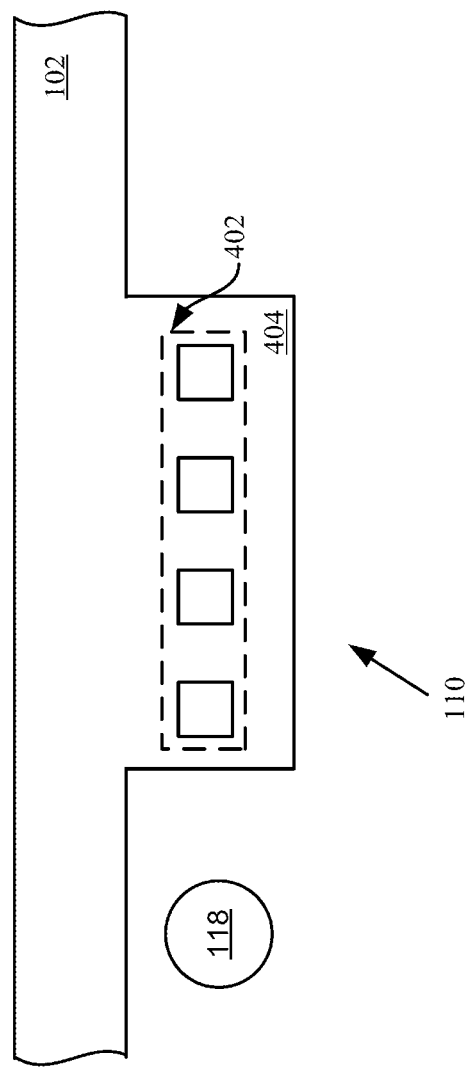
FIG. 8A shows an embodiment of an attachment feature in an electronic device.

FIG. 8A shows an embodiment of attachment feature 110. In particular, attachment feature 110 can be part of housing 102. In particular, attachment feature can include magnetic elements 402 that can be mounted to ledge 404 of housing 102. Magnetic elements 402 can be widely varied. For example, magnetic elements 402 can be spatially arranged as an array on ledge 404 to be used to attach and secure at least a portion of an accessory device to a particular aspect of electronic device 100. For example, when the accessory device takes the form of a flap, the magnetic elements 402 can be used to magnetically secure the flap to electronic device 100 to cover at least a portion of a display. The size and shape of the array can also be widely varied. In the embodiment shown in FIG. 8A, the array can be rectangular and sized to encompass a substantial portion of ledge 404.

Figure 8B:
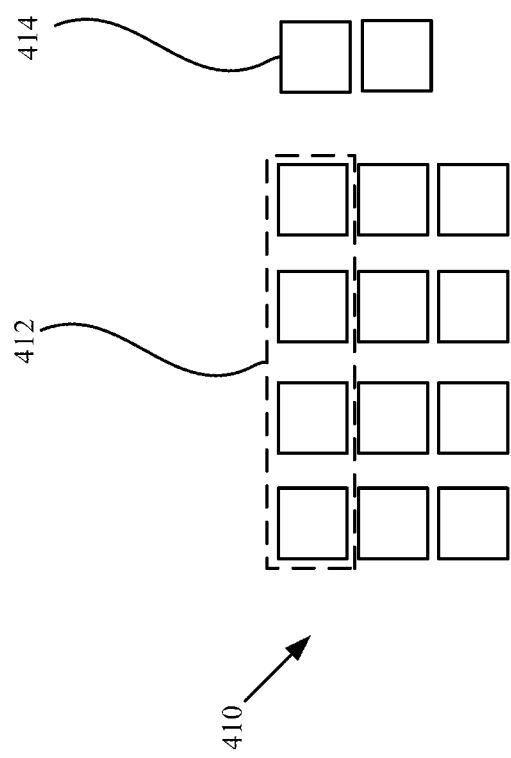
FIG. 8B shows an embodiment of an attachment feature in an accessory device corresponding to the attachment feature shown in FIG. 8A.

FIG. 8B shows a plurality of magnetic elements 410 that can be incorporated into an accessory device as part of attachment feature 216. Some but not all of the plurality of magnetic elements 410 can correspond to magnetic elements 402 and be used to magnetically attach accessory 200 to electronic device 100. In another embodiment, all or most of the plurality of magnetic elements 410 can be used to secure portions of accessory device 200 together to form other support structures that can be used in conjunction with electronic device 100. In one embodiment, magnetic element 414 can be used to activate a magnetically sensitive circuit such as Hall Effect sensor 118.

Figure 9C:
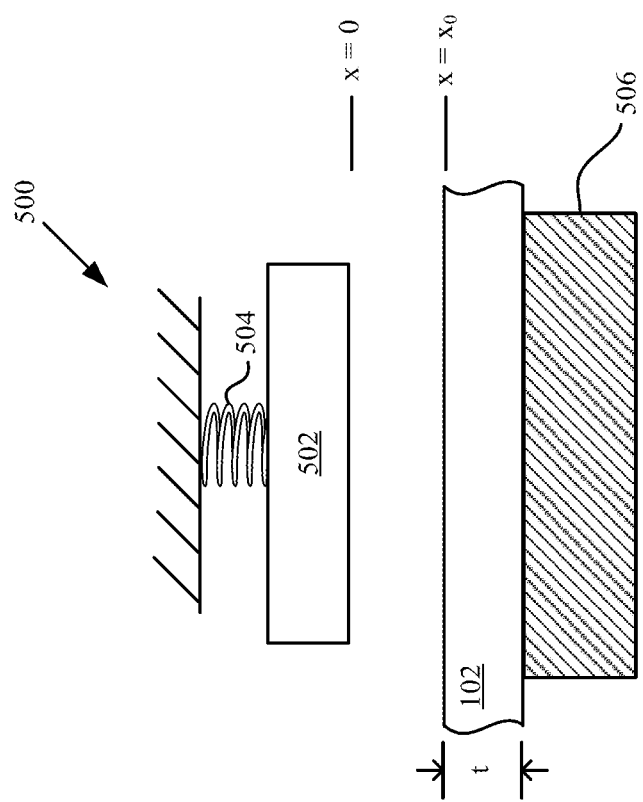
FIG. 9C shows the magnetic attachment feature in the inactive state in the presence of magnetically active object.

FIGS. 9A-9C show representative magnetic attachment feature 500 in accordance with a described embodiment. Magnetic attachment feature 500 can, for example, correspond to device attachment feature 108 shown FIG. 6 and FIGS. 7A-7C. In the inactive state, the magnetic elements within magnetic attachment feature 500 can be positioned away from housing 102 to minimize the magnetic field lines that propagate through 102. On the other hand, in the active state, the magnetic elements can move towards housing 102 in order to increase the number of magnetic field lines that propagate through housing 102 thereby satisfying Eq. (2).

The manner in which the magnetic elements moves can be widely varied. For example, the magnetic elements can rotate, pivot, translate, slide or the like. In one example, the magnetic elements can be positioned within a channel that allows the magnetic elements to slide from a first position corresponding to the inactive state to a second position corresponding to the active state.

In the particular embodiment shown in FIGS. 9A-9C, attachment feature 500 can include magnetic element 502 having magnetic properties that can remain stable over a period of time. For example, it can be desired that the magnetic attachment properties remain stable over the expected operating life of electronic device 100. In this way, the magnetic field formed by the interaction of the magnetic fields of each of the magnets will also remain stable. The stability of the magnetic field can result in a very repeatable attachment process. This repeatability is particularly useful when electronic device 100 undergoes numerous and repeated attachment cycles (attach/detach) with other appropriately configured objects such as accessory device 200 that requires a consistently accurate placement.

In the representative embodiment shown, magnetic element 502 can take many forms. For example, magnetic element 502 can take the form of a number of magnets arranged in a specific order and configuration having stable magnetic properties (such as polarity and intrinsic magnetic strength). However, in order to satisfy Eq. (1) when magnetic attachment feature 500 is inactive, magnetic element 502 must remain at least distance $x=(x_0+t)$ from the exterior of housing 102. In other words, in order to satisfy Eq. (1), the dimensions of device attachment feature 500 must take into consideration at least the magnetic properties and physical layout of magnetic element 502.

Accordingly, magnetic element 502 can be attached to retaining mechanism 504 arranged to exert retaining force $F_{retain}$. Retaining force $F_{retain}$ can be used to retain magnetic element 502 at a position within device attachment feature 500 resulting in little or no magnetic flux leakage outside of electronic device 100 (i.e., Eq. (1) is satisfied) when device attachment feature 500 is inactive. In one embodiment, retaining mechanism 504 can take the form of a spring arranged to provide retaining force $F_{retain}$ according to Eq. (6):

$$F_{retain} = k \cdot \Delta x \qquad \text{Eq. (6)}$$

where k is spring constant of retaining mechanism 504, and $\Delta x$ is spring displacement from equilibrium.

For example, FIG. 9B shows representative magnetic attachment feature 500 in an active state. By appropriately configuring magnetic element 502 and those in accessory attachment feature 204, the resulting magnetic interaction of the magnetic field of magnetic element 502 and that generated by accessory attachment feature 204 can create a net attractive magnetic force at least as great as that required to activate magnetic attachment feature 500. In other words, the net attractive magnetic force can have a magnitude at least that of activation force $F_{act}$ satisfying Eq. (7) thereby overcoming retaining force $F_{retain}$ causing magnetic element 502 to move from the inactive position (i.e., x=0) to the active position (i.e., x=x₀), $$F_{act} \geq F_{retain}(\Delta x = x_o) \qquad \text{Eq. (7)}.$$

However, only another magnetic attachment feature that generates a magnetic field having properties that "match" the magnetic field properties of magnetic element 502 can activate magnetic attachment feature 500. Therefore, as shown in FIG. 9C, the presence of object 506 formed of magnetically active material (such as steel) located at the exterior surface of housing 102 (i.e., x=x₀+t) cannot activate magnetic attachment feature 500. More specifically, in one embodiment, the net magnetic attractive force generated between object 506 and magnetic attachment feature 500 less than 2 NT, whereas activation force $F_{ACT}$ can be on the order of about 3 NT.

More specifically, in order to transition from the inactive to the active state, the magnetic force created between magnetic element 502 and object 506 must be greater than activation force $F_{act}$. However, since the magnetic flux density of the magnetic field generated by magnetic element 502 at the exterior surface of housing 102 is less than $B_{threshold}$, any magnetic force generated between object 506 and magnetic element 502 is substantially less than $F_{retain}$ and therefore fails to satisfy Eq. (7). Hence, magnetic element 502 remains fixed in place at about x=0 and magnetic attachment feature 500 cannot undergo the transition from the inactive to the active state.

It should be appreciated that the spring can be widely varied. For example, it may vary depending on the type of movement. Examples include tension, compression, torsion, leaf and the like. In one particular implementation, leaf springs are used.

It should also be noted that in some embodiments, magnetic element 502 can be fixed in such a way that no spring is needed. In these embodiments, although Eq. (1) may not be satisfied, it can nonetheless be a practical arrangement.

Figure 10:
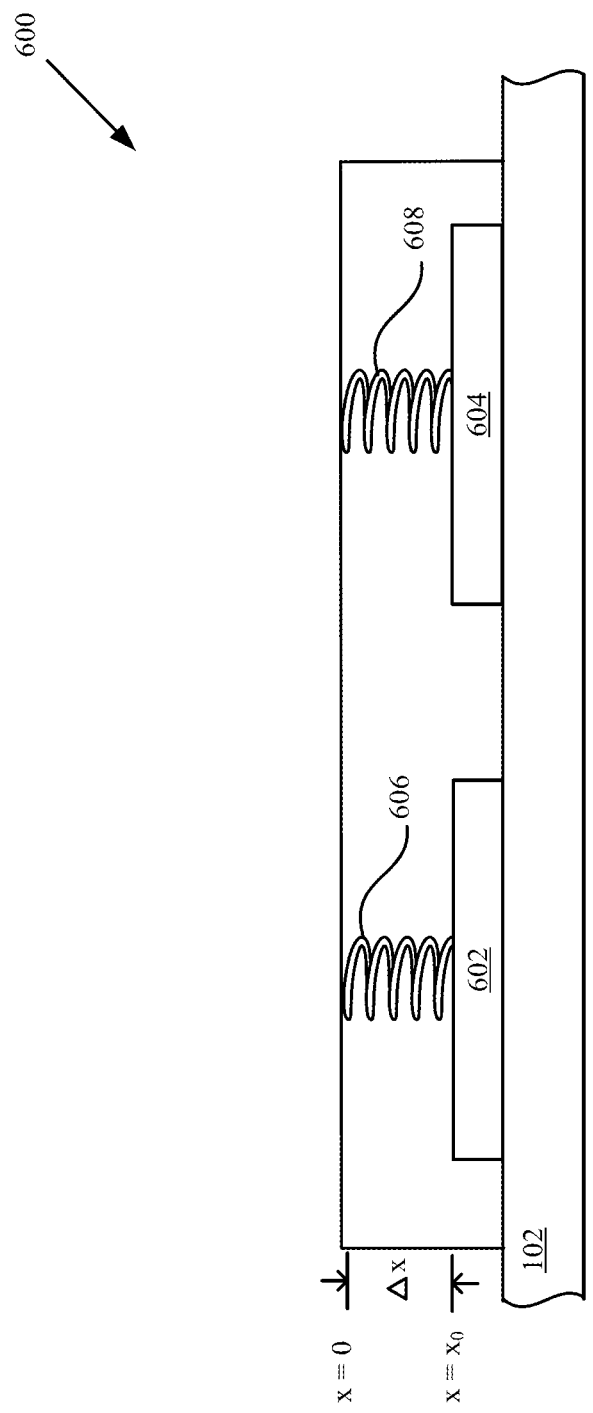
FIG. 10 shows an implementation of a device attachment feature that utilizes a leaf spring arrangement as a retaining mechanism.

FIG. 10 shows an embodiment of device attachment feature 600 in accordance with one embodiment of the present invention. Attachment feature 600 can correspond to element 208 in FIG. 6 and FIGS. 7A-7C. This embodiment is similar to the embodiment shown in FIGS. 9A-9C except that instead of a single mechanism, multiple mechanisms and more particularly a pair of mechanisms in the form of magnetic element 602 and magnetic element 604 are used. In particular, FIG. 10 shows device attachment feature 600 in the active state. More specifically, spring 606 attached to magnetic element 602 and spring 608 attached to magnetic element 604 are each extended by distance Δx.

In this system, the two mechanisms cooperate to form the magnetic field. They can move independently or they can be connected together and move as a unit. The spring forces and the magnetic forces can vary. For example, system can be symmetric or asymmetric. The arrangement of magnetic elements may be similar or different. Again being symmetric or asymmetric. The configuration may depend on the needs of the system.

The magnetic attachment system can take many forms each of which provides for a repeatable and precise magnetic attachment mechanism that can be used to attach multiple suitably configured objects together.

Figure 11A:
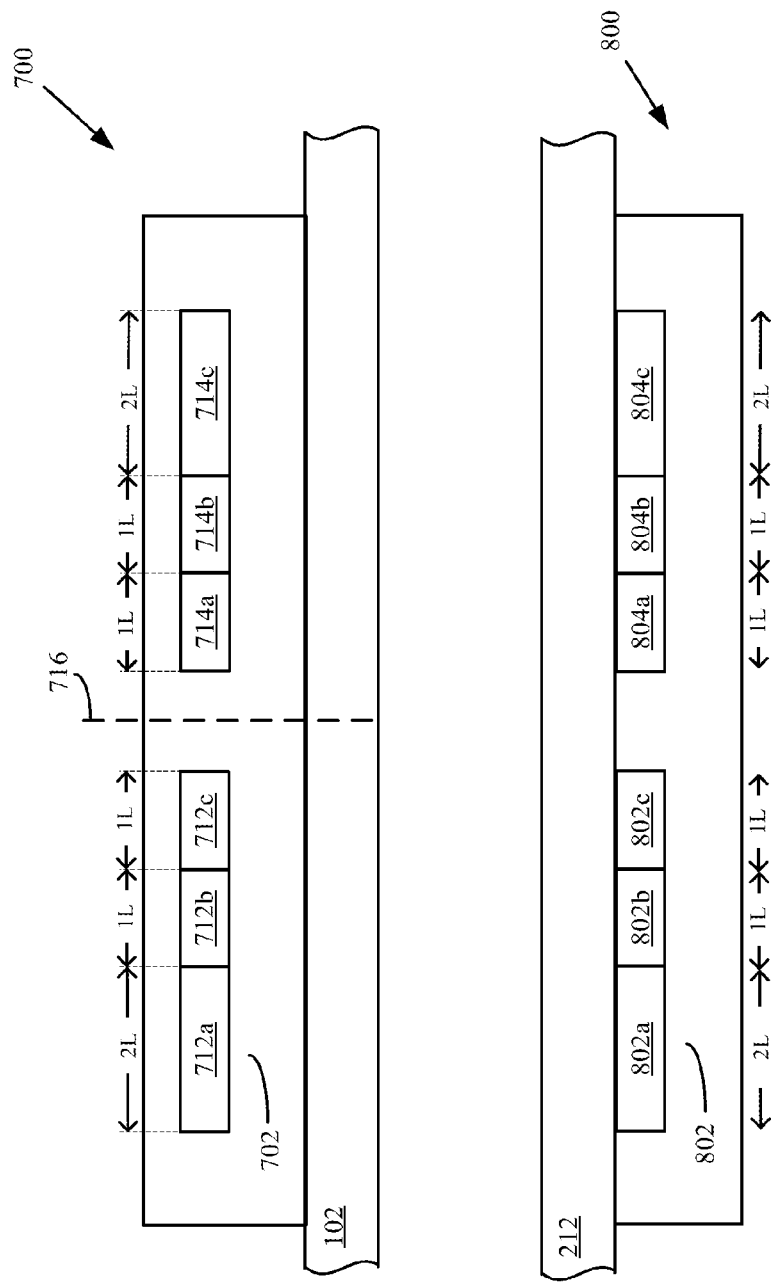
FIG. 11A shows an embodiment of a keyed magnetic attachment system in an inactive state and a matching magnetic attachment system.
Figure 11B:
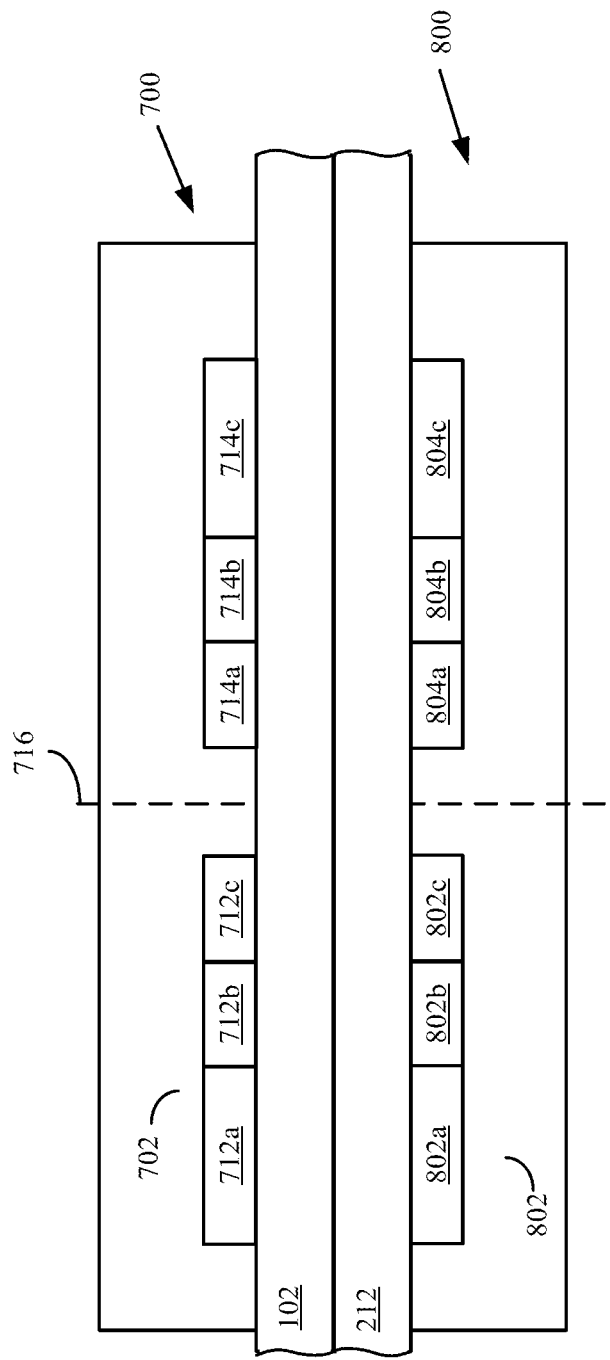
FIG. 11B shows the keyed magnetic attachment feature of FIG. 11A activated by the matching magnetic attachment system.

FIGS. 11A-11B show a specific implementation of device attachment feature 108 in the form of device attachment feature 700 in accordance with one embodiment. The device attachment feature can correspond to element 108 shown in FIG. 6 and FIGS. 7A-7C. In some cases, device attachment feature 700 can be used in conjunction with springs 606 and 608 as shown in FIG. 10. As shown in FIG. 11A, device attachment feature 700. In particular, device attachment feature 700 is shown in the inactive state having magnetic elements in the form of magnetic assembly 702 that can be enclosed within an enclosure. In this way, a retaining mechanism (not shown) attached to magnetic assembly 702 can exert associated retaining force $F_{retain}$. Retaining force $F_{retain}$ can be used to maintain magnetic assembly 702 at a position consistent with device attachment feature 700 being in the inactive state (i.e., satisfying Eq. (1)).

Magnetic assembly 702 can each include individual magnets. In the described embodiment, the individual magnets can be arranged in a structure in which the polarities of the magnets can be oriented to form a coded magnetic structure. The coded magnetic structure can be formed of a sequence of magnetic polarities and in some cases magnetic strength. In other words, the sequence of magnetic polarities can be represented, for example, as {+1, +1, −1, +1, −1, +1, −1, −1}. For this particular example, "+1" indicates the direction and strength of the magnet. Hence, a positive sign "+" can indicate that the corresponding magnet is aligned having a magnetic vector in a particular direction, a negative sign "−" can indicate a magnetic vector in an opposite direction and "1" indicates a strength of one unit magnet.

When a plurality of magnets of the same polarity are placed next to each other, the magnetic fields from each of the plurality of magnets can combine such that the plurality of magnets can be considered equivalent to a single magnet, the single magnet having the combined properties of the plurality of magnets. For example, the coded magnetic sequence {+1, +1, −1, +1, −1, +1, −1, −1} representing eight individual magnets can be considered equivalent to the coded magnetic sequence {+2, −1, +1, −1, +1, −2} embodied as an array of six individual magnets. In one embodiment, the magnets in a first and last position can possess the same magnetic strength as the other magnets in the array but twice their respective size. On the other hand, the magnets in the first and last position can have about the same size as the other magnets but possess twice the magnetic strength of the other magnets. In any case, the equivalency of magnetic properties can provide for a more compact coded sequence of magnets. The smaller size can help reduce weight as well as preserve the amount of valuable internal real estate required to house the magnetic attachment feature. In addition, since magnetic flux density is directly related to that area through which magnetic field lines propagate, as the area through which a given magnetic flux propagates decreases, the resulting magnetic flux density increases.

In one embodiment, magnetic assembly 702 can include individual magnets 712a, 712b, and 712c having relative sizes of 2L, 1L, and 1L, respectively, where "L" represents a unit length. It should be noted that as discussed above a magnet having a relative size of "2L" can be embodied as either a single magnet having a physical length of "2L", two magnets side by side each having a length "1L" with the magnetic poles aligned with each other, or a magnet of unit length L having twice the magnetic strength of the other magnets. Accordingly, for the remainder of this discussion, with regards to the terms 2L and 1L, "L" can represent a unit length and the relative strength of the magnet can be represented by the associated digit. For example, a magnet having a relative magnetic strength of "1" but a length of "2L" can be considered equivalent to a magnet having a relative strength of "2" and a length of "1L". In this way, both the relative magnetic strengths, and orientation can be used to form the coded magnetic structure.

For example, magnet 712a can have an overall length of approximately twice that of magnets 712b or 712c. On the other hand, magnet 712a can have the same length as magnets 712b and 712c but have an inherent magnetic strength twice that of magnets 712b and 712c. In yet another embodiment, magnet 712a can be an equivalent magnet formed of two (or more) constituent magnets having their respective polarities aligned.

In one embodiment, magnets 712a, b, c can each be spaced apart from each other a predetermined distance. For example, in one implementation, the magnets can be spaced equidistant from each other. This spacing is, of course, predicated upon the desired magnetic properties of the magnetic field generated. In another embodiment, those magnets having anti-aligned polarities can be magnetically attached to each other. In this way, the magnetic bond formed between the adjacent magnets can be used to maintain the integrity of the sequence of magnets in the magnetic assembly. However, those magnets having aligned polarities must be held together by an externally applied force to overcome the repulsive magnetic force generated between the two aligned magnets.

In addition to size and positioning, the magnetic polarities of magnets 712a, b, c can be selected based upon the desired properties of the magnetic field generated. In the embodiment shown, however, the magnetic elements are magnetically coupled to each other end to end thereby reducing the amount of space required and increasing the magnetic flux density by reducing an overall region in which the magnetic field lines are propagated.

In particular, magnetic assembly 702 can have a specific magnetic polarity pattern set in which each of magnets 712a, b, c are oriented in such a way that their N or S magnet poles are aligned (or anti-aligned) in a particular manner. For example, the magnets in magnetic assembly 702 can be arranged to form first coded magnetic structure {+1, −1, +1} in which the magnetic poles of magnets 712a, b, c are aligned according to first magnetic polarity pattern {P1, P2, P1} by which it is meant that the magnetic pole of magnet 712a is anti-aligned relative to magnet 712b which in turn is anti-aligned with magnet 712c.

Magnetic assembly 702 can also include individual magnets 714a,b,c and having relative sizes of 1L, 1L, and 2L, respectively. Furthermore, magnets 714a, b, c can be arranged to have their respective magnetic poles aligned in accordance with second magnetic polarity pattern {P2, P1, P2} that is the inverse (or complement) of first magnetic polarity pattern {P1, P2, P1}. In terms of coded magnetic structure, magnets 714a,b,c can be aligned according to second coded magnetic sequence {−1, +1, −1} that is the inverse, or complement, of first coded magnetic structure {+1, −1, +1}. This anti-symmetric relationship between magnets 712a,b,c and 714a,b,c provides a magnetic field that is anti-symmetric with respect to center line 716.

FIGS. 11A and 11B also show specific implementation of accessory attachment feature 800 that can, for example, correspond to element 202 shown in FIG. 6 and FIGS. 7A-7C. Magnetic assemblies 802 can include a number of magnetic elements. The magnetic elements can be arranged in such a way that the combined magnetic field matches the magnetic field of magnetic assembly 702.

Magnetic assembly 802 can include magnets 802a, 802b, and 802c each being about the same size as corresponding magnet 712a, 712b, and 712c in magnetic assembly 702. However, in order to maximize net attraction force $F_{net}$ and drive the magnetic interaction between the magnetic fields to a desired equilibrium, magnets 802a, b, c are aligned based upon second magnetic polarity pattern {P2, P1, P2}. Magnetic assembly 802 can also include magnets 804a, 804b, and 804c each being about the same size as corresponding magnets 714a, 714b, and 714c. Moreover, in keeping with the overall goal of the magnetic interaction between the magnetic fields to equilibrate at the desired configuration of the devices, magnets 804a, b, c can be aligned according to first magnetic polarity pattern {P1, P2, P1}.

FIG. 11B shows device attachment feature 700 in the active state due to the magnetic interaction between magnetic assemblies 702 and 802. In particular, since the arrangement of magnetic elements between attachment feature 700 and those in accessory attachment feature 800 "match", then the magnetic interaction between the magnetic fields can cause magnetic assemblies 702 to move from the inactive state (i.e., x=0) to the active state (i.e., x=$x_0$).

Figure 12:
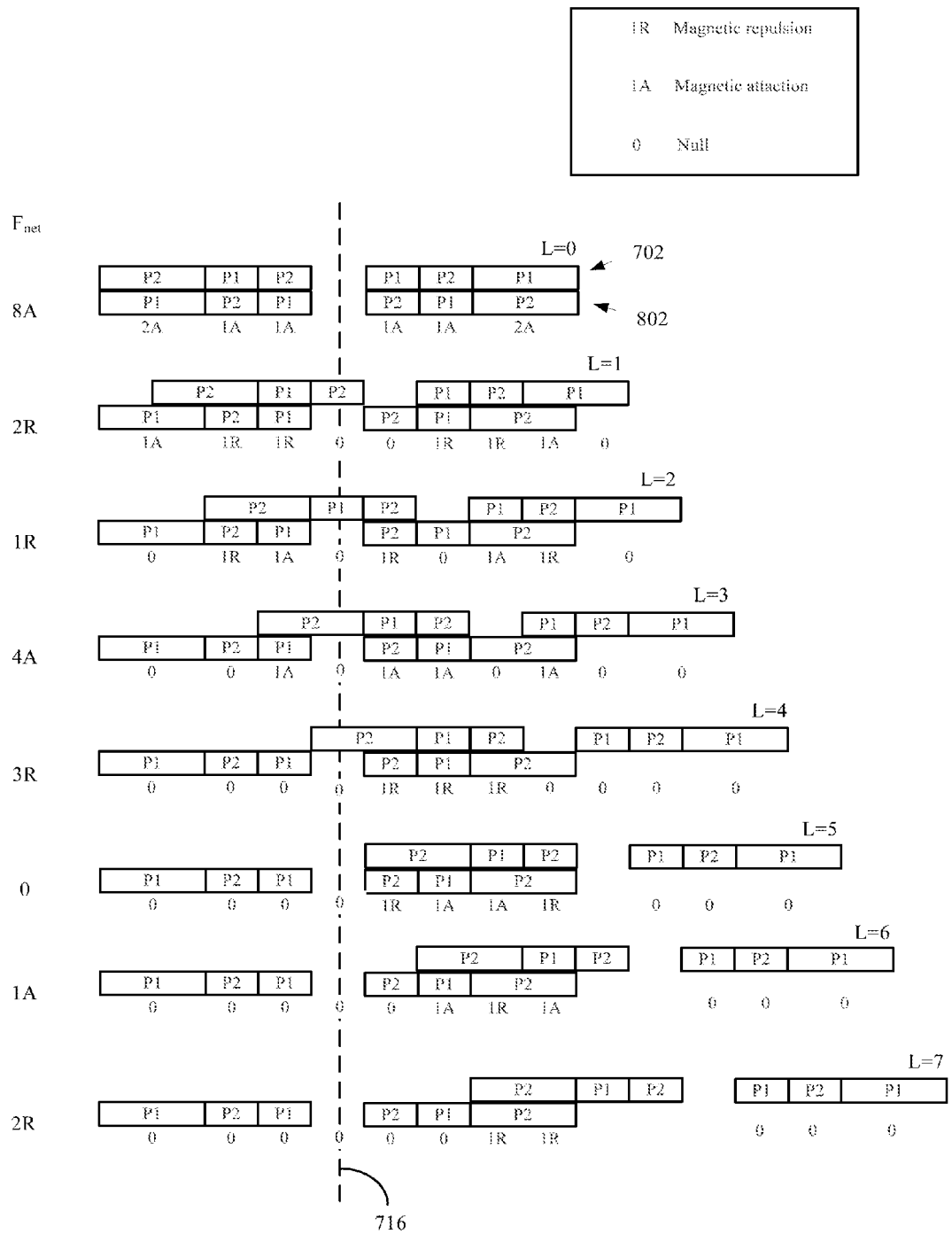
FIG. 12 shows a shifting position for the keyed magnetic attachment feature shown in FIG. 11A.

FIG. 12 illustrates a sequence of relative shift positions for the magnetic structure of magnetic assembly 702 and the complementary magnet structure of magnetic assembly 802. Magnetic assembly 702 is shown to be encoded with coded magnetic sequence {+2, −1, +1, −1, +1, −2}. Magnetic assembly 802 is shown to be encoded with complementary coded magnetic sequence {−2, +1, −1, +1, −1, +2}. For this example, the magnets can have the same or substantially the same magnetic field strength (or amplitude), which for the sake of this example is provided a unit of 1 (where A=Attract, R=Repel, A=R, A=1, R=−1). In this example, magnetic assemblies 702 and 802 are moved relative to each other one "1L" length at a time (note that the anti-symmetry about center line 716 of the coded magnetic sequence allows that the results of a leftward shift mirror the results of a rightward shift, therefore, only a rightward shift is shown).

For each relative alignment, the number of magnets that repel plus the number of magnets that attract is calculated, where each alignment has a total force in accordance with a magnetic force function based upon the magnetic field strengths of the magnets. In other words, the total magnetic force between the first and second magnet structures can be determined as the sum from left to right along the structure of the individual forces, at each magnet position, of each magnet or magnet pair interacting with its directly opposite corresponding magnet in the opposite magnet structure. Where only one magnet exists, the corresponding magnet is zero, and the force is zero. Where two magnets exist, the force is R for equal poles or A for opposite poles for each unit magnet.

The total magnetic force can be computed for each of the figures and shown with each figure along with the relative shift value. Accordingly, using a specific coded magnetic sequence {+2, −1, +1, −1, +1, −2} can result in net magnetic attractive force $F_{net}$ varying from −3 (i.e., 3R) to +8 (i.e., +8A) where the peak occurs when magnetic assemblies 702 and 802 are aligned such that their respective codes are also aligned. It should be noted that the off peak net magnetic force can vary from −3 to +4. As such, the net magnetic force can cause magnetic assemblies 702 to generally repel each other unless they are aligned such that each of their magnets is correlated with a complementary magnet (i.e., a magnet's South pole aligns with another magnet's North pole, or vice versa). In other words, magnetic assemblies 702 and 802 highly correlate when they are aligned such that they substantially mirror each other.

It should also be noted that when magnetic assemblies 702 and 802 are 180° out of phase (i.e., something akin to top to bottom mis-alignment also referred to as upside down) the net magnetic force generated can be on the order of 8R. Hence, it is highly unlikely that devices being magnetically attached to each other using magnetic assemblies 702 and 802 can be attached upside down.

Figure 13:
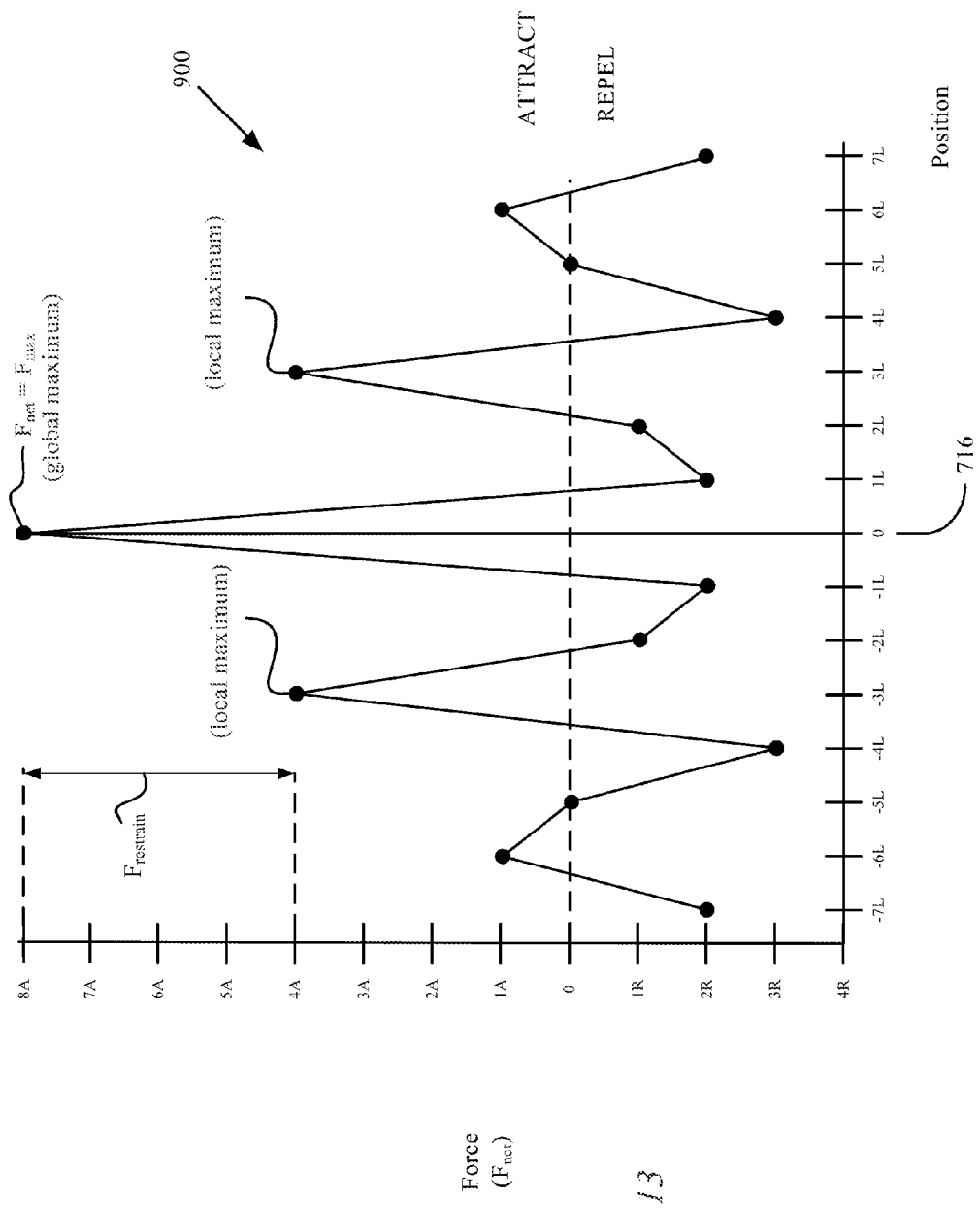
FIG. 13 shows a graph summarizing a magnetic attachment force versus relative position of the keyed magnetic attachment feature.

FIG. 13 illustrates graph 900 of function $F_{NET}(L)$. Function $F_{NET}(L)$ describes net magnetic force $F_{NET}$ as a function of shift displacement (L) shown in FIG. 12 for the coded magnet structures in magnetic assembly 702 and magnetic assembly 802. It should be noted that the symmetric nature of the coded magnetic structures in magnetic assemblies 702 and 802 about center line 716 provides that function $F_{NET}(L)$ is also anti-symmetric about center line 716. In this way, the results of FIG. 12 can be plotted on the right side of center line 716 and reflected about center line 716 to populate the left side of graph 900.

As shown in FIG. 13, function $F_{NET}(L)$ has a global maximum value when magnetic assemblies 702 and 802 correlate at a position corresponding to center line 716. In other words, function $F_{NET}(L=0)$ reaches a maximum (i.e., 8A) when all magnetic elements in magnetic assemblies 702 and 802 having opposite polarities align with each other. Any other configuration (i.e., $F_{NET}(L \neq 0)$ results in net magnetic force $F_{NET}$ being less than the global maximum value (of 8A). It should further be noted, however, that function $F_{NET}(L)$ has at least two local maxima values (i.e., $F_{NET}(L=\pm 3)$) that permits a weak attachment between magnetic assemblies 702 and 802. However, a strong, durable attachment can only occur when device magnetic attachment feature 700 associated with magnetic assembly 702 is properly activated. Therefore, by establishing activation force $F_{ACT}$ satisfying Eq. (8), a "false activations" of device magnetic attachment feature 700 or a weak attachment between magnetic assemblies 702 and 802 can be avoided.

$$F_{NET}(L=\text{local maxima}) \leq F_{ACT} \leq F_{NET}(L=\text{global maximum})$$ Eq. (8)

It should also be noted that activation force $F_{ACT}$ is related to retaining force $F_{retain}$ through Eq. (6). In this way, Eq. (6) and Eq. (8) in view of function $F_{NET}(L)$ can be can be used to determine a suitable value for spring constant k.

FIGS. 14 and 15 show other embodiments where magnetic elements can be arranged vertically and horizontally. In addition, the magnetic elements can be sized to have polarities that also extend both horizontally and vertically. For example, arrangement 1000 shows two rows of magnetic elements where each magnetic element extends height H in the vertical direction. In the arrangement shown, each vertically arranged magnetic element has the same magnetic polarity forming equivalent magnetic structure 1002. In other words, both arrangement 1000 and arrangement 1002 can be both be characterized as having the coded magnetic sequence {+2, −2, +2, −2, +2, −2}.

FIG. 15 shows a top view of magnetic array configured as two dimensional coded magnetic sequence 1004 in accordance with the described embodiments. Two dimensional coded magnetic sequence 1004 can be used to extend the combined magnetic field over an area that extends in both the x and y directions. This extended area can result in an overall increase in the area available to propagate magnetic field lines that can result in an increase in magnetic flux and a commensurate increase in net magnetic attractive force. In addition to providing an improved magnetic attachment, two dimensional coded magnetic sequence 1004 can approximate non-integer values of magnetic properties, such as magnetic strength. For example, with magnetic arrangement 1004, the magnetic fields of the various components can combine to approximate the coded magnetic sequence {+1.5, −1.5, +1.5, −1.5, +1.5, −1.5}. Furthermore, two dimensional coded magnetic sequence 1004 can assist in providing a vertical alignment in addition to a horizontal alignment.

For the remainder of this discussion, various embodiments of accessory device 200 are discussed.

In one embodiment, accessory device 200 can include a number of protective elements that can be used to protect certain aspects of electronic device 100. For example, accessory device 200 can take the form of a protective cover. The protective cover can include a flap pivotally connected to a hinge assembly. The hinge assembly can, in turn, be coupled to electronic device 100 by way of accessory attachment feature 202. In this way, the flap portion can be used as a protective cover to protect aspects of electronic device 100 such as a display. The flap can be formed of various materials such as plastic, cloth, and so forth. The flap can be segmented in such a way that a segment of the flap can be lifted to expose a corresponding portion of the display. The flap can also include a functional element that can cooperate with a corresponding functional element in electronic device 100. In this way, manipulating the flap can result in an alteration in the operation of electronic device 100.

The flap can include magnetic material that can be used to activate a magnetically sensitive circuit in electronic device 100 based upon, for example, the Hall Effect. The magnetically sensitive circuit can respond by generating a signal that can, in turn, be used to alter an operating state of electronic device 100. Since the cover can be easily attached directly to the housing of the tablet device without fasteners, the cover can essentially conform to the shape of electronic device 100. In this way, the cover will not detract or otherwise obscure the look and feel of electronic device 100.

In one embodiment, accessory device 200 can be used to enhance the overall functionality of electronic device 100. For example, accessory device 200 can be configured to act as a hanging apparatus. When magnetically attached to electronic device 100, accessory device 200 can be used to hang electronic device 100. In this way, electronic device 100 can be used as a display for presenting visual content such as art, movies, photos and so forth on a wall or suspended from a ceiling. As a hanging apparatus, accessory device 200 can be used to hang electronic device 100 from a wall or a ceiling. Electronic device 100 can be easily removed by simply exerting a releasing force sufficient to overcome the net magnetic attractive force $F_{NET}$. Accessory device 200 can be left in place and be used to reattach electronic device 100 (or another device) at a later time.

In one embodiment, accessory device 200 can also take the form of a holding mechanism for attaching objects that are not by themselves equipped to magnetically attach to electronic device 100. For example, accessory device 200 can be configured to carry a stylus or other such input device. The stylus can be used to provide inputs to the electronic device. In some cases, accessory device 200 can provide a signal to electronic device 100 indicating the presence of the stylus. The signal can cause electronic device 100 to enter into a stylus recognition state, for example. More particularly, when accessory device 200 is magnetically attached to electronic device 100, electronic device 100 can activate a stylus input state in order to recognize stylus type inputs. When accessory device 200 is removed, electronic device 100 can de-activate the stylus input state. In this way, the stylus can be conveniently attached/detached to electronic device 100 when needed.

Accessory device 200 can take the form of a support that can be used to enhance the functionality of electronic device 100. For example, accessory device 200 can be configured to act as a display stand on which a display of electronic device 100 can be viewed at a comfortable viewing angle such as 75°. In other words, when placed upon a horizontal surface such as a table or desk, accessory device 200 can support electronic device 100 in such a way that the visual content presented at the display can be viewed at about a viewing angle of approximately 75°.

Accessory device 200 can also take the form of a support that can be used to enhance the functionality of electronic device 100 in a keyboard state. In the keyboard state, accessory device 200 can be used to present a touch pad surface at an angle that is ergonomically friendly. In this way, input touch events can be applied (to a virtual keyboard, for example) at an angle that does not overtax a user's wrist, hands, arms, etc.

Figure 16A:
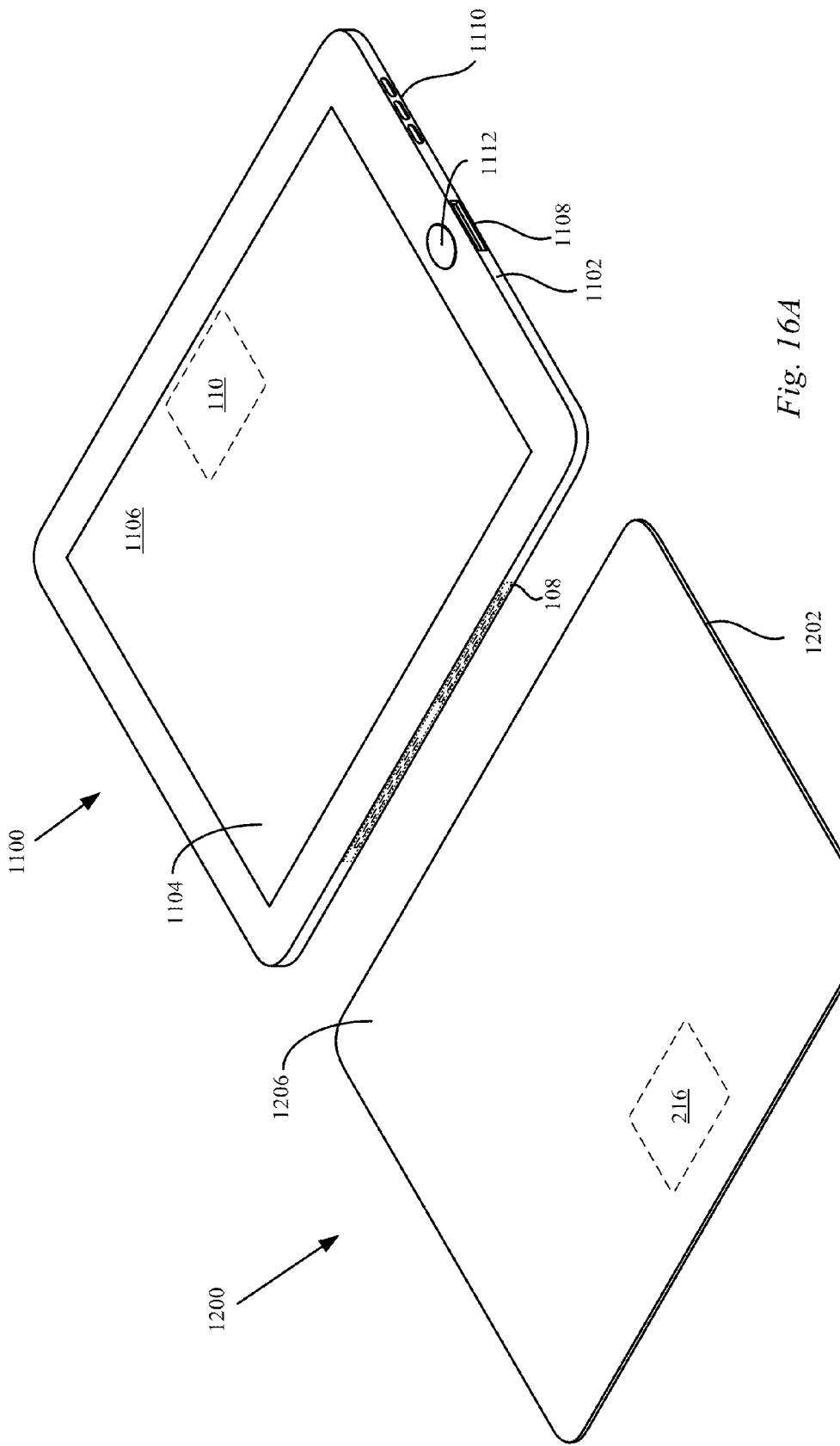
FIG. 16A shows a first perspective view of the electronic device in the form of a tablet device and the accessory device in the form of a protective cover.
Figure 16B:
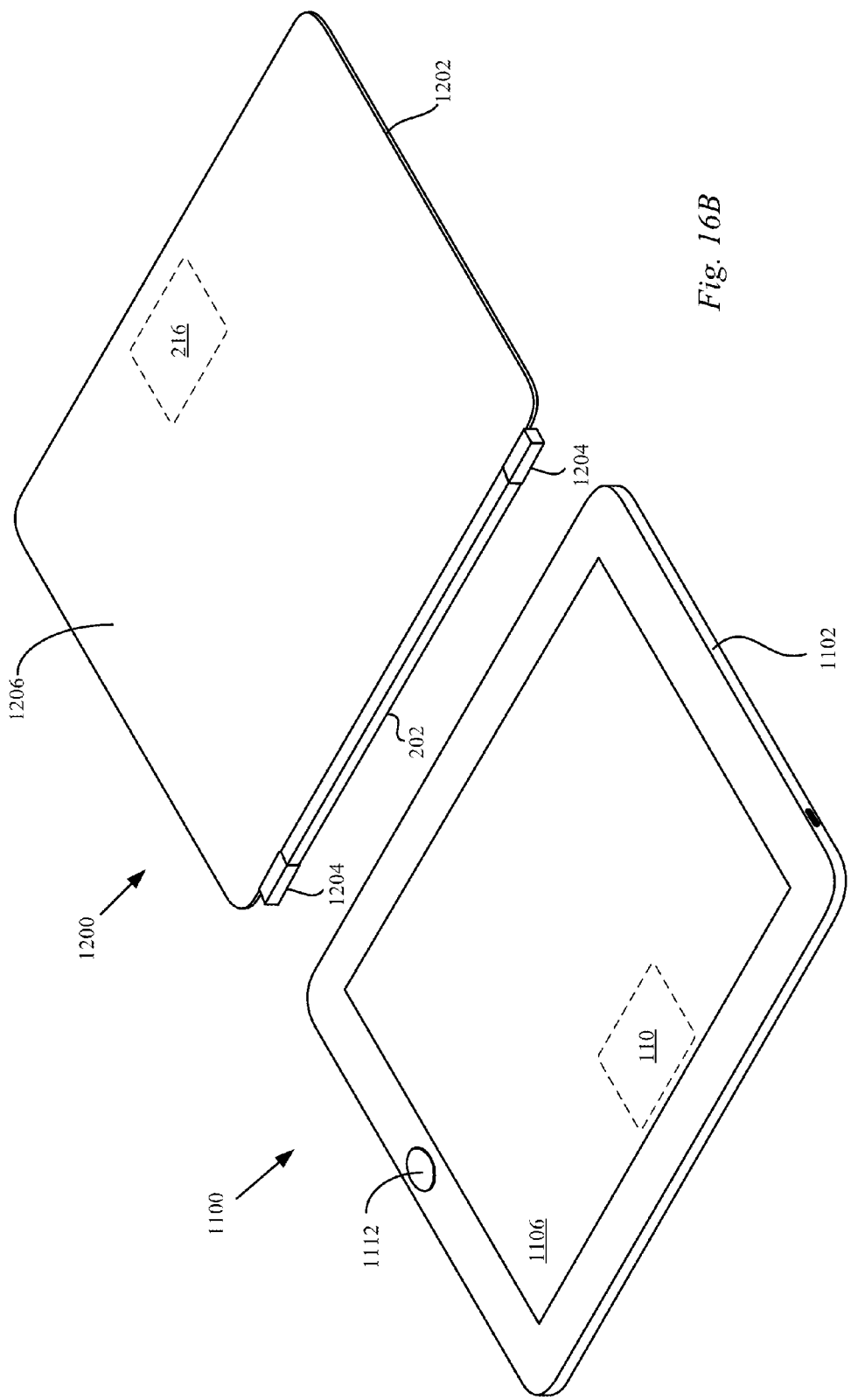
FIG. 16B shows a second perspective view of the electronic device in the form of a tablet device and the accessory device in the form of a protective cover.

The remainder of this discussion will describe particular embodiments of devices that can use the magnetic attachment system. In particular, FIG. 16A and FIG. 16B show electronic device 100 presented in terms of tablet device 1100 and accessory device 200 is shown as cover assembly 1200 each in perspective top views These elements may generally correspond to any of those previously mentioned. In particular, FIGS. 16A and 16B shows two perspective views of tablet device 1100 and cover assembly 1200 in the open configuration. For example, FIG. 16A shows device attachment feature 108 included in tablet device 1100 and its relationship to tablet device 1100. FIG. 16B, on the other hand, is the view presented in FIG. 16A rotated about 180° to provide a second view of attachment feature 202 and its relationship with cover assembly 1200.

Tablet device 1100 can take the form of a tablet computing device such as the iPad™ manufactured by Apple Inc. of Cupertino, Calif. Referring now to FIG. 16A, tablet device 1100 can include housing 1102 that can enclose and support device attachment feature 108. In order to not interfere with the magnetic field generated by device attachment feature 108, at least that portion of housing 1102 nearest device attachment feature 108 can be formed of any number of non-magnetic materials such as plastic or non-magnetic metal such as aluminum. Housing 1102 can also enclose and support internally various structural and electrical components (including integrated circuit chips and other circuitry) to provide computing operations for tablet device 1100. Housing 1102 can include opening 1104 for placing internal components and can be sized to accommodate a display assembly or system suitable for providing a user with at least visual content as for example via a display. In some cases, the display assembly can include touch sensitive capabilities providing the user with the ability to provide tactile inputs to tablet device 1100 using touch inputs. The display assembly can be formed of a number of layers including a topmost layer taking the form of transparent cover glass 1106 formed of polycarbonate or other appropriate plastic or highly polished glass. Using highly polished glass, cover glass 1106 can take the form of cover glass 1106 substantially filling opening 1104.

Although not shown, the display assembly underlying cover glass 1106 can be used to display images using any suitable display technology, such as LCD, LED, OLED, electronic or e-inks, and so on. The display assembly can be placed and secured within the cavity using a variety of mechanisms. In one embodiment, the display assembly is snapped into the cavity. It can be placed flush with the adjacent portion of the housing. In this way, the display can present visual content that can include visual, still images, as well as icons such as graphical user interface (GUI) that can provide information the user (e.g., text, objects, graphics) as well as receive user provided inputs. In some cases, displayed icons can be moved by a user to a more convenient location on the display.

In some embodiments, a display mask can be applied to, or incorporated within or under cover glass 1106. The display mask can be used to accent an unmasked portion of the display used to present visual content and can be used to make less obvious device attachment feature 108 and securing attachment feature 110.

Tablet device 1100 can include various ports that can be used to pass information between tablet device 1100 and the external environment. In particular, data port 1108 can facilitate the transfer of data and power whereas speakers 1110 can be used to output audio content. Home button 1112 can be used to provide an input signal that can be used by a processor included in tablet device 1100. The processor can use the signal from home button 1112 to alter the operating state of tablet device 1100. For example, home button 1112 can be used to reset a currently active page presented by the display assembly.

In one embodiment, accessory device 200 can take the form cover assembly 1200. Cover assembly 1200 can have a look and feel that complements that of the tablet device 1100 adding to overall look and feel of tablet device 1100. Cover assembly 1200 is shown in FIGS. 16A and 16B attached to tablet device 1100 in an open configuration in which cover glass 1106 is fully viewable. Cover assembly 1200 can include flap 1202. In one embodiment, flap 1202 can have a size and shape in accordance with cover glass 1106. Flap 1202 can be pivotally connected to accessory attachment feature 202 by way of a hinge assembly (not shown). The magnetic attachment force between attachment feature 202 and device attachment feature 108 can maintain cover assembly 1200 and tablet device 1100 in a proper orientation and placement vis-a-vis flap 1202 and cover glass 1106. By proper orientation it is meant that cover assembly 1200 can only properly attach to tablet device 1100 having flap 1202 and cover glass 1106 aligned in a mating engagement. The mating arrangement between cover glass 1106 and flap 1202 is such that flap 1202 covers substantially all of cover glass 1106 when flap 1202 is placed in contact with cover glass 1106 as shown in FIG. 17A below.

Figure 17A:
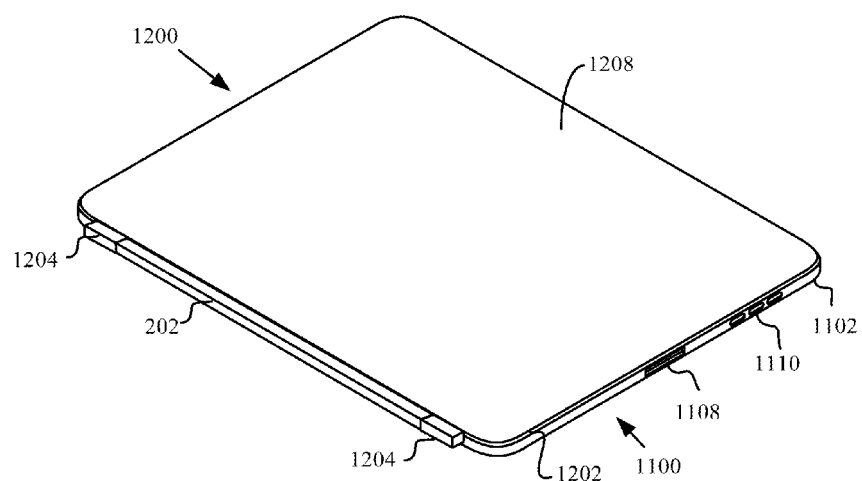
FIG. 17A shows a closed configuration of the cooperating system formed by the tablet device and protective cover shown in FIGS. 16A and 16B.
Figure 17B:
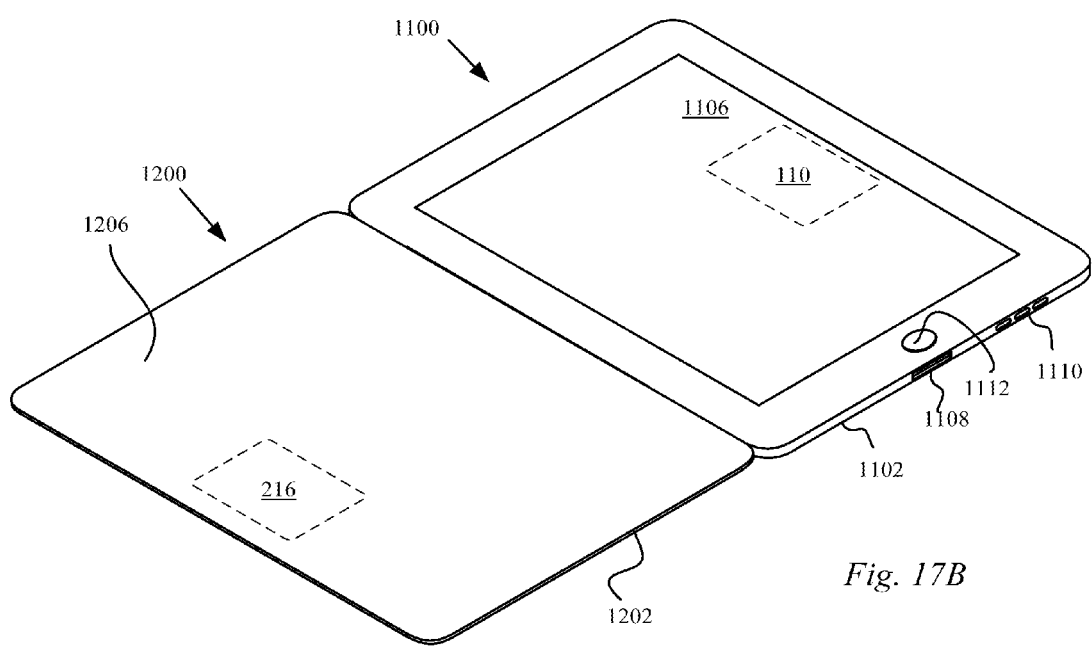
FIG. 17B shows an open configuration of the cooperating system shown in FIG. 17A.

FIGS. 17A and 17B show cover assembly 1200 and tablet device 1100 magnetically attached to each other. FIG. 17A shows a closed configuration in which cover glass 1106 is fully covered by and in contact with flap 1202. Cover assembly 1200 can pivot about hinge assembly 1204 from the closed configuration of FIG. 17A to an open configuration of FIG. 17B. In the closed configuration, inner layer 1206 of cover assembly 1200 can come in direct contact with cover glass 1106. In one embodiment, inner layer 1206 can be formed of material that can passively clean cover glass 1106. The passive cleaning by inner layer 1206 of cover glass 1106 can be accomplished by movements of those portions of inner layer 1206 in contact with cover glass 1106. In a particular embodiment, inner layer 1206 can be formed of a microfiber material.

In order to transition from the closed to the open configuration, releasing force $F_{release}$ can be applied to flap 1202. Releasing force $F_{release}$ can overcome the magnetic attractive force between attachment feature 216 in flap 1202 and attachment feature 110 in tablet device 1100. Hence, cover assembly 1200 can be secured to tablet device 1100 until releasing force $F_{release}$ is applied to flap 1202. In this way, flap 1202 can be used to protect cover glass 1106. For example, cover assembly 1200 can be magnetically attached to tablet device 1100. Flap 1202 can then be placed upon and magnetically secured to cover glass 1106 by the magnetic interaction between magnetic attachment features 110 and 216. Flap 1202 can be detached from cover glass 1106 by the application of releasing force $F_{release}$ directly to flap 1202. Releasing force $F_{release}$ can overcome the magnetic attraction between magnetic attachment features 110 and 216. Hence, flap 1202 can then move away from cover glass 1106 unhindered.

In order to maintain a good magnetic attachment between flap 1202 and magnetic attachment feature 110, flap 1202 can include a number of magnetic elements. Some of the magnetic elements in flap 1202 can interact with corresponding magnetic elements in magnetic attachment feature 110. The net magnetic attractive force generated between the magnetic elements can be strong enough to prevent inadvertent release of flap 1202 from cover glass 1106 during normal handling. The net magnetic attractive force, however, can be overcome by releasing force $F_{release}$.

Figure 18:
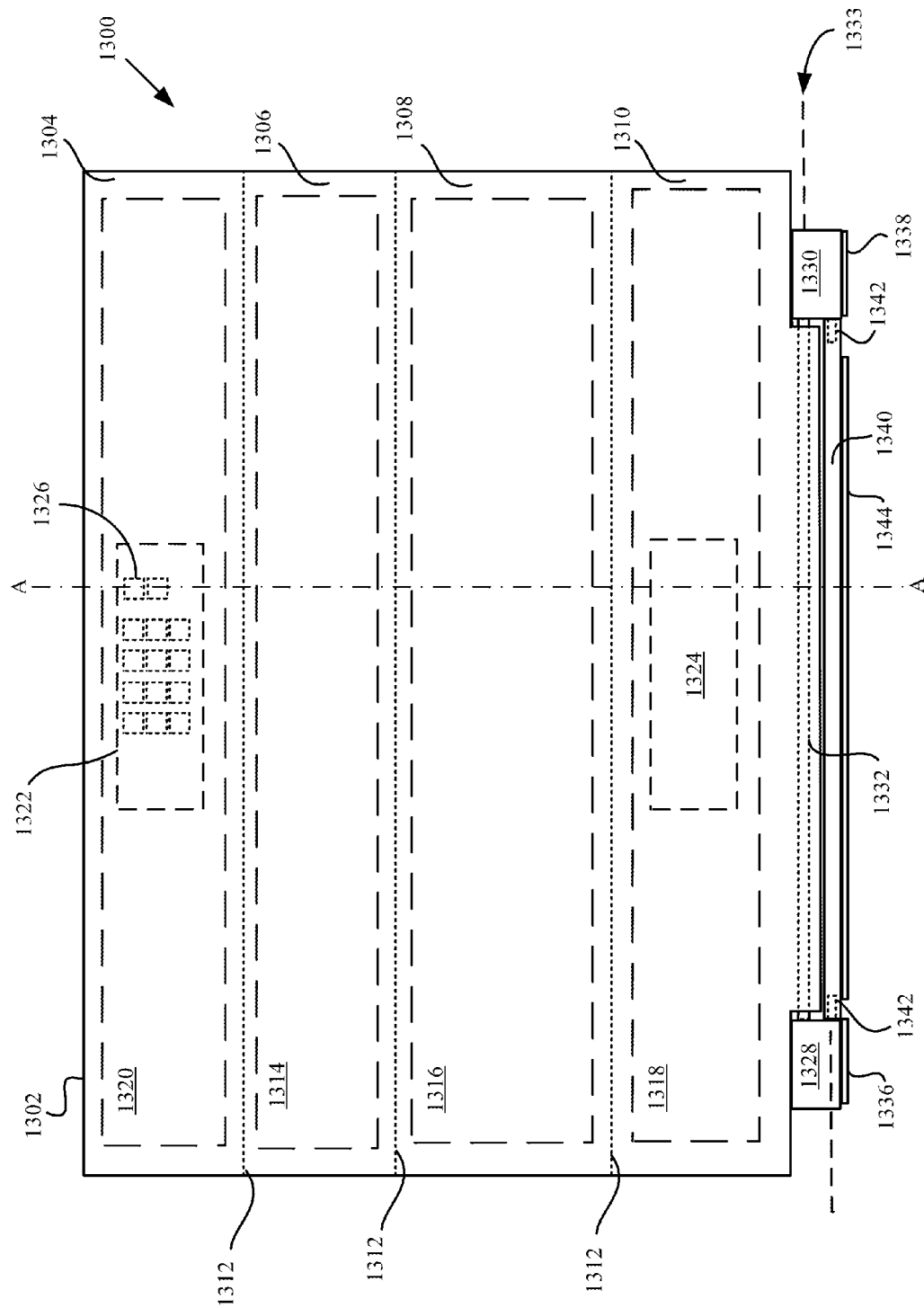
FIG. 18 shows a top view of an embodiment of a segmented cover assembly.

FIG. 18 shows a top view of a specific embodiment of cover assembly 1200 in the form of segmented cover assembly 1300. Segmented cover assembly 1300 can include body 1302. Body 1302 can have a size and shape in accordance with cover glass 1106 of tablet 1100. Body 1302 can be formed from a single piece of foldable or pliable material. Body 1302 can also be divided into segments separated from each other by a folding region. In this way, the segments can be folded with respect to each other at the folding regions. In one embodiment, body 1302 can be formed layers of material attached to one another forming a laminate structure. Each layer can take the form of a single piece of material that can have a size and shape in conformance with body 1302. Each layer can also have a size and shape that correspond to only a portion of body 1302. For example, a layer of rigid or semi-rigid material about the same size and shape of a segment can be attached to or otherwise associated with the segment. In another example, a layer of rigid or semi-rigid material having a size and shape in accordance with body 1302 can be used to provide segmented cover assembly 1300 as a whole with a resilient foundation. It should be noted that the layers can each be formed of materials having desired properties. For example, a layer of segmented cover assembly 1300 that comes in contact with delicate surfaces such as glass can be formed of a soft material that will mar or otherwise damage the delicate surface. In another embodiment, a material such as micro-fiber can be used that can passively clean the delicate surface. On the other hand, a layer that is exposed to the external environment can be formed of a more rugged and durable material such as plastic or leather.

In a specific embodiment, segmented body 1302 can be partitioned into a number of segments 1304-1310 interspersed with thinner, foldable portions 1312. Each of the segments 1304-1310 can include one or more inserts disposed therein. By way of example, the segments can include a pocket region where the inserts are placed or alternatively the inserts may be embedded within the segments (e.g., insert molding). If pockets used, the pocket region can have a size and shape to accommodate corresponding inserts. The inserts can have various shapes but are most typically shaped to conform to the overall look of segmented body 1302 (e.g., rectangular). The inserts can be used to provide structural support for segmented body 1302. That is, the inserts can provide stiffness to the cover assembly. In some cases, the inserts may be referred to as stiffeners. As such, the cover assembly is relatively stiff except along the foldable regions that are thinner and do not include the inserts (e.g., allows folding) making segmented cover assembly 1300 more robust and easier to handle. In one embodiment segments 1304, 1306, and 1310 can be related to segment 1308 in size in the proportion of about 0.72 to 1 meaning that segments 1304, 1306 and 1310 are sized in width to be about 72% of the width of segment 1308. In this way, a triangle having a appropriate angles can be formed (i.e., about 75° for display stand and about 11° for keyboard stand discussed below).

Segments 1306, 1308, and 1310 can include inserts 1314, 1316, and 1318, respectively (shown in dotted lines form). Inserts 1314-1318 can be formed of rigid or semi-rigid material adding resiliency to body 1302. Examples of materials that can be used include plastics, fiber glass, carbon fiber composites, metals, and the like. Segment 1304 can include insert 1320 also formed of resilient material such as plastic but also arranged to accommodate magnetic elements 1322 some of which can interact with magnetic elements in table device 1100 and more specifically attachment feature 110.

Due to the ability of segmented body 1302 to fold and more particularly the various segments to fold with respect to each other, most of magnetic elements 1322 can be used to magnetically interact with magnetically active insert 1324 embedded in insert 1318. By magnetically binding both active insert 1324 and magnetic elements 1322 various support structures can be formed some of which can be triangular in shape. The triangular support structures can aid in the use of tablet device 1100. For example, one triangular support structure can be used to support tablet device 1100 in such a way that visual content can be presented at a desirable viewing angle of about 75° from horizontal. However, in order be able to appropriately fold segmented cover 1300, segment 1308 can be sized to be somewhat larger than segments 1304, 1306 and 1310 (which are generally the same size). In this way, the segments can form a triangle having two equal sides and a longer third side, the triangle having an interior angle of about 75°.

One approach to forming at least one triangular support structure can include segment 1304 folding with respect to segments 1306-1310 in such a way that most of magnetic elements 1322 embedded in insert 1320 magnetically attract the magnetically active insert 1324. In this way, segment 1304 and segment 1310 can be magnetically bound together forming a triangular support structure having the appropriate dimensions. The triangular support structure can be used as a stand onto which tablet device 1100 can be placed such that visual content can be displayed at about 75°. In another example, segmented cover 1300 can be folded to form a triangular support structure that can be used as a keyboard support. Segmented cover 1300 can also be folded to form a triangular support structure that can be used to hang tablet device 1100 from a horizontal support piece (such as a ceiling) or a vertical support piece (such as a wall).

Cover assembly 1300 can pivotally attach to accessory attachment feature 202 by way of a hinge assembly. The hinge assembly can provide one or more pivots to allow the cover to fold over on the device while the cover assembly is attached to the device through the magnets. In the illustrated embodiment, the hinge assembly can include first hinge portion (also referred to as first end lug) 1328 and a second hinge portion (or second end lug) 1330 disposed opposite the first end lug. First end lug 1328 can be rigidly connected to second end lug 1330 by way of connecting rod 1332 (shown in dotted line form) incorporated into a tube portion of segmented body 1302. The longitudinal axis of connecting rod 1332 can act as pivot line 1333 about which the segmented body can pivot relative to the hinge assembly. Connecting rod 1332 can be formed of metal or plastic strong enough to rigidly support cover assembly 1300 as well as any objects, such as tablet device 1100, magnetically attached to magnetic attachment feature 202.

In order to prevent metal on metal contact, first end lug 1328 and second end lug 1330 can each have protective layers 1336 and 1338, respectively, attached thereto. Protective layers (also referred to as bumpers) 1336 and 1338 can prevent direct contact between first end lug 1328 and second end lug 1330 with housing 1102. This is particularly important when end lugs 1328, 1330 and housing 1102 are formed of metal. The presence of bumpers 1336 and 1338 can prevent metal to metal contact between the end lugs and housing 1102 thereby eliminating the chance of substantial wear and tear at the point of contact that can degrade the overall look and feel of tablet device 1100.

In order to maintain their protective qualities, bumpers 1336 and 1338 can be formed of material that is resilient, durable, and resists marring the finish of the exterior surface of tablet device 1102. This is particularly important due to the tight tolerances required for good magnetic attachment and the number of attachment cycles expected during the operational life of tablet device 1100. Accordingly, bumpers 1336 and 1338 can be formed of soft plastic, cloth or paper that can be attached to the end lugs using any suitable adhesive. It should also be noted that in some cases, the bumpers can be removed and replaced with fresh bumpers when needed.

First end lug 1328 and second end lug 1330 can be magnetically connected to the electronic device by way of hinge span 1340 that is configured to pivot with respect to the end lugs. The pivoting can be accomplished using hinge posts 1342 (a portion of which can be exposed). Hinge posts 1342 can rotatably secure hinge span 1340 to both first end lug 1328 and second end lug 1330. Hinge span 1304 can include magnetic elements. The magnetic elements can be arranged to magnetically attach hinge span 1340 to a magnetic attachment feature having a matching arrangement of magnetic elements in the electronic device. In order to fix the magnetic elements in place within hinge span 1340, hinge posts 1342 can be used to secure magnetic elements located at both ends of hinge span 1340 reducing the likelihood that the magnetic elements in hinge span 1340 will move about having the potential for disrupting the magnetic attachment between hinge span 1340 and the magnetic attachment feature in the electronic device.

In order to assure that there is no interference between the magnetic elements in hinge span 1340 and the corresponding magnetic elements in the electronic device, hinge span 1340 can be formed of magnetically inactive material such as plastic or non-magnetic metal such as aluminum. When hinge span 1340 is formed of magnetically inactive metal, such as aluminum, metal to metal contact between hinge span 1340 and housing 1102 of electronic device 1100 can be prevented with the use of protective layer 1344. Protective layer 1344 can be applied to the surface of hinge span 1340 that faces housing 1102 when hinge span 1340 and electronic device 1100 are magnetically attached to each other. Protective layer 1344 (also referred to as label 1344) can be formed of many materials that will not mar the finish of housing 1102. Such materials can include, for example, paper, cloth, plastic, and so forth.

Figure 19A:
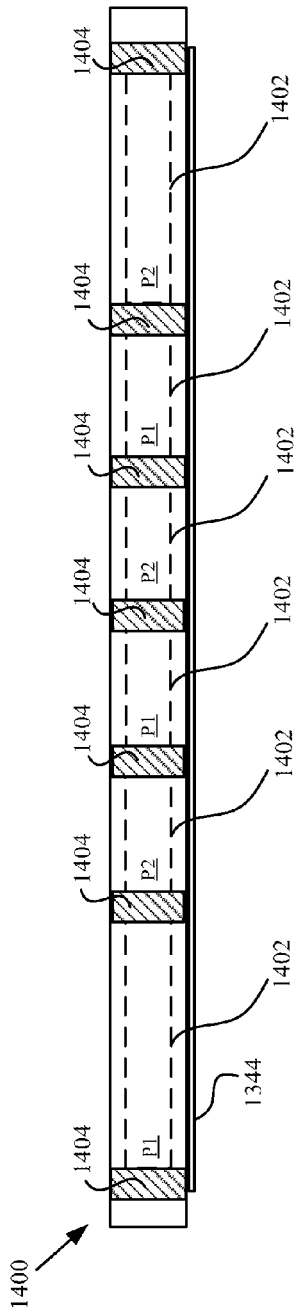
FIGS. 19A-19C show a detailed view of a hinge span in accordance with the described embodiments.
Figure 19B:
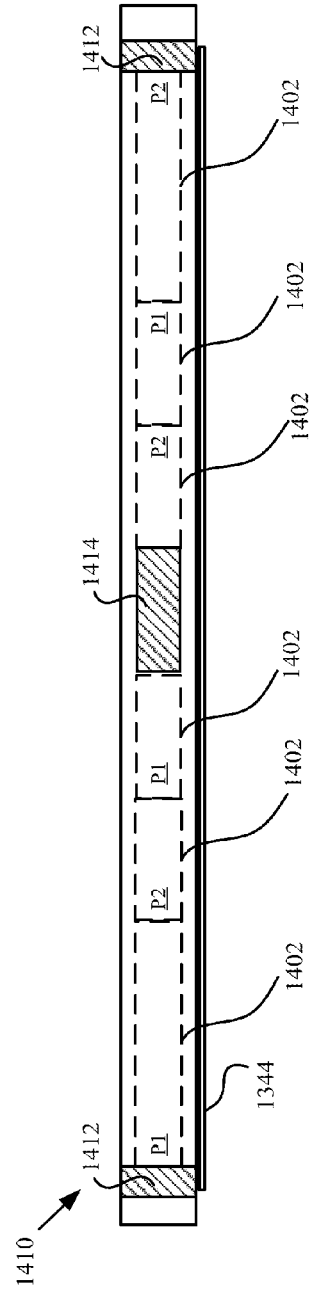

FIGS. 19A and 19B show a more detailed view of two embodiments of hinge span 1340. More specifically, FIG. 19A shows embodiment 1400 of the hinge span where magnetically inert spacers are used to separate and fix the magnetic elements. In particular, hinge span 1400 can enclose and support magnetic elements 1402 used by magnetic attachment feature 202 to magnetically attach segmented cover assembly 1300 to tablet device 1100. Magnetic elements 1402 can be arranged in a specific configuration that matches corresponding magnetic elements in device attachment feature 108 in tablet device 1100. In this way, segmented cover assembly 1300 and tablet device 1100 can precisely and repeatedly attach to each other.

In order to maintain repeatable and stable magnetic engagement over an extended period of time, magnetic elements 1402 can remain in a stable configuration. In other words, magnetic elements 1402 in hinge span 1400 should remain in their relative positions and polarities vis-à-vis the corresponding magnetic elements in the magnetic attachment system in tablet 1100 for an extended period of time. This is particularly important when repeated attachment cycles are anticipated to occur over an expected operating life of cover assembly 1300 and/or tablet device 1100.

Hence, to assure the integrity of the magnetic engagement over the course of many attachment cycles, the configuration of magnetic elements 1402 can remain essentially fixed with respect to each other and to the corresponding magnetic elements in device attachment feature 108. Hence, in order to assure that the physical layout of magnetic elements 1402 remain essentially fixed, filler material 1404 can be inserted between the various magnetic elements in hinge span 1400. Filler material 1404 can be non-magnetic material such as plastic. Filler material 1404 can be shaped to tightly fit in the interstitial spaces between the magnetic elements. In this way, magnetic elements 1402 remain in a fixed and stable configuration for an extended period of time.

On the other hand, FIG. 19B shows another embodiment of hinge span 1340 in the form of hinge span 1410 that utilizes the mutual magnetic attraction between physically adjacent magnetic elements for fixing the magnetic elements in place. In this way, the number of component parts is reduced. Furthermore, due to the reduced area taken up by magnetic elements 1402, the corresponding magnetic flux density can increased. However, end plugs 1412 can be used to fix those magnetic elements located at either end of hinge span 1410. End plugs 1412 can be necessary to overcome a net magnetic repulsive force when the magnetic elements at either end of hinge span 1410 have aligned polarities. In addition to end plugs 1412, an alternative embodiment can provide for centrally located spacer 1414. Centrally located spacer 1414 can be formed of magnetically inert material and be used to fix magnetic elements 1402 in place.

Figure 19C:
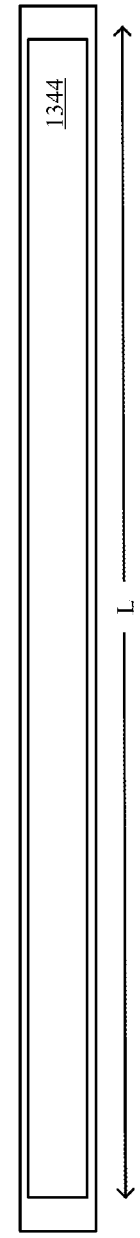

FIG. 19C shows that portion of hinge span 1340 that forms part of the engagement surface when segmented cover assembly 1300 is magnetically attached to tablet device 1100. In particular, label 1344 is shown attached to hinge span 1340 using adhesive such as glue. It should be noted, that label 1344 is arranged to conform to the shape of that portion of housing 1102 that also forms part of the engagement surface. In this way, the separation distance between corresponding magnetic elements can be minimized.

Figure 20C:
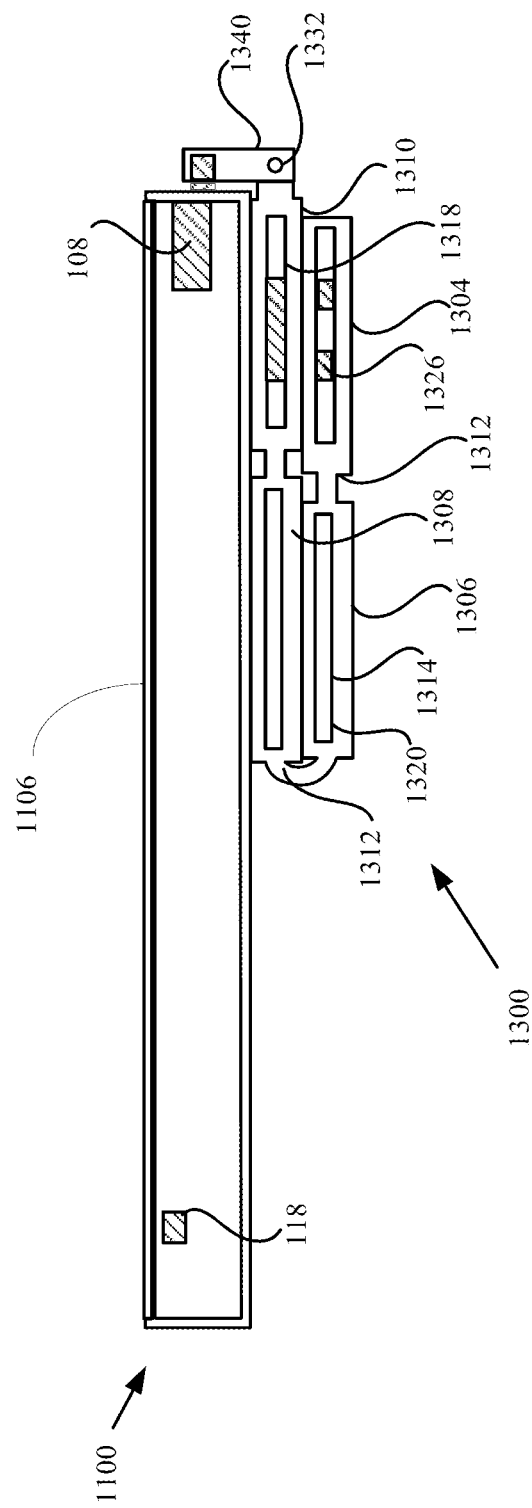

FIG. 20A shows a representative side view of segmented cover assembly 1300 magnetically attached to tablet device 1100. FIG. 20B show representative cross sectional views of segmented cover assembly 1300/tablet device 1100 along line AA shown in FIG. 18. FIG. 20B shows a covered configuration and FIG. 20C shows a folded back configuration that fully exposes protective layer 1106 of tablet device 1100.

Figure 21A:
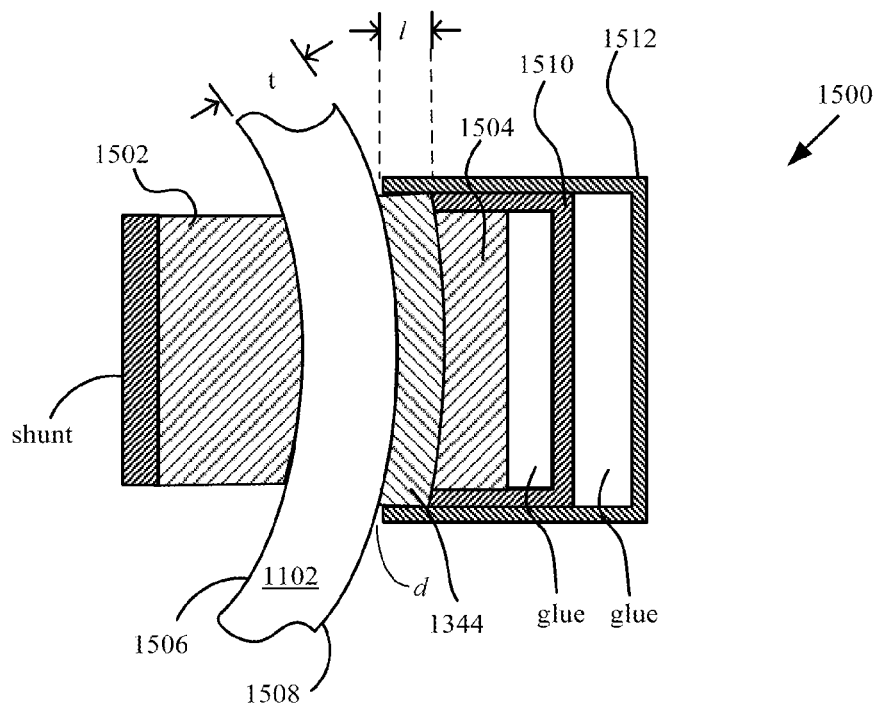
FIG. 21A shows a cross sectional side view of one embodiment of the hinge span of FIGS. 19A-19C magnetically attached to a housing having a curved surface.

FIG. 21A shows a cross sectional side view 1500 of hinge span 1340 magnetically attached to housing 1102 having a curved shape. In this embodiment, housing 1102 can have a curved shape and is formed of non-magnetic material such as aluminum. Magnetic element 1502 can be incorporated into device attachment feature 108 in tablet device 1102. In some embodiments, in order to prevent metal to metal contact, in those embodiments in which magnetic element 1502 is metal, a protective film can be attached to an engagement surface of magnetic element 1502 that prevents magnetic element 1502 from contacting housing 1102 directly. The protective film can be thin enough to be neglected when considering the magnetic engagement force between corresponding magnetic elements. The protective film can be unnecessary if magnetic element 1502 is not formed of metal or if that portion of housing 1102 that contacts magnetic element 1502 is not metal.

Magnetic element 1502 can magnetically interact with corresponding magnetic element 1504 in hinge span 1340. Magnetic element 1504 can have thickness of about 2 mm. The magnetic interaction can create net magnetic attractive force $F_{NET}$ satisfying Eq. (3a) in which separation distance $x_{sep}$ is about equal to the total of the thickness t of housing 1102 and thickness "1" of label 1344. Thickness "1" can be on the order of about 0.2 mm. Therefore in order to minimize separation distance $x_{sep}$ (and thereby increase $F_{NET}$), magnetic element 1502 can be shaped to conform to interior surface 1506 of housing 1102. Furthermore, label 1344 and magnetic element 1504 can each be shaped to conform to exterior surface 1508 of housing 1102. In this way, the distance between magnetic element 1502 and magnetic element 1504 can be reduced to about the thickness t of housing 1102 and thickness/of label 1344.

In order to further improve net attractive magnetic force $F_{NET}$ between magnetic elements 1502 and 1504, magnetic shunt 1510 can be glued to and enclose that portion of magnetic element 1504 facing away from housing 1102. Magnetic shunt 1510 can be formed of magnetically active material such as steel or iron. The magnetically active material can redirect magnetic flux lines that would otherwise be directed away from magnetic element 1502 towards housing 1102 thereby increasing the total magnetic flux density $B_{TOTAL}$ between magnetic element 1502 and magnetic element 1504 resulting in a commensurate increase in net magnetic attractive force $F_{NET}$. Magnetic shunt 1510 can, in turn, be glued to housing 1512 of hinge span 1340. It should be noted, that in order to assure that only label 1344 contacts exterior surface 1508 of housing 1102 (to avoid metal to metal contact), label 1344 is proud (i.e., protrudes) of housing 1512 of hinge span 1340 by about distance "d". Nominally, distance d can be on the order of about 0.1 mm.

Since net magnetic force $F_{NET}$ depends in part on separation distance between cooperating magnetic elements, the overall integrity of the magnetic attachment between the magnetic attachment system in tablet device 1100 and the magnetic elements in hinge span 1340 can be affected by the actual separation distance between cooperating magnetic elements as well as the consistency of the separation distance along length L of hinge span 1340. In order to provide a highly correlated magnetic attractive force along hinge span 1340, the separation distances between the magnetic elements in hinge span 1340 and those of the magnetic attachment system in tablet device 1100 are well controlled.

Figure 21B:
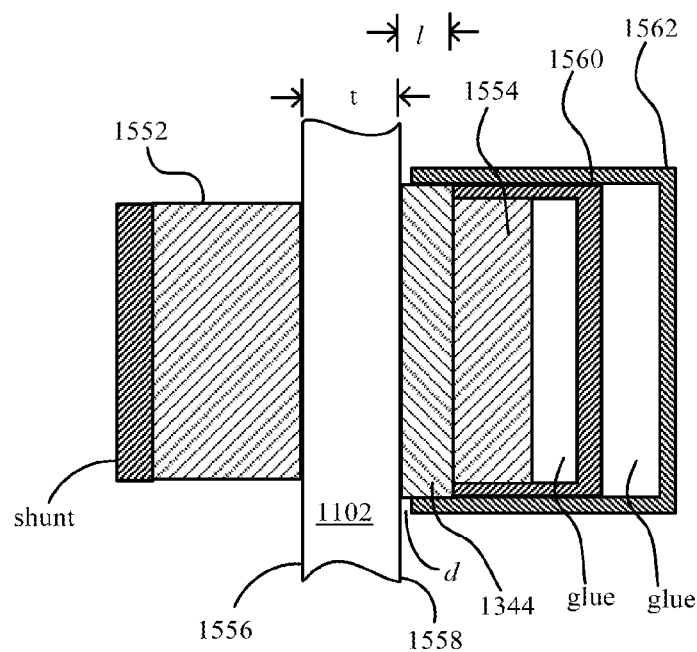
FIG. 21B shows a cross sectional side view of another embodiment of the hinge span magnetically attached to a housing having a flat surface.

FIG. 21B shows cross sectional view 1550 of hinge span 1340 magnetically attached to housing 1102 having a flat surface. In this arrangement, label 1344 and magnet 1554 can each conform to the flat shape of housing 1102.

Figure 22A:
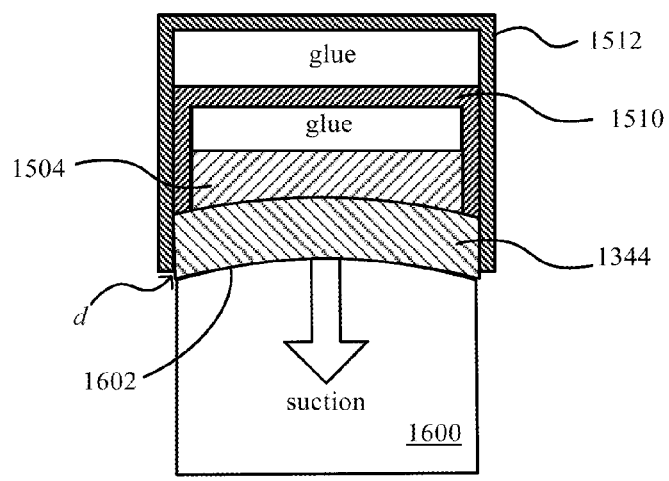
FIGS. 22A and 22B show cross sectional and perspective views of a fixture used to assemble the hinge span in accordance with the described embodiments.
Figure 22B:
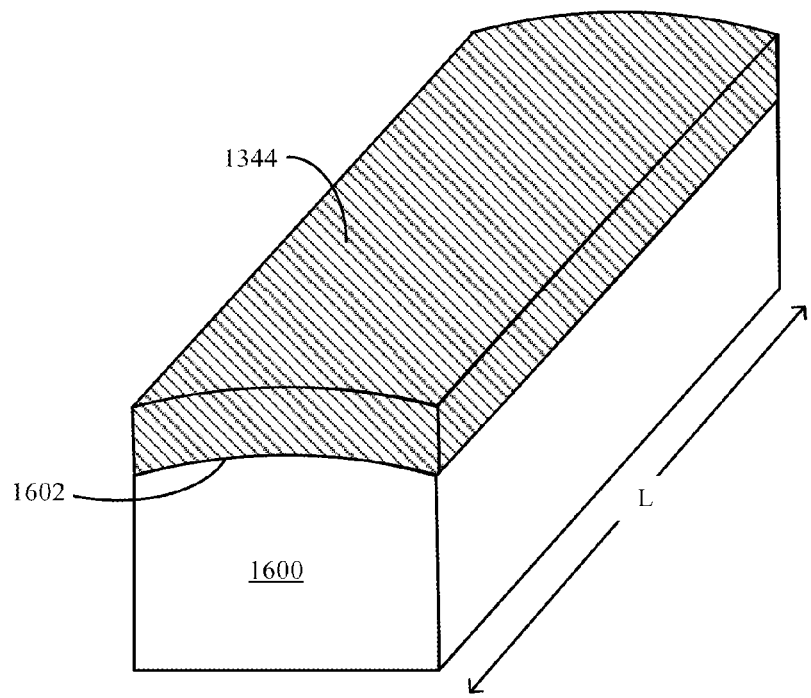

In order to assure consistency of the net magnetic attractive force along length L of hinge span 1340, the components of hinge span 1340 can be assembled using fixture 1600 shown in cross section in FIG. 22A and in perspective view in FIG. 22B. Fixture 1600 can have surface 1602 that conforms to the shape of the exterior surface of housing 1102. In order to assemble hinge span 1340 in a manner that assures consistent magnetic attractive force along the length L of hinge span 1340 (as well as to provide an aesthetically pleasing look), label 1344 can be temporarily attached to surface 1602 of fixture 1600. Since surface 1602 substantially conforms to the shape of exterior surface 1508, label 1344 will have a shape that also conforms to the shape of exterior surface 1508. In one embodiment, a partial vacuum can be created within fixture 1600 that causes label 1344 to attach to surface 1602 under suction. In this way, the assembled hinge span can be detached from surface 1602 by simply removing the partial vacuum.

Once label 1344 is secured to surface 1602 of fixture 1600, magnetic element 1504 can be placed in direct contact with and attached to label 1344 using any appropriate adhesive. In order to reduce separation distance as much as possible, magnetic element 1504 can have a shape that conforms to that of both labels 1344 and surface 1602. In this way, the conformal shaping of both label 1344 and magnetic element 1504 assures a minimum separation distance between magnetic element 1506 and 1502. Magnetic element 1504 can then be glued to magnetic shunt 1510 formed of magnetically active materials such as steel to focus magnetic flux towards magnetic element 1502. Metal shunt 1510 can then be enclosed by and glued to hinge span housing 1512 leaving about d=0.1 mm of label 1344 protruding from housing 1512.

In addition to providing protection to tablet device 1100, segmented cover assembly 1300 can be manipulated to form useful support structures. Accordingly, FIGS. 23 through 26 show useful arrangements of cover assembly 1300 in accordance with the described embodiments.

Figure 23:
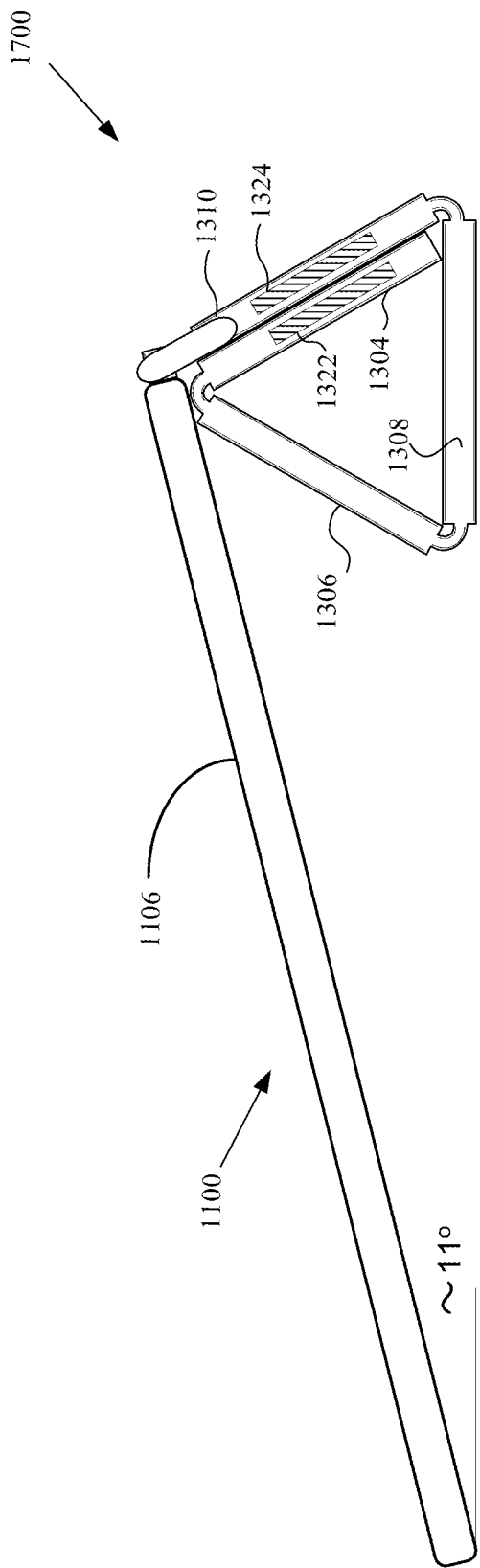
FIG. 23 shows a side view of a segmented cover configured to support a tablet device in a keyboard state.

For example, as shown in FIG. 23, segmented cover assembly 1300 can be folded such that the magnetically active portion of insert 1324 magnetically interacts with magnetic elements 1322. It should be noted that the magnetic force used to maintain triangular support structure 1700 is about in the range of 5-10 newtons (NT). In this way, triangular support structure 1700 can be prevented from unwrapping inadvertently. Triangular support structure 1700 can be formed that can be used in many ways to augment tablet device 1100. For example, triangular support structure 1700 can be used to support tablet device 1100 in such a way that touch sensitive surface 1702 is positioned relative to a support surface at an ergonomically advantageous angle. In this way, using touch sensitive surface 1702 can be a user friendly experience. This is particularly relevant in those situations where the touch sensitive surface is used over an extended period of time. For example, a virtual keyboard can be presented at touch sensitive surface 1702. The virtual keyboard can be used to input data to tablet device 1100. By using triangular support structure 1700 to support tablet device 1100 at the ergonomically friendly angle, the deleterious effects of repetitive movements can be reduced or even eliminated.

Figure 24A:
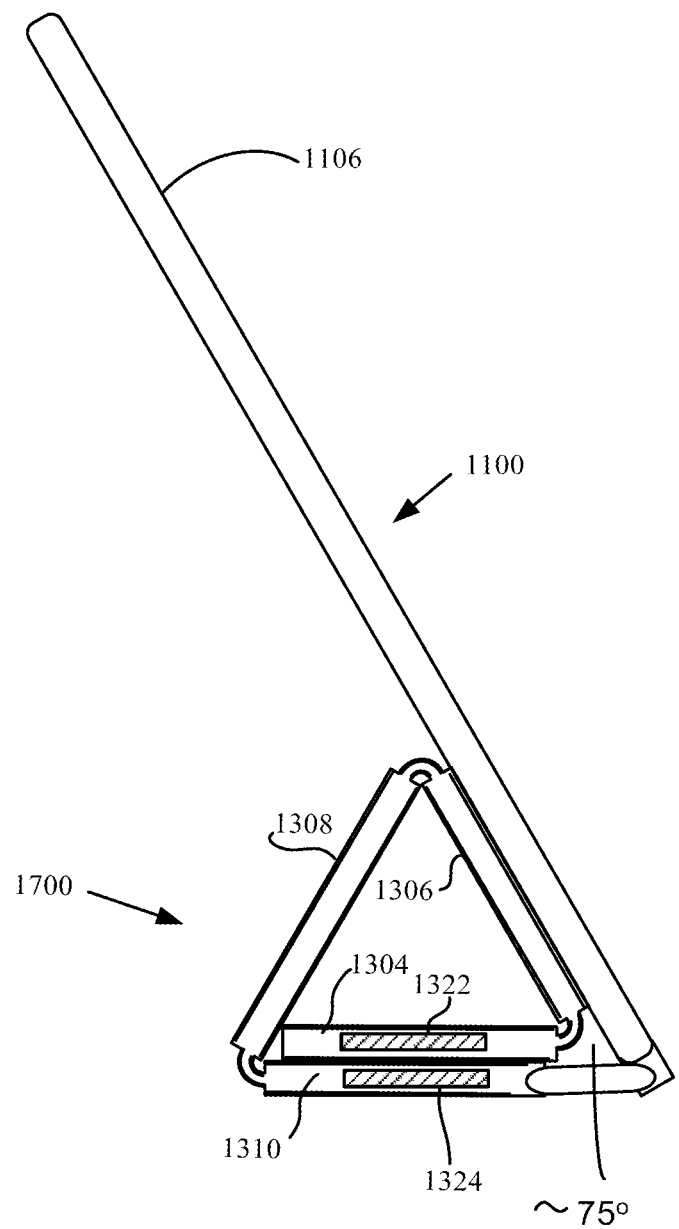
FIGS. 24A and 24B show side and perspective views, respectively, of the segmented cover configured to support a tablet device in a display state.
Figure 24B:
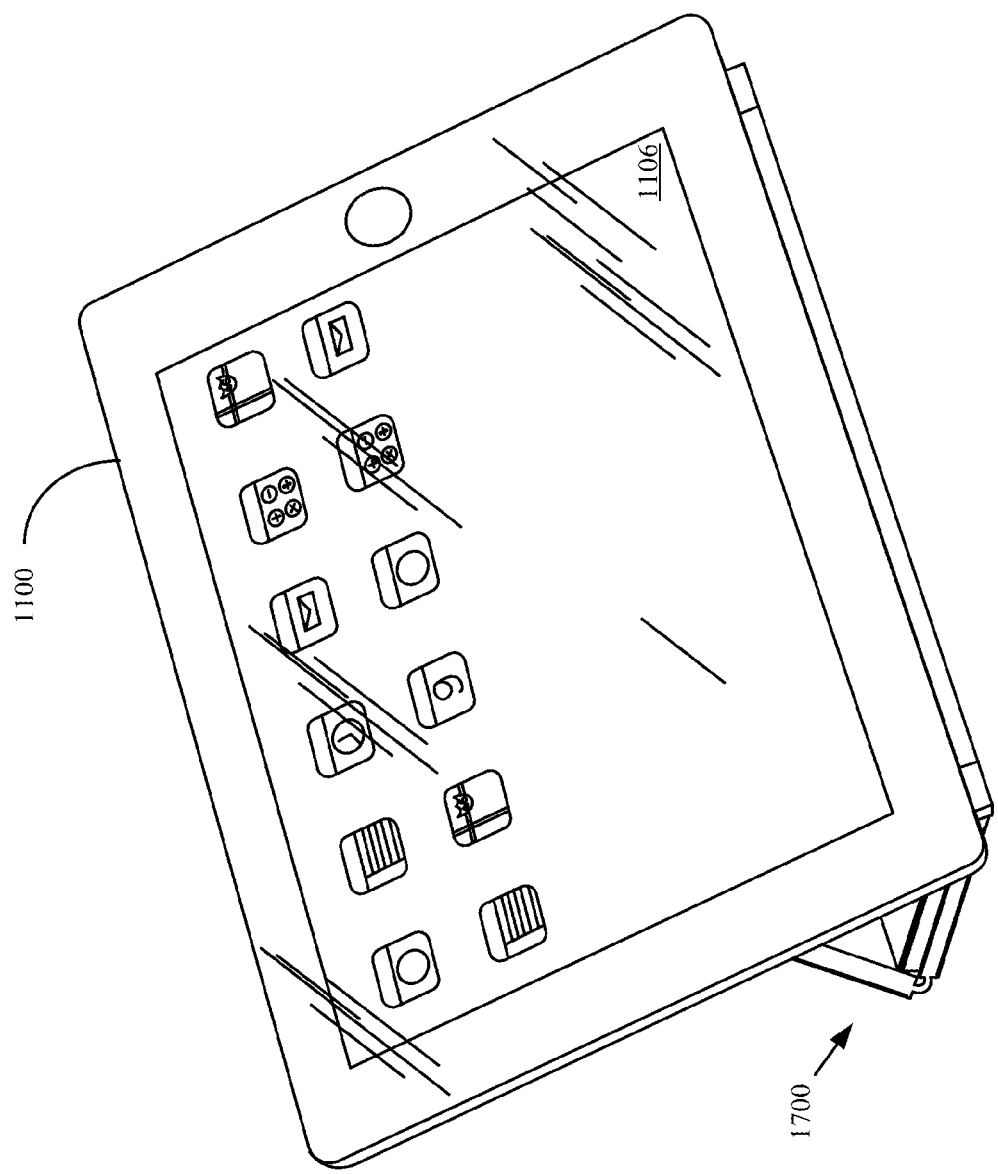

FIGS. 24A and 24B show another folded implementation of segmented cover assembly 1300 in which triangular support structure 1700 can be used to support tablet device 1100 in a viewing state. By viewing state it is meant that visual content (visual, stills, animation, etc.) can be presented at a viewer friendly angle of about 75° from horizontal. In this "kickstand" state, visual content can be presented for easy viewing. A viewable area of tablet device 1100 can be presented at an angle of about 75° which has been found to be within a range of viewing angles considered optimal for a good viewing experience.

Figure 25A:
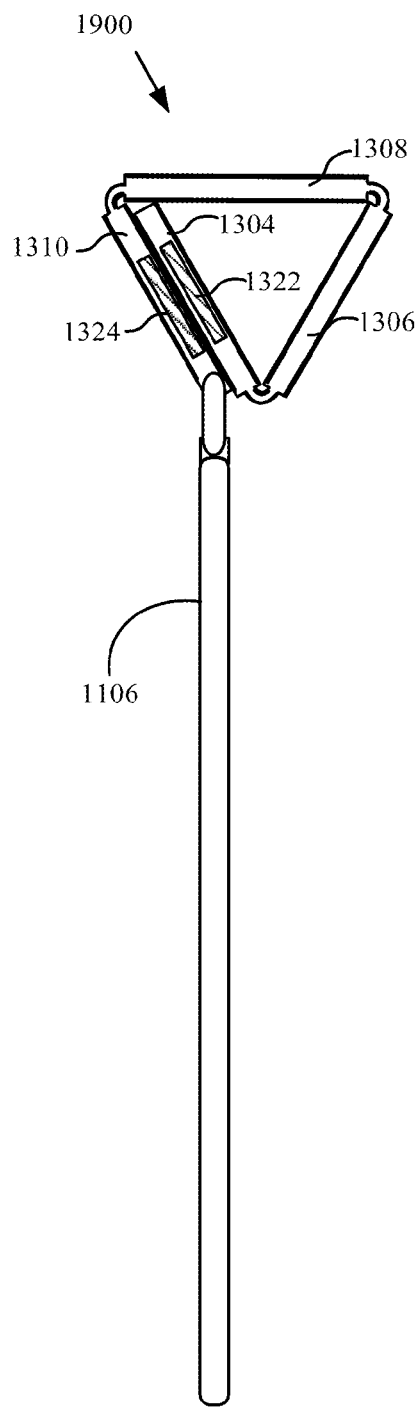
FIGS. 25A-25B show the segmented cover assembly configured as various embodiments of a hanging apparatus.
Figure 25B:
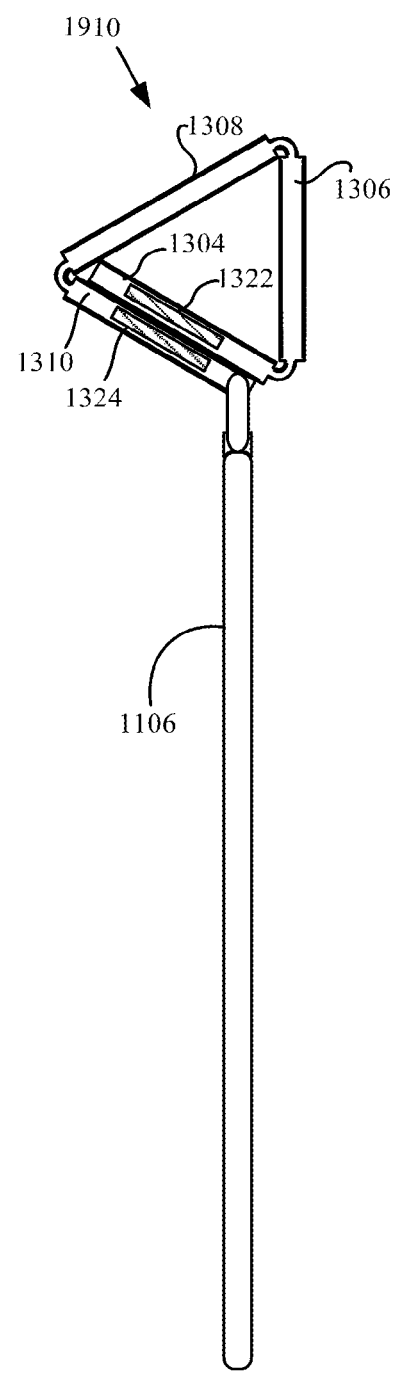
Figure 26A:
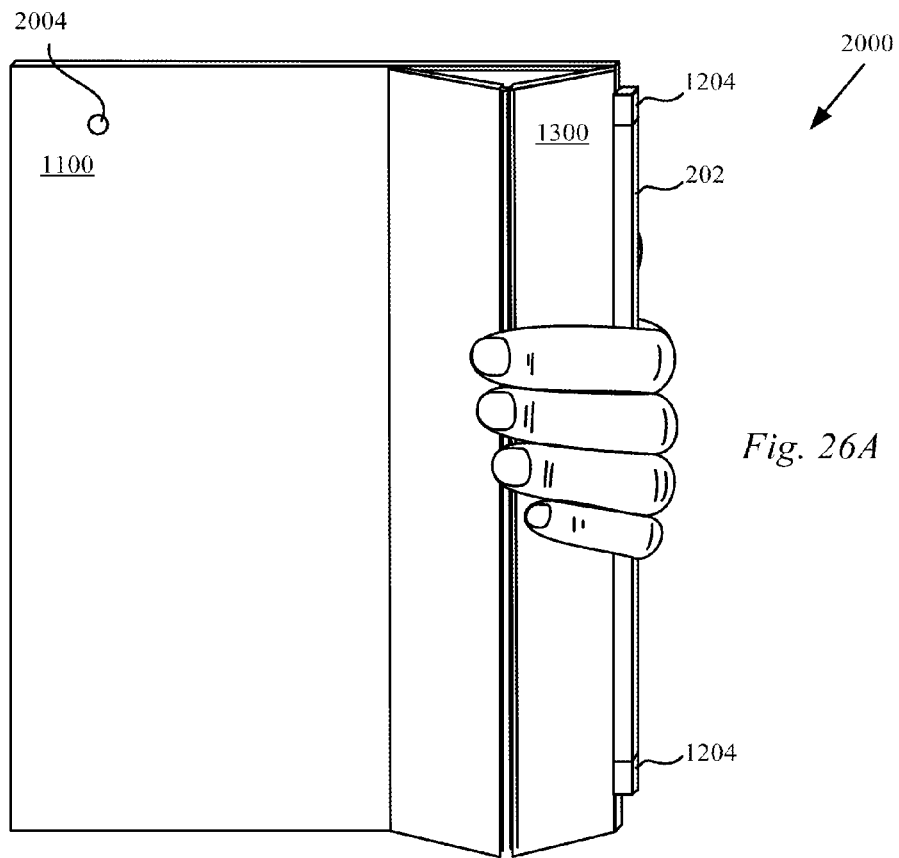
FIGS. 26A and 26B show rear and front views, respectively, of a tablet device having a front and rear image capture device held by the handle.

FIGS. 25A-25B show segmented cover assembly 1300 folded into various hanging embodiments. By hanging embodiments, it is meant that by folding segmented cover assembly 1300 into an appropriate triangular shape, tablet device 1100 can be suspended from above as shown in FIG. 26A in the form of hanger 1900. Hanger 1900 can be used to suspend tablet device 1100 from above. For example, hanger 1900 can be suspended directly from a ceiling using a support piece such as a rod. Hanger 1900 can be created simply by folding segmented cover assembly 1300 in a first direction until embedded magnets 1322 magnetically engage magnetically active insert 1324 that can be formed of steel or iron. The magnetic circuit formed by the engagement of embedded magnets 1322 and magnetically active insert 1324 can provide sufficient support for safely suspending tablet device 1100 from any horizontally aligned support structure.

FIG. 25B shows hanger embodiments suitable for hanging tablet device 1100 from a vertically aligned support structure such as a wall. In particular, hanger 1910 can be mechanically attached to a wall or other vertical support structure. Hanger 1910 can then be used to suspend tablet device 1100 along the lines of a wall mount. In this way, tablet device 1100 can be used to present visual content along the lines of a visual display for visual content, or wall hanging for still images such as photos, art, and the like.

Figure 26B:
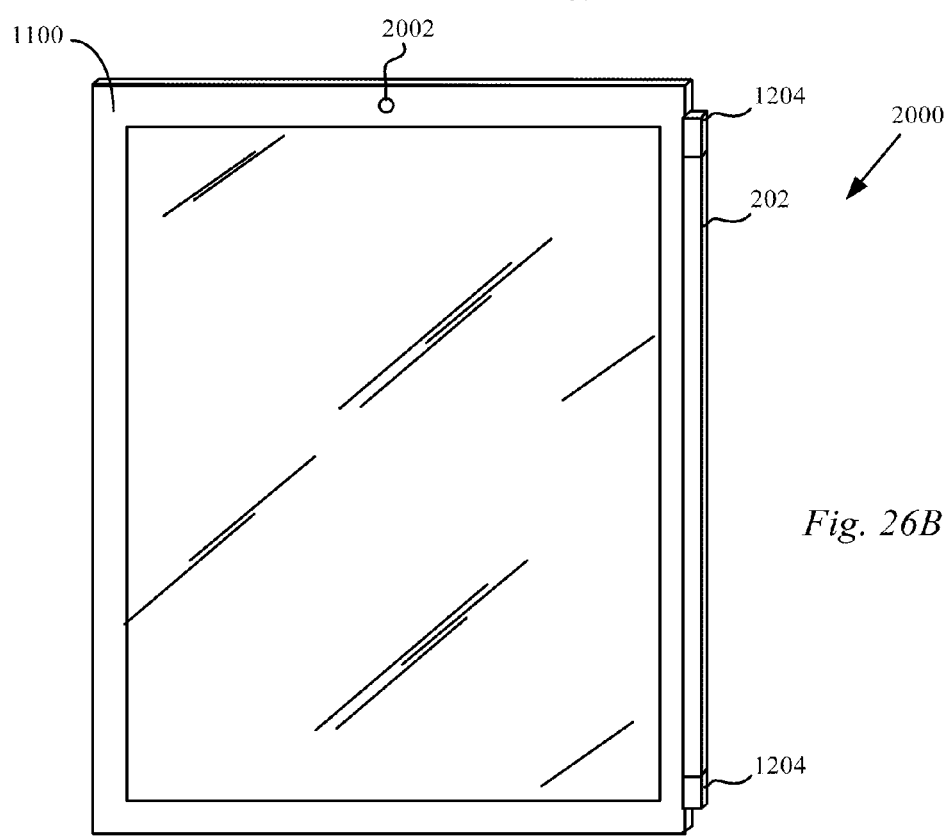

FIGS. 26A-26B show shows arrangement 2000 where triangular support structure 1700 can be used as a handle. Again by folding segmented cover assembly 1300 such that segmented portions interact with each other to form triangular support structure that can be used as a handle. As such, tablet device 1100 can be picked up as one would pick up a book for viewing. The body of segmented cover assembly 1300 can provide convenient grasping features that can be used to more firmly grasp triangular support structure 1700 when being used to hold tablet device 1100 as a book.

In those cases where tablet device 1100 includes image capture devices, such as a front facing camera 2002 and rear facing camera 2004, visual content can be presented by tablet device 1100. In this way, triangular support structure 1700 can be used as a holder along the lines of a camera handle. As such, triangular support structure 1700 can provide a convenient and effective mechanism for aiding in the image capture process. For example, when used to capture images, tablet device 1100 can be firmly held by way of triangular support structure 1700 and rear facing camera 2004 can be pointed at a subject. The image of the subject can then be presented by tablet device 1100 at the display shown in FIG. 25B. In this way, both front facing camera 2002 and/or rear facing camera 2204 can be used to capture still images or video such as in a video chat or simply view a video presentation. As part of a video chat, a visual chat participant can easily carry on a video conversation while using triangular support structure 1700 to hold tablet device 1100.

Figure 27A:
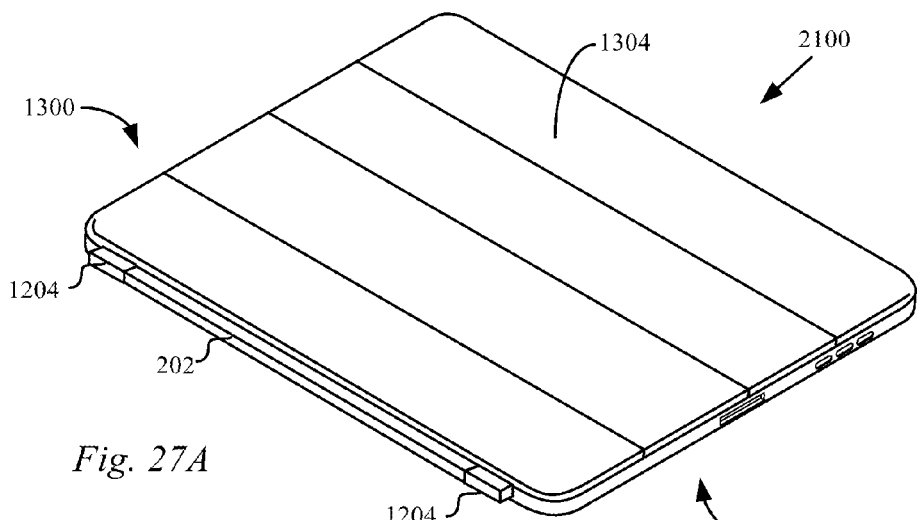
FIGS. 27A-27C show a cooperating system of a segmented cover and tablet device configured to activate only uncovered portions of a display in a peek mode.
Figure 27B:
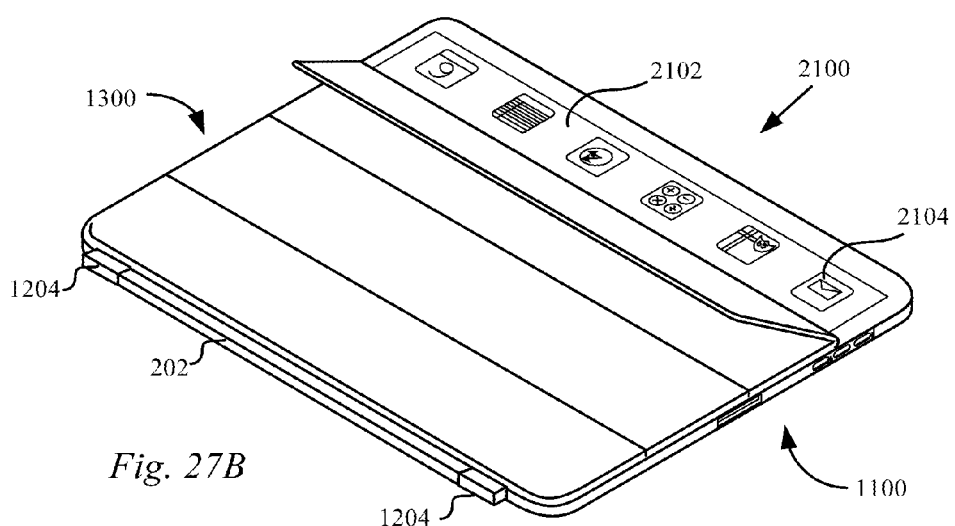
Figure 27C:
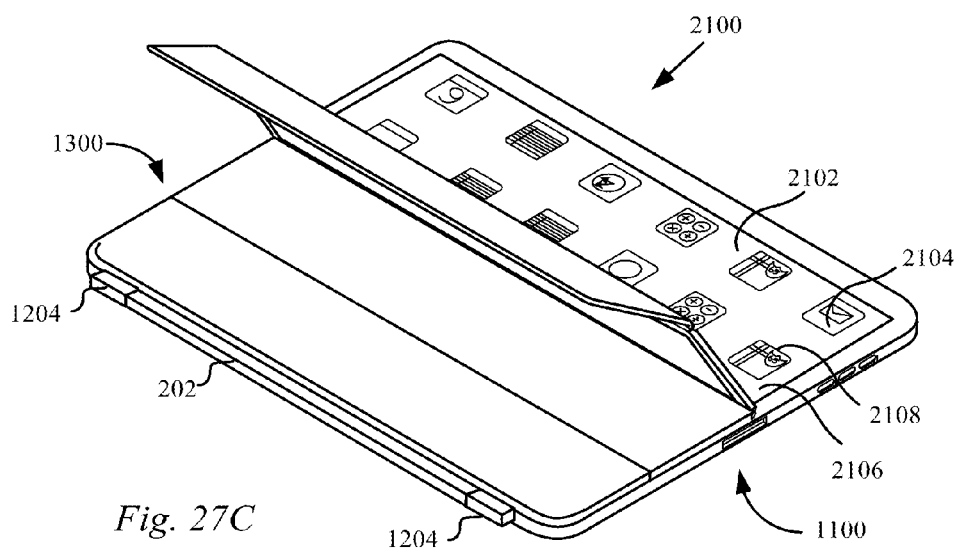

FIGS. 27A-27C show configuration 2100 of cover assembly 1300 and tablet device 1100 illustrating what is referred to as a peek mode of operation of tablet device 1100. More particularly, when segment 1304 is lifted from glass cover 1106, sensors in tablet device 1100 can detect that segment 1304 and only that segment has been lifted from glass layer 1106. Once detected, tablet device 1100 can activate only the exposed portion 2102 of the display. For example, tablet device 1100 can utilize a Hall Effect sensor to detect that segment 1304 has been lifted from glass cover 1106. Additional sensors, such as optical sensors can then detect if only segment 1304 has been lifted or if additional segments have been lifted.

As shown in FIG. 27B, when tablet device 1100 has determined that only segment 1304 has been lifted, then tablet device 1100 can change operating state to "peek" state in which only the exposed portion 2102 of the display actively presents visual content in the form of icons 2104. Hence, information in the form of visual content such as time of day, notes, and so forth can be presented for viewing on only that portion of display viewable. Once the sensors detect that segment 1304 has been placed back on glass layer 1106, tablet 1100 can return to the previous operational state such as a sleep state. Furthermore, in another embodiment, when an icon arranged to respond to a touch is displayed, then that portion of a touch sensitive layer corresponding to the visible portion of the display can also be activated.

Furthermore, as shown in FIG. 27C, when additional segments are lifted from cover glass 1106 to further expose second portion 2106 of cover glass 1106, second portion 2106 of the display can be activated. In this way, in the "extended" peek mode, additional visual information, such as icons 2108, can be presented in the portions of the display activated. It should be noted that as segments are lifted from cover glass 1106, additional segments of the display can be activated. In this way, an extended peek mode can be provided.

Alternatively, the tablet device 1100 can respond to the signals from the Hall Effect sensor(s) by simply powering up the display when the flap is moved away from the display and power down (sleep) when the display is covered by the flap. In one embodiment, a subset of magnetic elements 1322 can be used in conjunction with corresponding magnetic elements 402 in attachment feature 110 to secure cover assembly 1300 to tablet device 1100 on cover glass 1106. Furthermore, at least magnet 1326 can be used to activate magnetically sensitive circuit 404. For example, when segmented cover 1300 is placed upon tablet device 1100 at cover glass 1106, the magnetic field from magnet 1326 can be detected by magnetically sensitive circuit 404 that can take the form of a Hall Effect sensor. The detection of the magnetic field can cause Hall Effect sensor 118 to generate a signal that can result in a change in the operating state of tablet device 1100.

For example, when Hall Effect sensor 118 detects that segmented cover 1300 is in contact with cover glass 1106 indicating that the display is not viewable, then the signal sent by Hall Effect sensor 118 can be interpreted by a processor in tablet device 1100 to change the current operating state to sleep state. On the other hand, when segment 1304 is lifted from cover glass 1106, Hall Effect sensor 118 can respond to the removal of the magnetic field from magnetic 1326 by sending another signal to the processor. The processor can interpret this signal by again altering the current operating state. The altering can include changing the operating state from the sleep state to an active state. In another embodiment, the processor can interpret the signal sent by Hall Effect sensor 118 in conjunction with other sensors by altering the operating state of tablet device 1100 to a peek mode in which only that portion of the display exposed by the lifting of segment 1304 is activated and capable of displaying visual content and/or receiving (or sending) tactile inputs.

In some cases, when segment 1306 is lifted from cover glass 1106 at the same time that Hall Effect sensor 118 indicates that segment 1304 is also lifted, the presence of sensors in addition to Hall Effect sensor 118 can cause the processor to enter into an extended peek mode in which additional display resources corresponding to the additional exposed portion of the display are also activated. For example, if tablet device 1100 includes other sensors (such as optical sensors) that can detect the presence of a particular segment, then signals from Hall Effect sensor 118 in combination with other sensor signals can provide an indication to the processor that a particular portion or portions of the display assembly are currently viewable and can thus be enabled to present visual content.

Figure 28A:
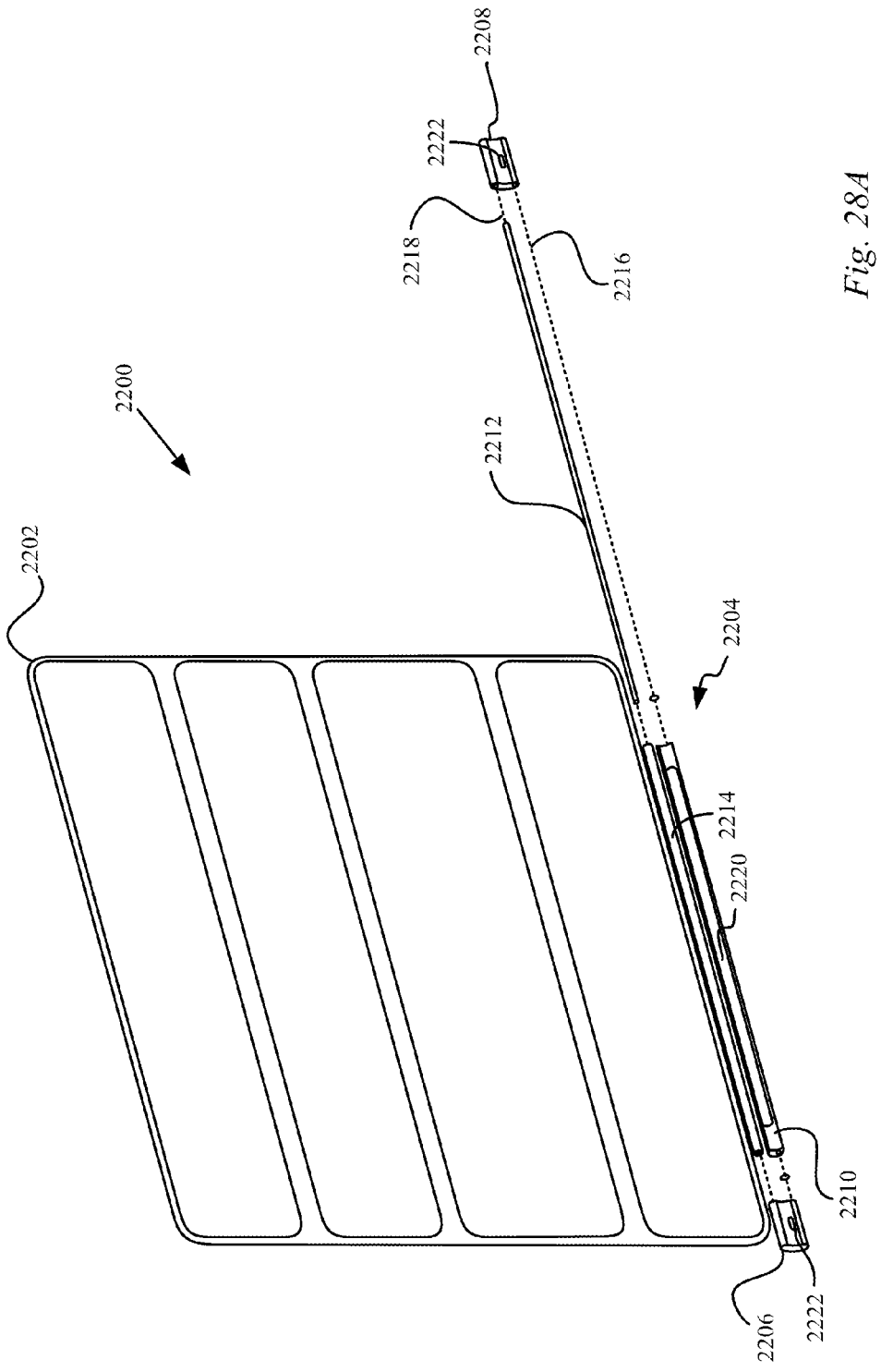
FIGS. 28A-28D show various exploded views of portions of a pivoting hinge assembly in accordance with the described embodiments.

FIG. 28A shows cover assembly 2200 in accordance with a particular embodiment. Cover assembly 2200 can include segmented cover 2202 attached to pivoting assembly 2204 shown in an exploded view. Pivoting assembly 2204 can include end lugs 2206 and 2208 pivotally connected to each other by way of hinge span 2210 and connecting rod 2212

(which can be enclosed within sleeve 2214 that can in turn be connected to or enclosed within segmented cover 2202 and not seen). In this way, at least two pivot lines 2216 and 2218 can be provided for pivotally moving end lugs 2206 and 2208, hinge span 2210 and connecting rod 2212. For example, hinge span 2210 (and end lugs 2206 and 2208) can rotate about pivot line 2216 whereas connecting rod 2212 (and end lugs 2206 and 2208) can rotate about pivot line 2218. It should be noted that connecting rod 2212 and hinge span 2210 can pivot independent of each other. The pivoting can occur at the same time or at different times giving pivoting assembly 2204 at least four independent directions of axial rotation.

In order to prevent metal on metal contact when hinge span 2210 is magnetically coupled to tablet 1100, label 2220 can be affixed to an external surface of hinge span 2210 and bumpers 2222 can be affixed to an external surface of end lugs 2206 and 2208. Label 2220 and bumper 2222 can be formed of material that can undergo repeated contact with housing 102 without marring or otherwise damaging the appearance of housing 102. Accordingly, label 2220 and bumpers 2222 can be formed of paper, cloth, plastic and adhered to hinge span 2210 and end lugs 2206 and 2208 using an adhesive such as glue. In some cases, the adhesive can have properties that allow for easy replacement of label 2220 and/or bumpers 2222 when needed.

Figure 28B:
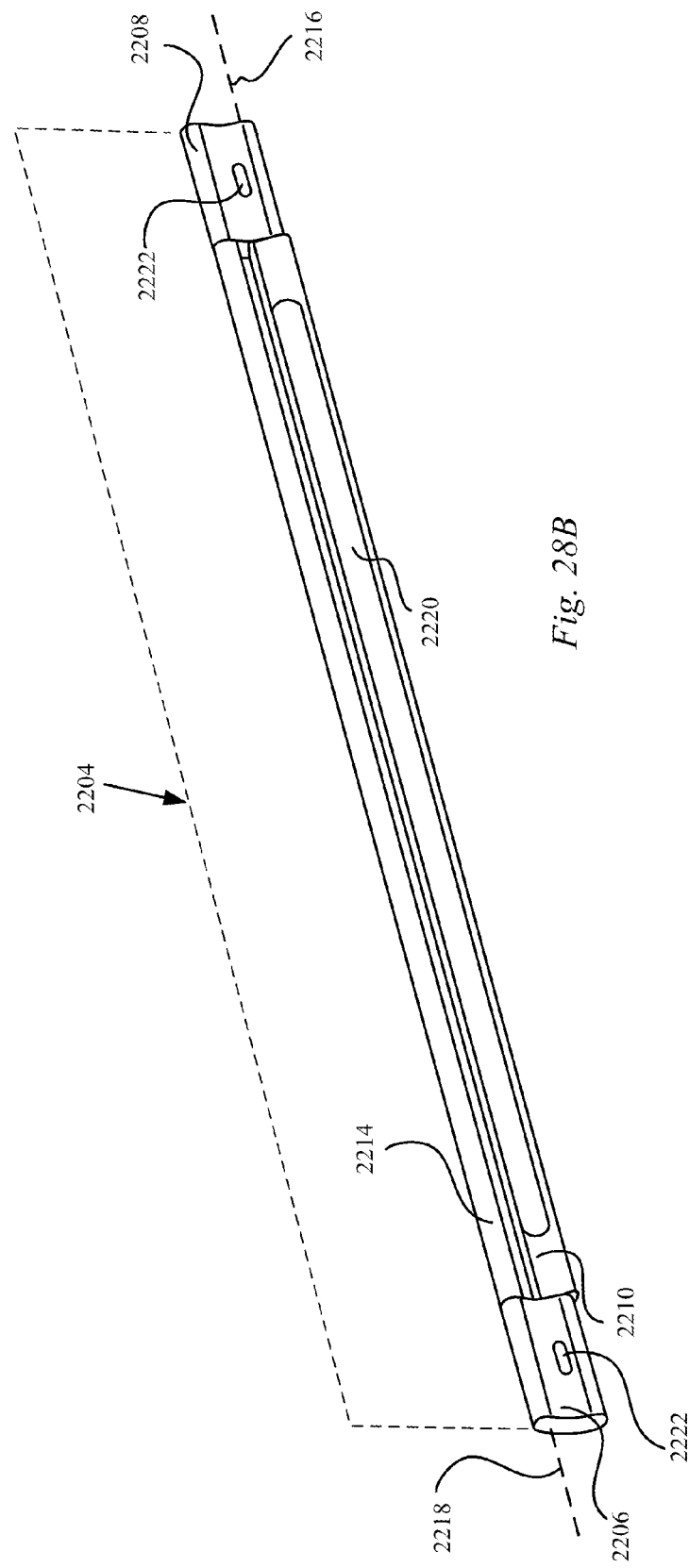

FIG. 28B shows an assembled embodiment of pivoting assembly 2204 showing pivot line 2216 about which end lugs 2206, 2208 and connecting rod 2212 (in sleeve 2214) can rotate in two axial directions (i.e., clockwise and counter-clockwise). It should be noted that end lugs 2206, 2208 and hinge span 2210 can rotate in two axial directions (i.e., clockwise and counter-clockwise) with respect to pivot line 2218. In this way, end lugs 2206 and 2208 can rotate about pivot line 2216 and pivot line 2218 with a total of four axial directions.

Figure 28C:
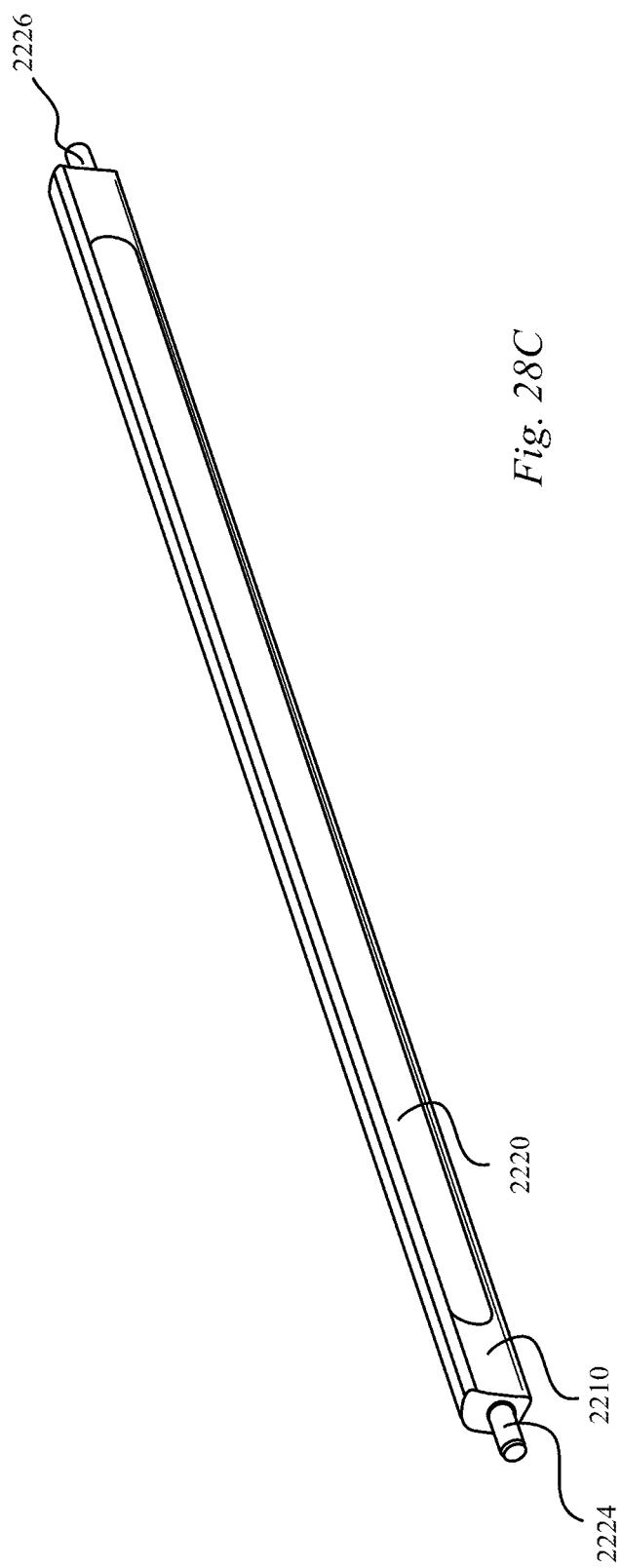

FIG. 28C shows hinge span 2210 illustrating in more detail end pins 2224 and 2226 that can be used to mount hinge span 2210 into end lug 2206 and end lug 2208, respectively. Although not viewable in this figure, end pins 2224 and 2226 can further be used in conjunction with internal plugs to secure end unit magnetic elements incorporated within hinge span 2210. This is particularly useful in those situations where the coded magnetic sequence of the magnetic elements incorporated within hinge span 2210 causes the end unit magnetic elements to magnetically repel an adjacent neighbor magnetic element.

Figure 28D:
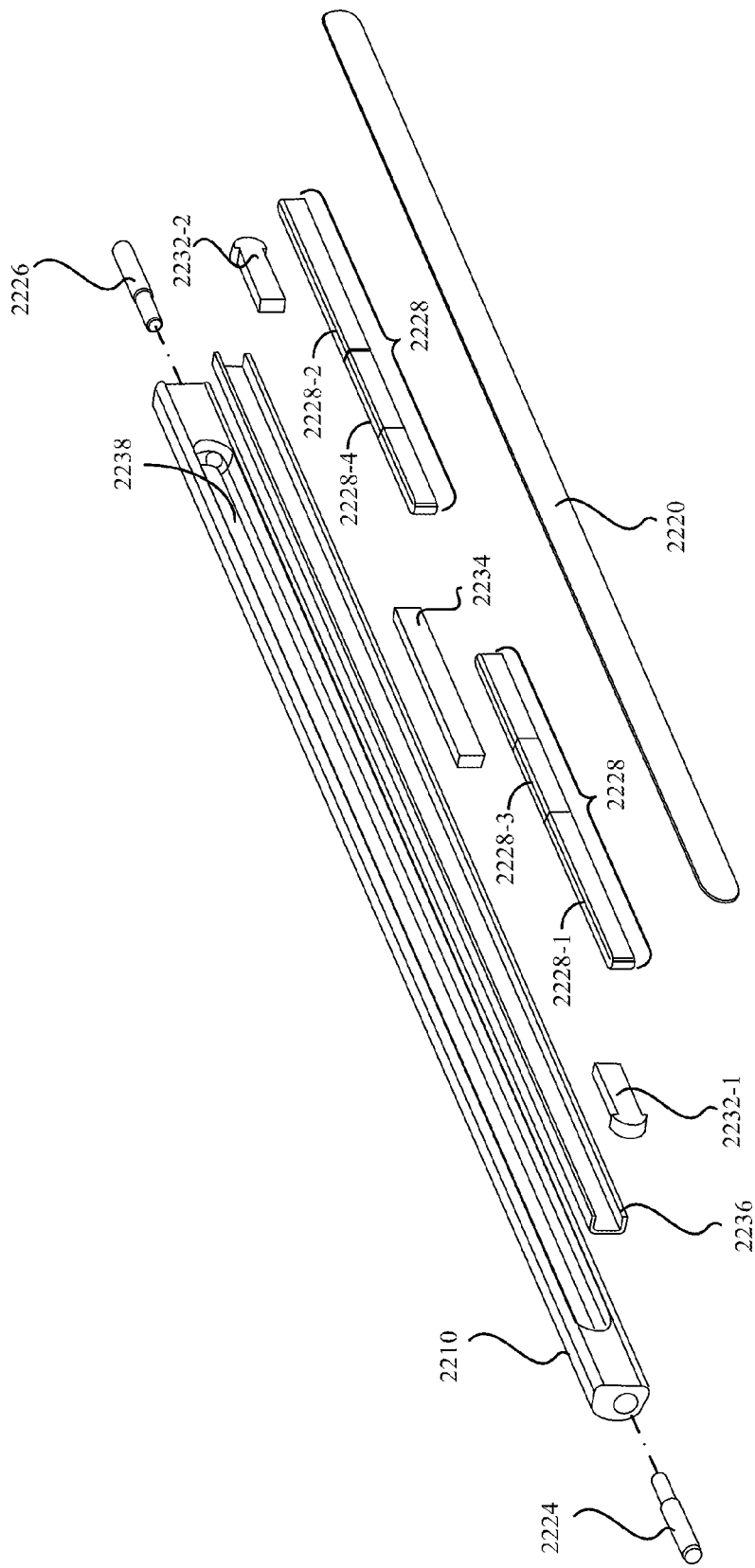

FIG. 28D shows an exploded view of hinge span 2210 in accordance with the described embodiments. Magnetic elements 2228 can be configured as a coded magnetic structure in which individual magnetic elements can be arranged in a specific pattern of magnetic polarity, strength, size and so forth. In the embodiment shown, those magnets next to each other having anti-aligned polarity can rely upon their mutual magnetic attraction to maintain their position with the coded magnetic structure. However, magnetic elements placed next to each other having aligned magnetic polarity can require an external force to overcome the mutual magnetic repulsive force in order to maintain their position within the coded magnetic structure. For example, magnetic element 2228-1 and 2228-2 can each be formed of two magnets having aligned magnetic poles. In this situation, each of the two magnets that form magnetic element 2228-1 (and 2228-2), for example, will have magnetic poles that are aligned and therefore will generate a net magnetic repulsive force between them. Therefore, an externally applied constraint can be applied using, for example, plugs 2232-1 and 2232-2, respectively. The magnetic attractive force provided by magnets 2228-3 and 2228-4 (that are anti-aligned with respect to magnets 2228-1 and 2228-2, respectively) can help in stabilizing the coded magnetic structure enclosed within hinge span 2210. Spacer 2234 formed of magnetically inert material can be used to provide additional physical integrity to the coded magnetic structure formed by magnetic elements 2228.

In order to improve an overall net magnetic attractive force, magnetic shunt 2236 formed of magnetically active material such as steel, can be adhesively attached to a back end of magnetic elements 2228. The back end placement of shunt 2236 can help to re-direct magnetic field lines that would otherwise propagate away from the engagement surface between hinge span 2210 and housing 1102. By deflecting the magnetic field lines back towards the engagement surface, the magnetic flux density provided by magnetic elements 2228 at the engagement surface can be commensurably increased resulting in an increased net magnetic attractive force between magnetic elements 2228 and the corresponding magnetic components within housing 1102.

As discussed previously, label 2220 can be adhesively attached to magnetic elements 2228 (and spacer 2234, if present) which can, in turn, be adhesively attached to magnetic shunt 2236. Magnetic shunt 2236 can be adhesively attached to opening 2238 in hinge span 2210 leaving label 2220 proud by about a distance "d" which can be on the order of about 0.1-0.2 mm preventing metal to metal contact between hinge span 2210 and housing 1102.

It should be noted that in the keyboard arrangement and display arrangement, hinge span 2210 can experience a shearing force due to the placement of tablet device 1100 on a supporting surface at an angle. The shearing force can be resisted by the net magnetic attractive force generated between hinge span 2210 and the device attachment feature tablet device 1100.

Figure 29:
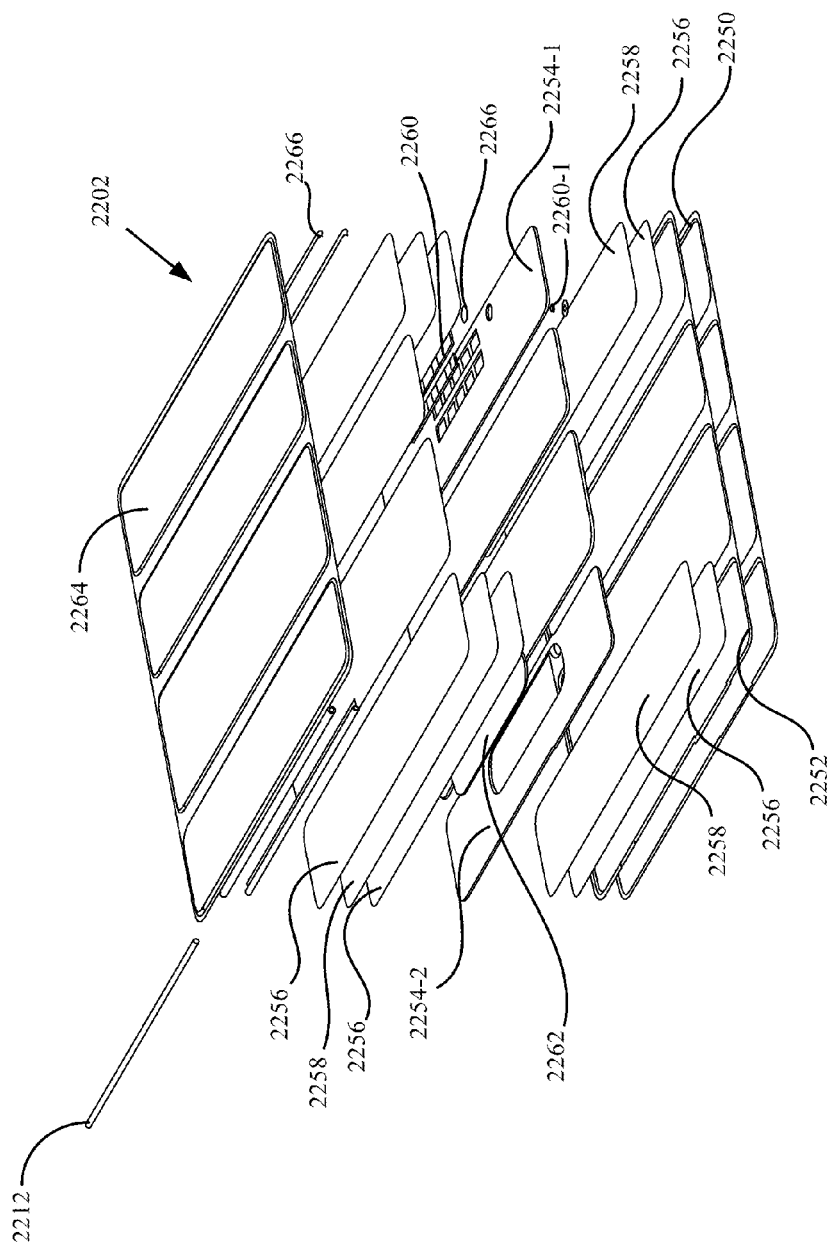
FIG. 29 shows an exploded view of a top cover assembly in accordance with the described embodiments.

FIG. 29 shows an exploded view of segmented cover 2202. Bottom layer 2250 can come in direct contact with a protected surface such as a cover glass for a display. Bottom layer 2250 can be formed of a material that can passively clean the protected surface. The material can be, for example, a microfiber material. Bottom layer 2250 can be attached to stiffening layer 2252 formed of resilient material such as plastic. Stiffening layer 2252 can, in turn, be adhesively attached to inserts 2254 to form a laminate structure including adhesive layer 2256, laminate material 2258 and insert 2254. Some of inserts 2254 can accommodate embedded components. For example, insert 2254-1 can accommodate magnets 2260 some of which can cooperate with corresponding attachment feature 110 embedded in tablet device 1100 for securing segmented cover 2202 to tablet device 1100. At least one magnet 2260-1 can be positioned and sized to interact with a magnetically sensitive circuit (such as a Hall Effect sensor) incorporated within tablet device 1100. It should be noted that whereas some of magnets 2260 are specifically allocated to interact only with attachment feature 110, substantially all of magnets 2260 can magnetically interact with magnetically active plate 2262 embedded in segment 2254-2 used to form various triangular support structures. In this way, a strong magnetic force can be generated providing a stable foundation for the triangular support structure.

An additional laminate structure can be formed of adhesive layer(s) 2256, laminate material 2258 and top layer 2264. In some embodiments, an intervening layer of material can be provided having a knitted structure that can aid in the attachment of top layer 2264. Top layer 2264 can be formed of many materials such as plastic, leather, and so forth in keeping with the overall look and feel of tablet device 1100. In order to provide additional structural support, top layer 2264 can have edges reinforced by reinforcement bars 2266 that can be formed of plastic or other rigid or semi-rigid material.

Figure 30:
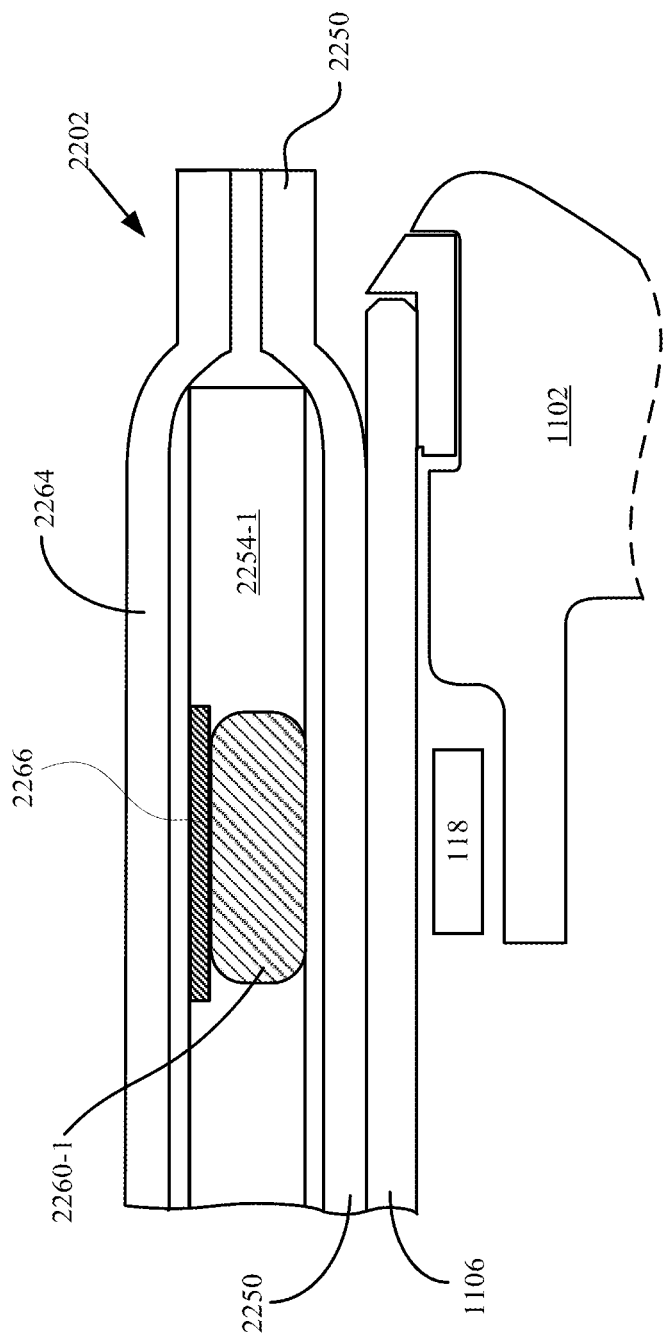
FIG. 30 is a cross sectional view of the top cover assembly shown in FIG. 29 in place upon a tablet device highlighting the relationship between an embedded magnet in the top cover assembly and a magnetically sensitive circuit in the tablet device.

FIG. 30 shows a partial cross sectional view of segmented cover 2200 shown in FIG. 29 placed in position upon cover layer 1106 of tablet device 1100. Of particular note is the relative positioning of magnet 2260-1 and Hall Effect sensor 118. In this way, when segmented cover 2200 is placed upon cover layer 1106, the magnetic field from magnet 2260-1 can interact with Hall Effect sensor 118 that can respond by generating a signal. The signal can, in turn, be processed in such a way that the operating state of tablet device 1100 can change in accordance with the presence of cover 2200. On the other hand, the removal of cover 2200 can cause the operating state to revert to the previous operating state, or another operating state such as peek mode. It should be noted that the magnetic field density between magnetic element 2260-1 and Hall Effect sensor 118 can be on the order of about 500 gauss. However, in those embodiments where cover 2202 is flipped over to the back of housing 1102, the magnetic flux density at Hall Effect sensor 118 can be on the order of about 5 Gauss.

Figure 31A:
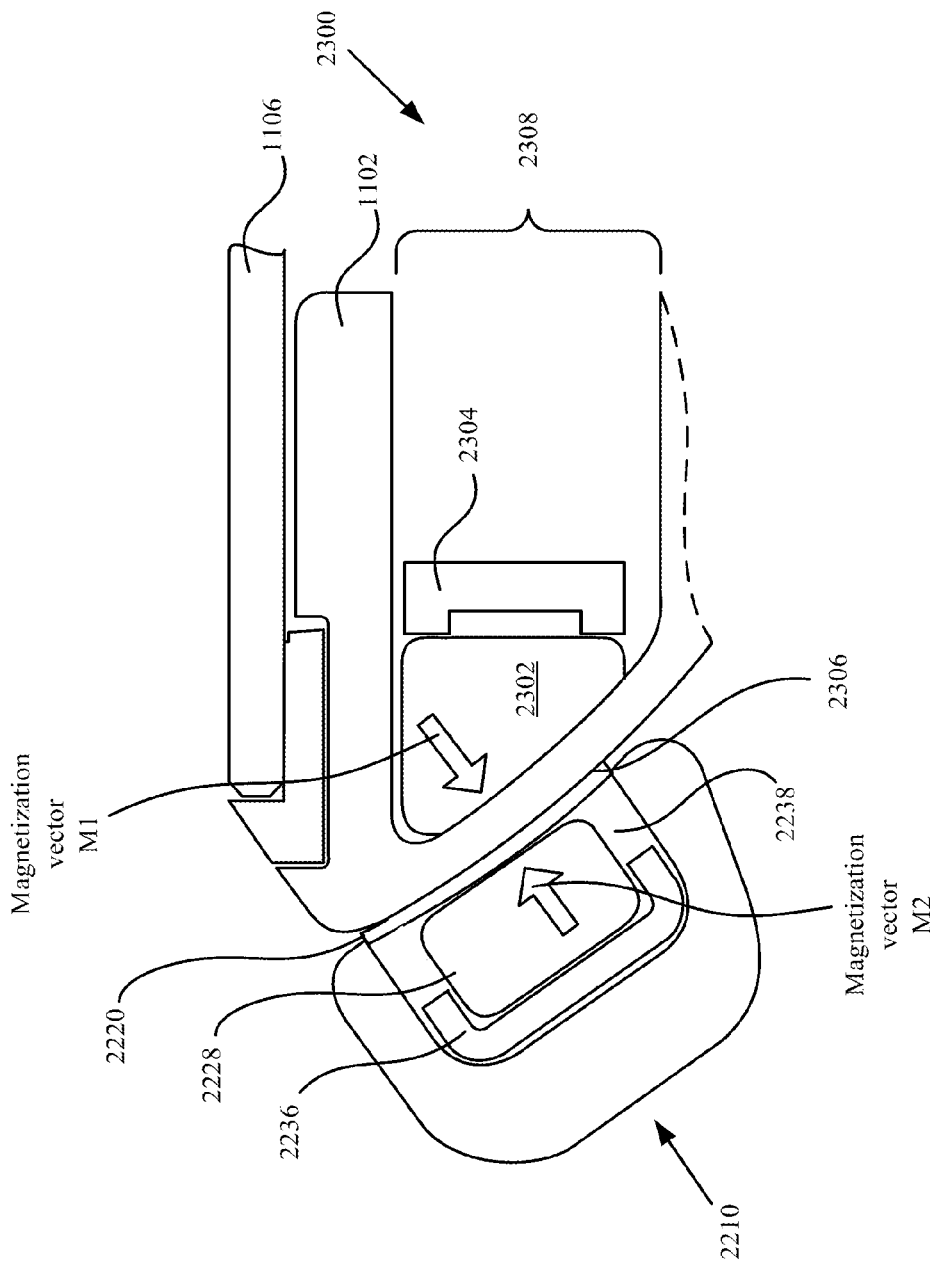
FIG. 31A shows a cross sectional view of a hinge span magnetically engaged with a corresponding device attachment feature in an active state in accordance with the described embodiments.

FIG. 31A shows cross sectional view of hinge span 2210 in active engagement with device attachment feature 2300 incorporated into tablet device 1100. In particular, magnetic attachment feature 2300 includes at least magnetic element 2302 forming a magnetic circuit with magnetic element 2228 (which is part of the coded magnetic structure incorporated into hinge span 2210). Magnetic shunt 2304 can be used to re-direct magnetic field lines that propagate from magnetic element 2302 in a direction other than that of magnetic element 2228. In this way, the magnetic flux density at engagement surface 2306 can be commensurably increased thereby increasing net magnetic attractive force $F_{net}$. Magnetic attachment feature 2300 can be incorporated into barrel 2308 in housing 1102 sized to accommodate both magnetic element 2302 and shunt 2304. In the described embodiment, barrel 2308 can provide support for magnetic element 2302 and shunt 2304. Barrel 2308 can also direct the motion of magnetic element 2302 and shunt 2304 when magnetic attachment feature 2300 transitions between the active state and the inactive states.

In order to ensure that net attractive force $F_{NET}$ is applied substantially normal to engagement surface 2306, the magnetization of magnetic element 2228 and magnet element 2302 can be configured such that their respective magnetization vectors M substantially align. By magnetization it is meant that the magnets can be manufactured having magnetic domains that are substantially aligned in the same direction. By aligning the magnetization vectors $M_1$ and $M_2$ of magnetic element 2302 and magnetic element 2228, respectively, net magnetic force $F_{NET}$ can be generated substantially normal to engagement surface 2306.

Figure 31B:
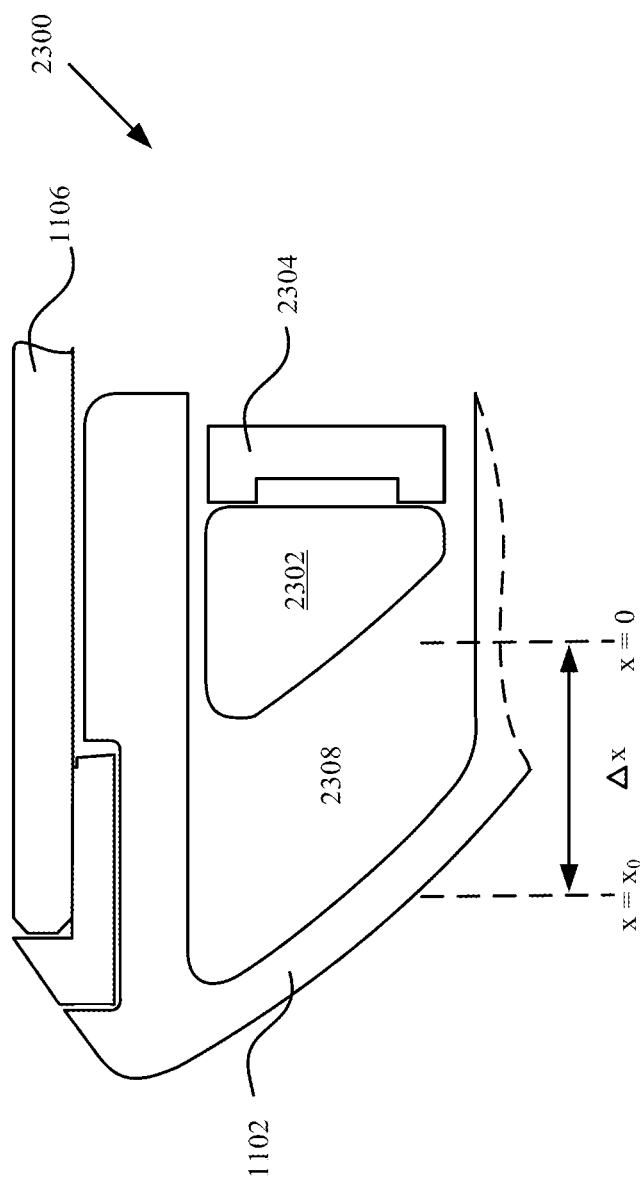
FIG. 31B shows a cross sectional view of the device attachment feature of FIG. 31A in an inactive state.

FIG. 31B shows magnetic attachment feature 2300 in an inactive state. When in the inactive state, magnetic attachment feature 2300 is located at least distance $x_0$ from exterior surface of housing 1102 in order to satisfy Eq. (1). Therefore, barrel 2308 must be able to accommodate the movement of magnetic element 2302 and shunt 2304 from x=0 in the inactive state to about $x=x_0$ in the active state.

Figure 32:
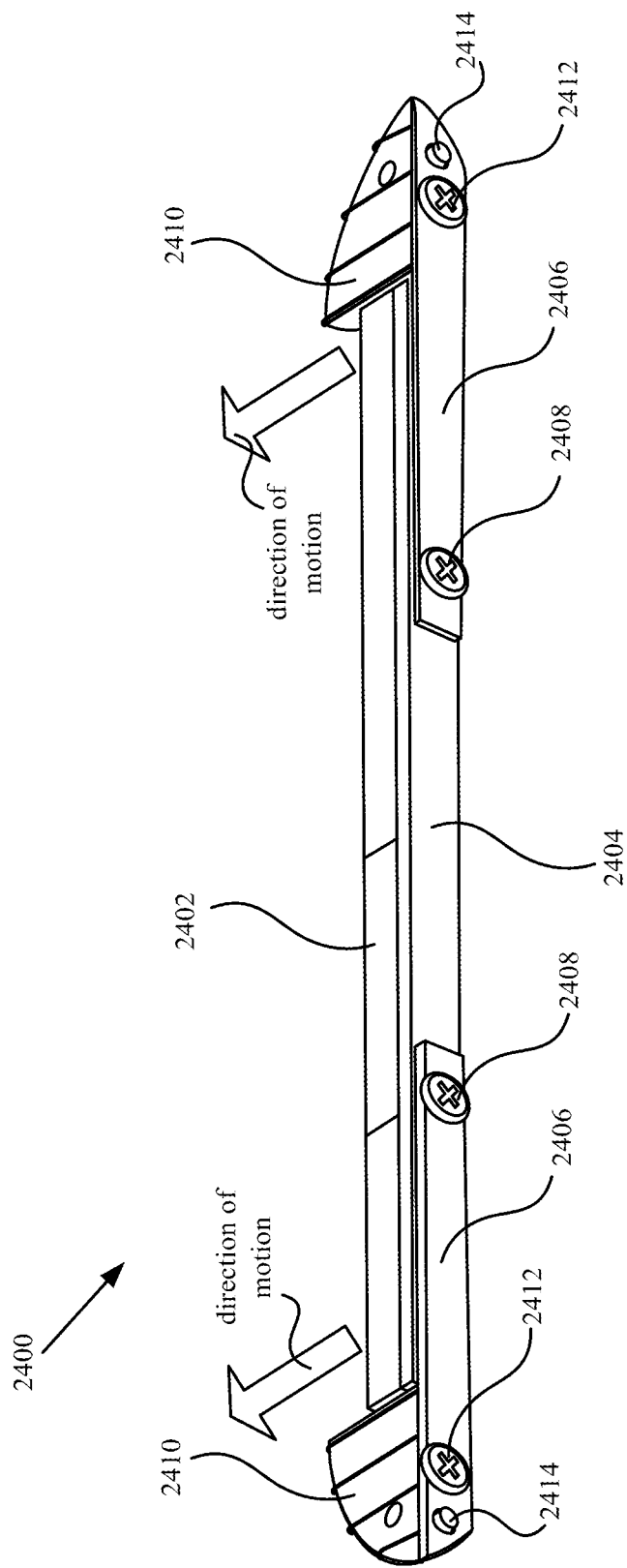
FIGS. 32-33 shows perspective views of a device attachment feature incorporating a leaf spring as a retaining mechanism in accordance with the described embodiments.
Figure 33:
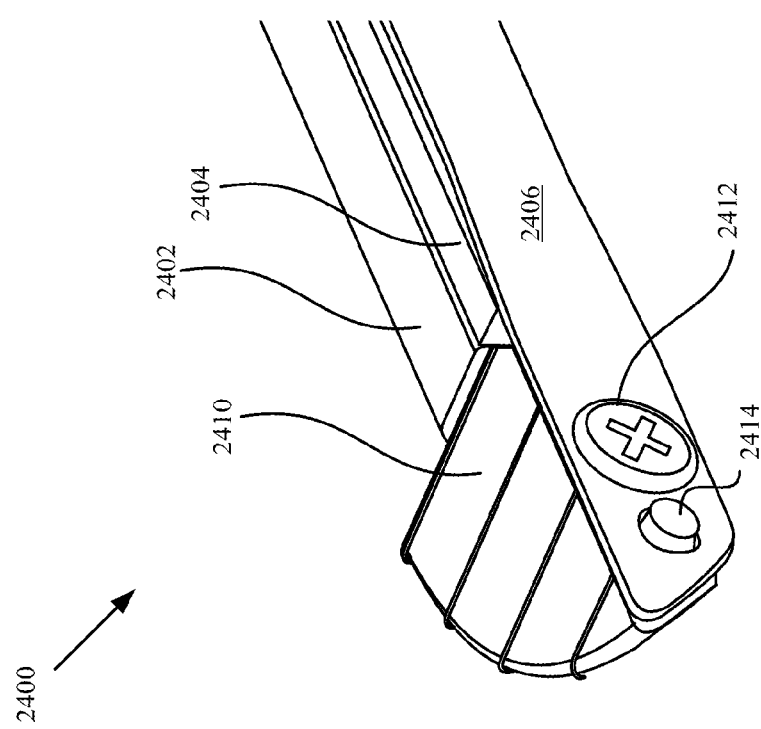

FIG. 32 shows a representation of an embodiment of device attachment feature 108 in the form of attachment feature 2400. In particular, attachment 2400 can include magnetic elements 2402/shunt 2404 in attached to leaf spring 2406. Leaf spring 2406 can be secured directly to shunt 2404 by way of fasteners 2408 and end supports 2410 by way of fasteners 2412. End supports 2410 can be attached to a support structure such as a housing to provide support for attachment feature 2400. In one embodiment, alignment posts 2414 can be used during assembly to provide alignment for both end supports 2410 and leaf spring 2406. FIG. 33 shows a close up view of the support structure 2410/leaf spring 2406 interface.

Figure 34:
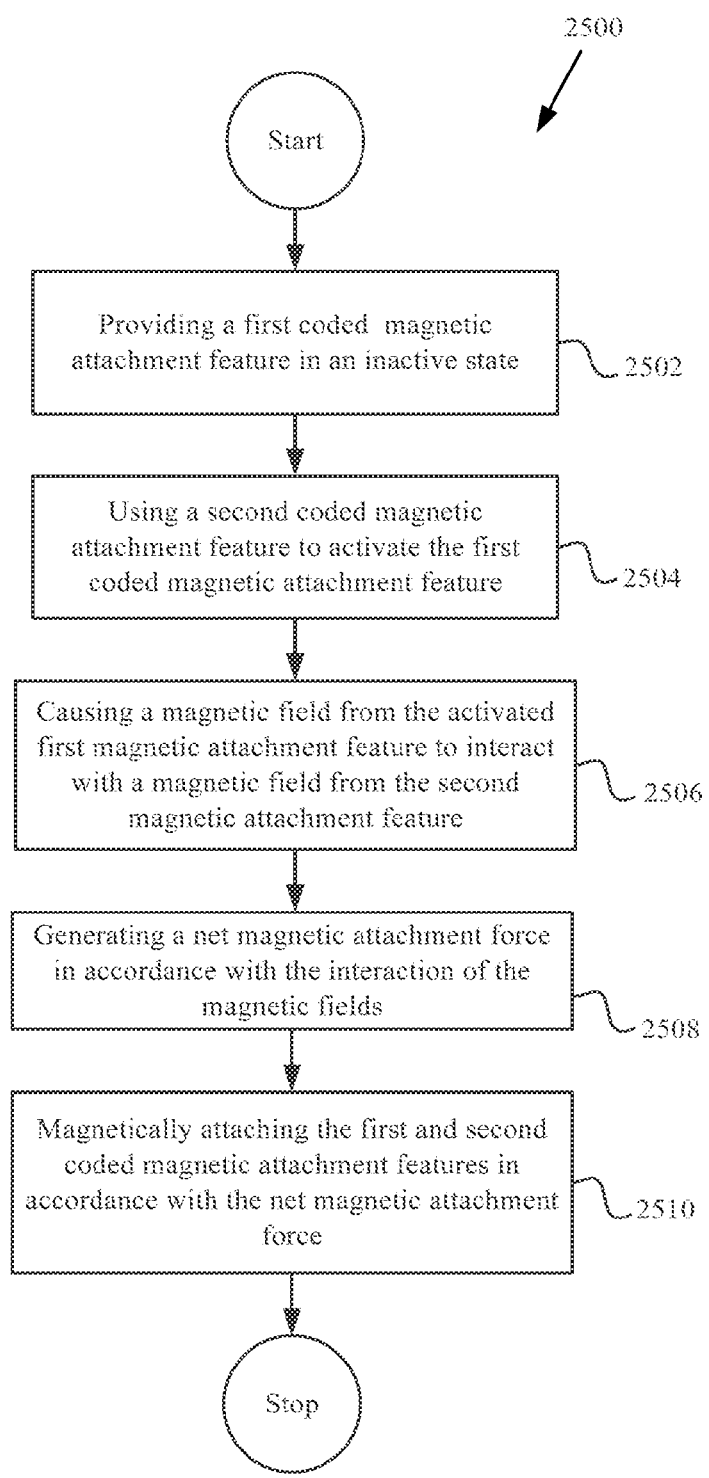
FIG. 34 shows a flowchart detailing a process of magnetic attachment in accordance with the described embodiments.

FIG. 34 shows a flowchart detailing a process 2500 in accordance with the described embodiments. The process can begin at 2502 by providing a first coded magnetic attachment feature in an inactive state. At 2504, using a second magnetic attachment feature to activate the first coded first magnetic attachment feature. At 2506, causing a magnetic field from the activated first magnetic attachment feature to interact with a magnetic field from the second magnetic attachment feature. At 2508, generating a net magnetic attachment force in accordance with the interaction of the magnetic fields. At 2510, magnetically binding the first and second magnetic attachment features in accordance with the net magnetic attachment force.

Figure 35:
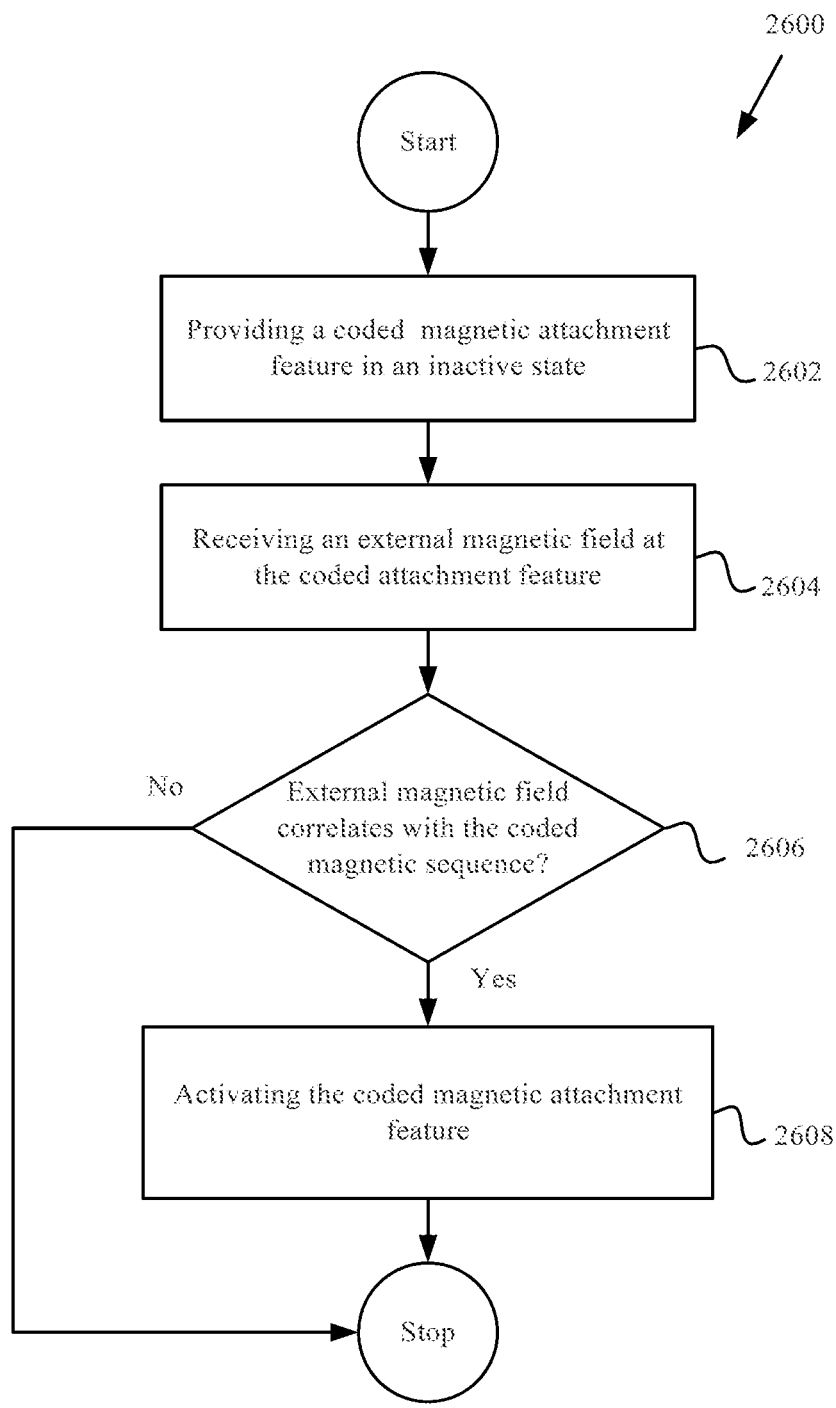
FIG. 35 shows a flowchart detailing a process for activating a coded magnetic attachment feature in accordance with the described embodiments.

FIG. 35 shows a flowchart detailing process 2600 in accordance with the described embodiments. Process 2600 can begin at 2602 by providing a coded magnetic attachment feature in an inactive state. In the inactive state, magnetic flux density at a pre-determined distance for magnetic elements in the coded magnetic attachment feature is less than a threshold value. At 2604, an external magnetic field is received at the coded magnetic attachment feature. At 2606, if it is determined that the external magnetic field corresponds to magnetic elements that correlate with the magnetic elements in the coded magnetic attachment feature, then at 2608, the coded magnetic attachment feature is activated, otherwise, process 2600 ends.

Figure 36:
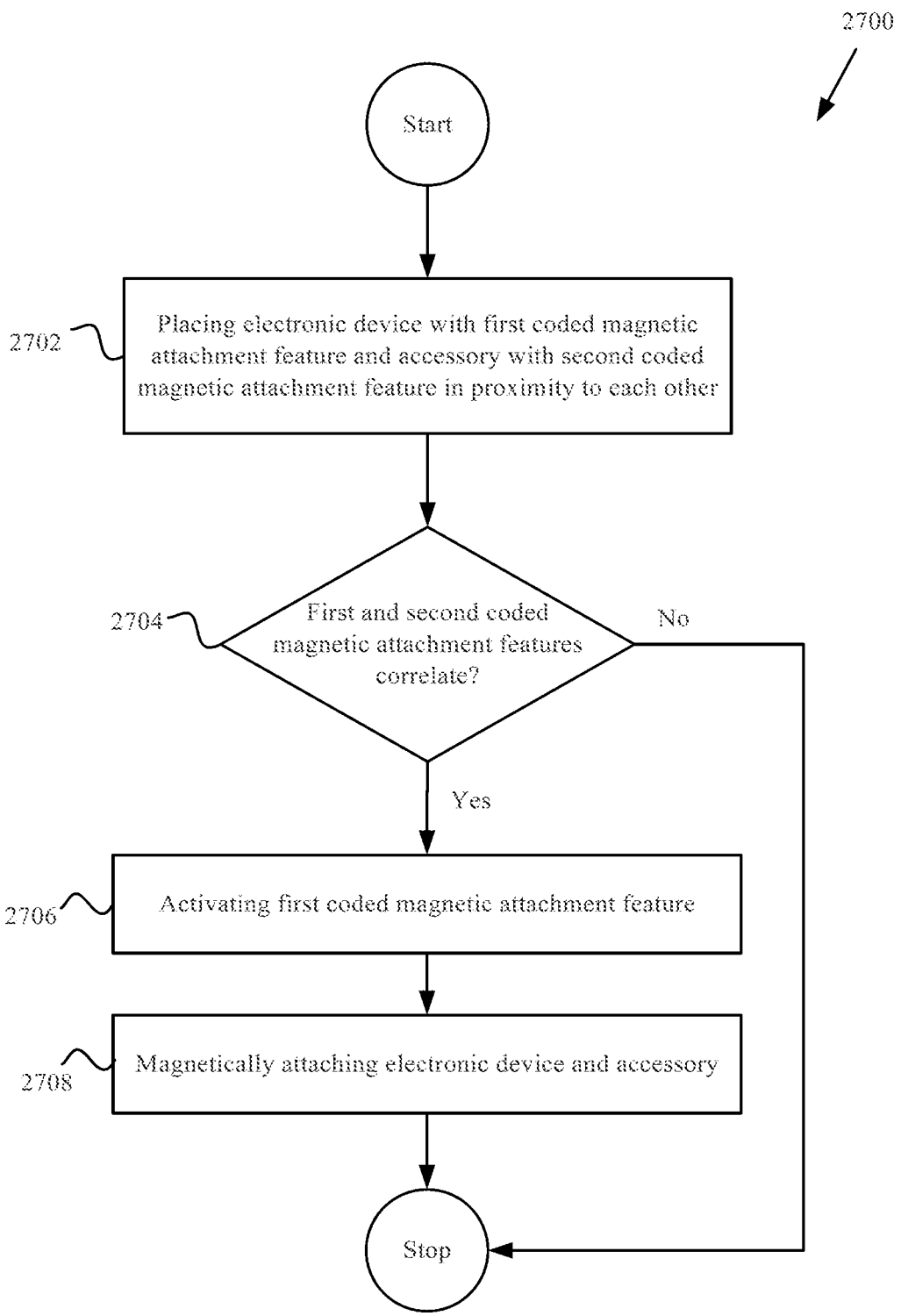
FIG. 36 shows a flowchart detailing a process for forming initiating a magnetic attachment in accordance with the described embodiments.

FIG. 36 shows a flowchart detailing process 2700 in accordance with the described embodiments. Process 2700 can begin at 2702 by placing an electronic device having a first and an accessory having second coded magnetic attachment features in proximity to each other. At 2704, if the magnetic elements in the first and second coded magnetic attachment features correlate with each other, then at 2706, the first coded magnetic attachment feature is activated. When the first coded magnetic attachment feature is activated, then a magnetic flux density of a magnetic field generated by the first coded magnetic attachment feature increases to a value above a threshold. The magnetic field interaction between the magnetic elements in the first and second magnetic attachment features cause the electronic device and accessory to magnetically attach to each other at 2708.

Figure 37:
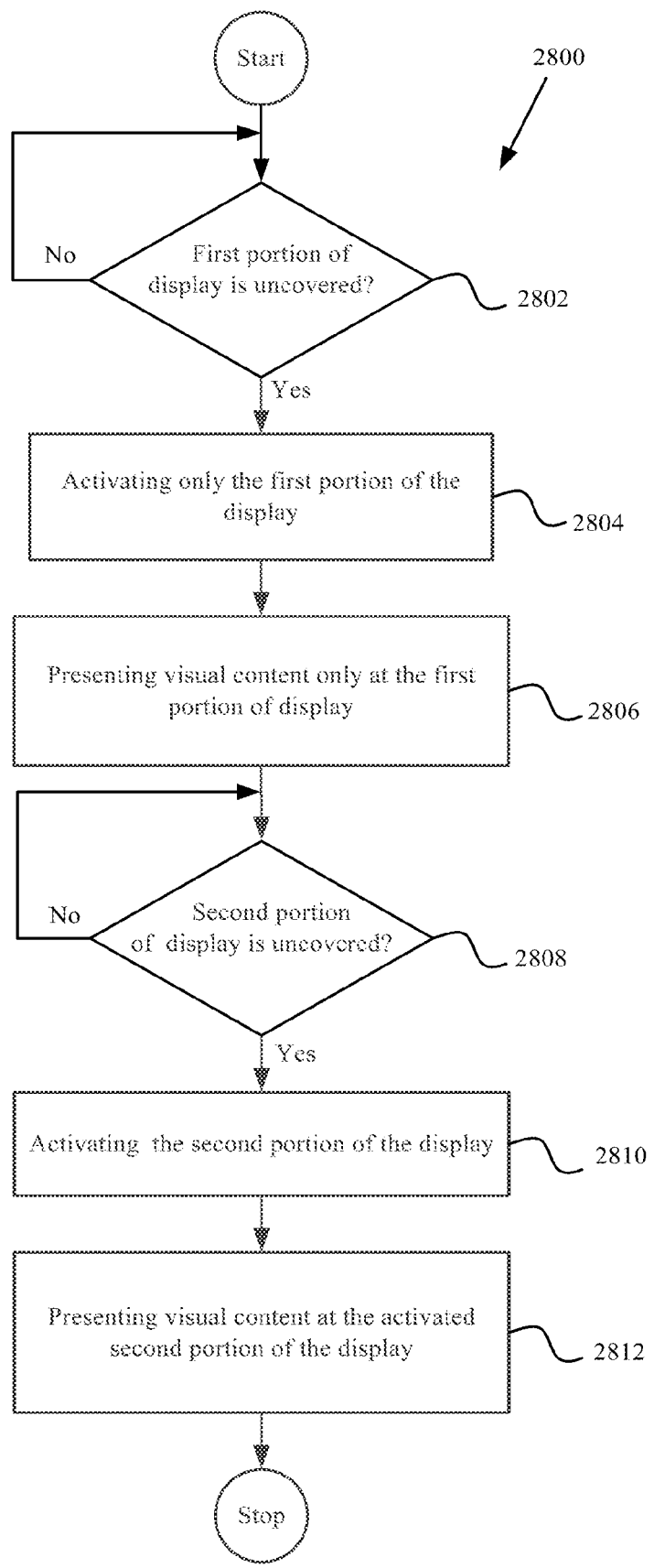
FIG. 37 shows a flowchart detailing a process for a peek mode operation in accordance with the described embodiments.

FIG. 37 shows a flowchart detailing a peek mode process 2800 in accordance with the described embodiments. Process 2800 can begin at 2802 by determining if a first portion of a display is uncovered. By uncovered it is meant that visual content presented at the first portion can be viewed. When it is determined that the first portion of the display is uncovered, then at 2804, only that portion of the display that is determined to be uncovered can present visual content. In other words, a set of icons or other visual content can be displayed in the uncovered portion of the display, where the remainder of the display can remain blank or off. Next at 2806, visual content is displayed by the activated portion of the display. Next at 2808, a determination is made if a second portion of the display is uncovered, the second portion being different than the first portion. When it is determined that the second portion of the display is uncovered, then a second portion of the display is activated at 2810. Visual content is then displayed at the second activated portion at 2812.

Figure 38:
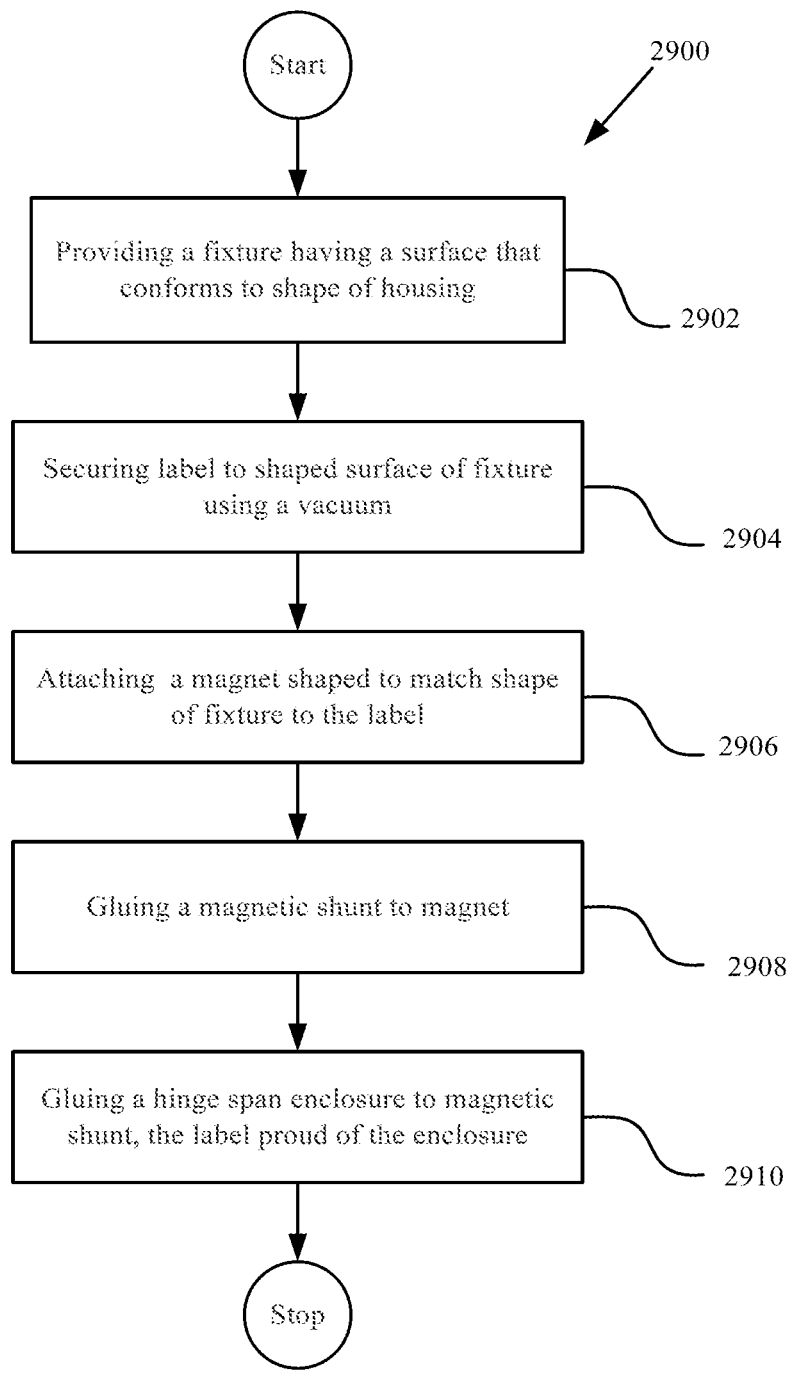
FIG. 38 shows a flowchart detailing a process for assembly of a hinge span in accordance with the described embodiments.

FIG. 38 shows a flowchart detailing process 2900 for forming a magnetic stack incorporated into hinge span 1340 in accordance with the described embodiments. Process 2900 for forming the magnetic stack incorporated into hinge span

1340 can begin at 2902 by providing a fixture. The fixture having a shape in accordance with an exterior shape of the housing that defines the electronic device upon which the hinge span will magnetically attach. The fixture can also be connected to a vacuum source that can be used to subsequently secure a protective film at 2904. The protective film can be used to provide protection against metal to metal contact between the hinge span and the housing of the electronic device. The protective film (also referred to as a label) can be formed of resilient material and have a length consistent with that of the hinge span. Once the label has been secured to the fixture using the vacuum, the label conforms to the contour of the fixture, and thus the shape of the housing of the electronic device.

At 2906, a magnet is attached to the label at a first surface shaped to conform to the fixture (and the housing). In one embodiment, the label and magnet can be glued to each other using adhesive. In another embodiment, the label can have an adhesive inner layer impregnated with glue that can attach the label to the magnet upon curing. At 2908, a magnetic shunt is glued to the magnet and label assembly. The magnetic shunt can be formed of magnetically active material such as steel. The magnetic shunt can interact with those magnetic field lines from the magnet initially directed away from the engagement surface between the housing and the hinge span. The magnetic shunt can interact with the magnetic field lines by re-directing at least some of the magnetic field lines in a direction towards the magnet and the engagement surface. The re-directed magnetic field lines can increase the magnetic flux density at the engagement surface thereby increasing the net attractive magnetic force between magnetic elements in the electronic device and the hinge span.

At 2910, a hinge span enclosure can be glued to the magnetic shunt. The hinge span enclosure can be used to support and protect the magnetic elements used to magnetically attach the hinge span to the electronic device. It should be noted that the after the attachment of the hinge span enclosure, the label is proud of the hinge span enclosure by which it is meant that the label protrudes a distance "d" from the hinge span enclosure. In this way, there is no contact between the metal hinge span enclosure and the metal housing of the electronic device.

Figure 39:
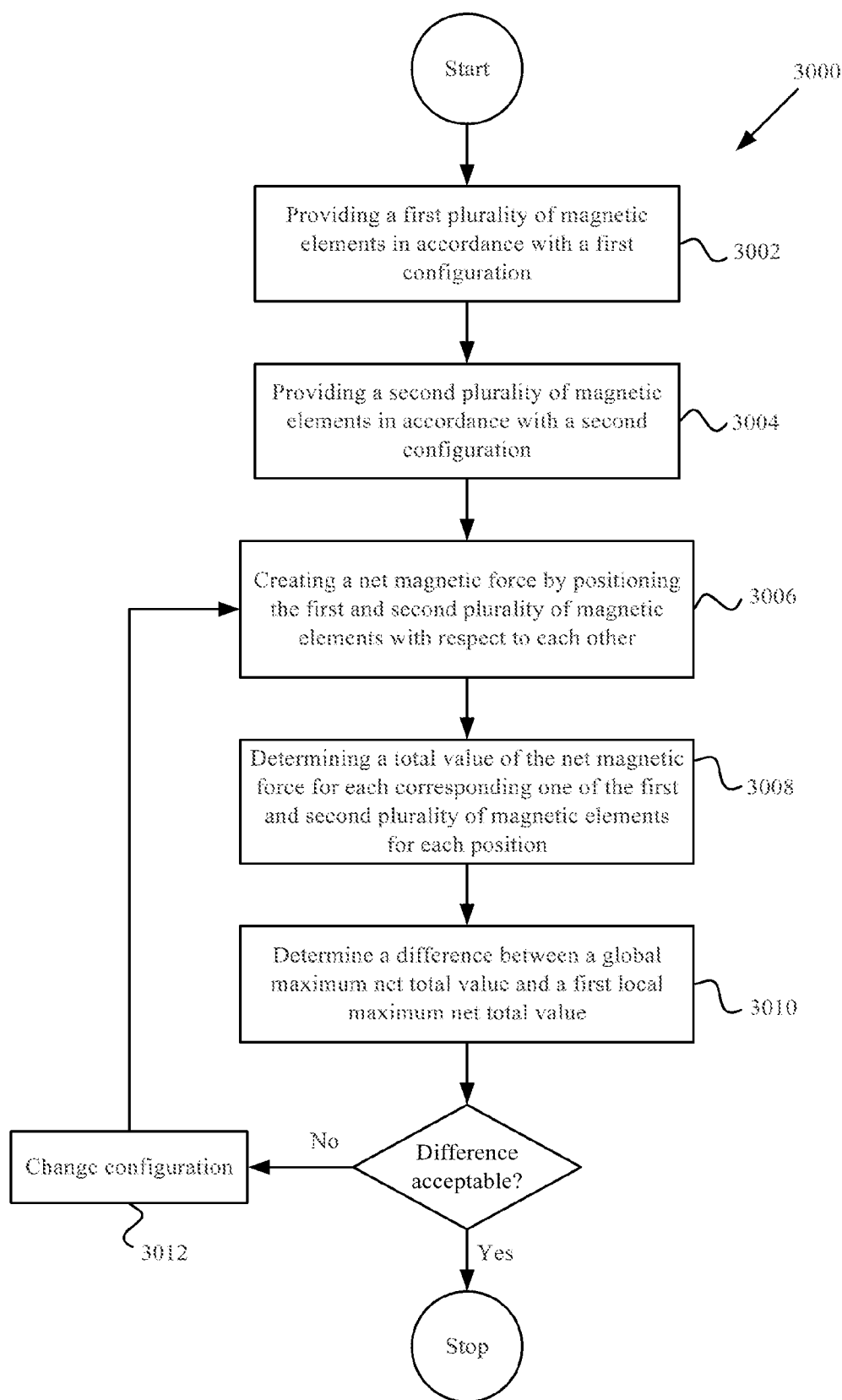
FIG. 39 shows a flowchart detailing process for determining a configuration of magnetic elements in a magnetic stack used in a magnetic attachment system in accordance with the described embodiments.

FIG. 39 shows a flowchart detailing process 3000 for determining a configuration of magnetic elements in a magnetic stack used in a magnetic attachment system in accordance with the described embodiments. Process 3000 begins at 3002 by providing a first plurality of magnetic elements in accordance with a first configuration. At 3004, a second plurality of magnetic elements in accordance with a second configuration is provided. By first and second configuration, what is meant is that the first and second plurality of magnetic elements can be arranged in any manner deemed appropriate. For example, the first and second configuration can relate to a physical size, a magnetic polarity, a magnetic strength, a relative position with respect to other magnetic elements, and so on. Next, at 3006, a net magnetic force is created in one embodiment by positioning each of the first and second plurality of magnetic elements with respect to each other. In so doing, those corresponding magnetic elements having the same polarity will generate a negative (repulsive) magnetic force whereas those corresponding magnetic elements having opposite polarities will generate a positive (attractive) magnetic force. At 3008, a total value of the net magnetic force for each of the corresponding one of the first and second plurality of magnetic elements is determined. As mentioned above, since some magnetic elements can generate a negative magnetic force whereas others a positive magnetic force for the same position, the total value of the net magnetic force can be either positive, negative, or zero (indicating the positive and negative magnetic forces cancel each other out to give no overall net magnetic force).

At 3010, a difference between a global maximum net total magnetic force and first local maximum net total magnetic force is determined. For example, as shown in FIG. 13, the global maximum corresponds with a total net magnetic force of about 8A ("A" being a unit magnetic attractive force where "8A" is equivalent to "+8" where "+" indicates attractive force). Moreover, a first local maximum net total value is about 4A and a second local maximum net total value is about 1A. In order to avoid a "false activation" that can result in a weak magnetic attraction, the difference between the global maximum net total magnetic force and the first local maximum net total magnetic force can indicate a probability that the magnetic attachment system will equilibrate at the global maximum net total magnetic force (representing the strongest net magnetic attraction) and the first local maximum net total magnetic force (representing a weak net magnetic attraction).

Therefore, if at 3012, the difference is acceptable (meaning that the global maximum is the likely equilibrium point), then process 3000 stops, otherwise, the configuration of magnetic elements is changed at 3014 and control is passed directly to 3006 for further evaluation.

Figure 40:
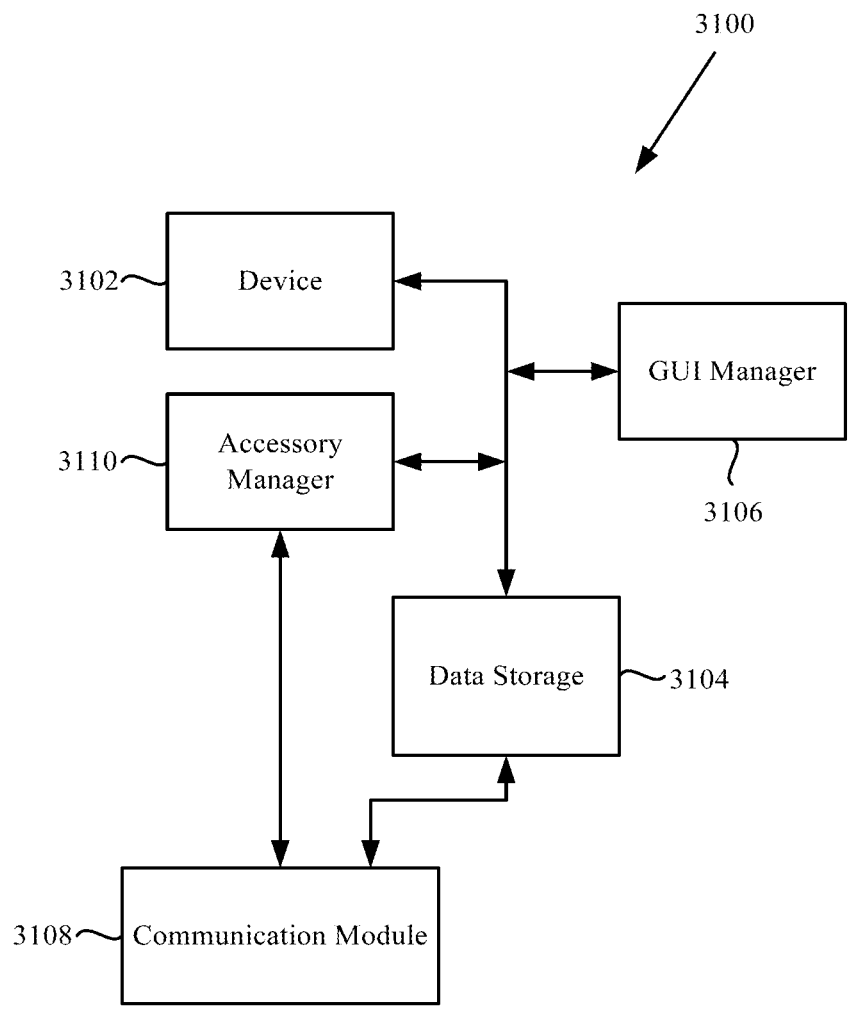
FIG. 40 is a block diagram of an arrangement of functional modules utilized by a portable media device.

FIG. 40 is a block diagram of an arrangement 3100 of functional modules utilized by an electronic device. The electronic device can, for example, be tablet device 1100. The arrangement 3100 includes an electronic device 3102 that is able to output media for a user of the portable media device but also store and retrieve data with respect to data storage 3104. The arrangement 3100 also includes a graphical user interface (GUI) manager 3106. The GUI manager 3106 operates to control information being provided to and displayed on a display device. The arrangement 3100 also includes a communication module 3108 that facilitates communication between the portable media device and an accessory device. Still further, the arrangement 3100 includes an accessory manager 3110 that operates to authenticate and acquire data from an accessory device that can be coupled to the portable media device.

Figure 41:
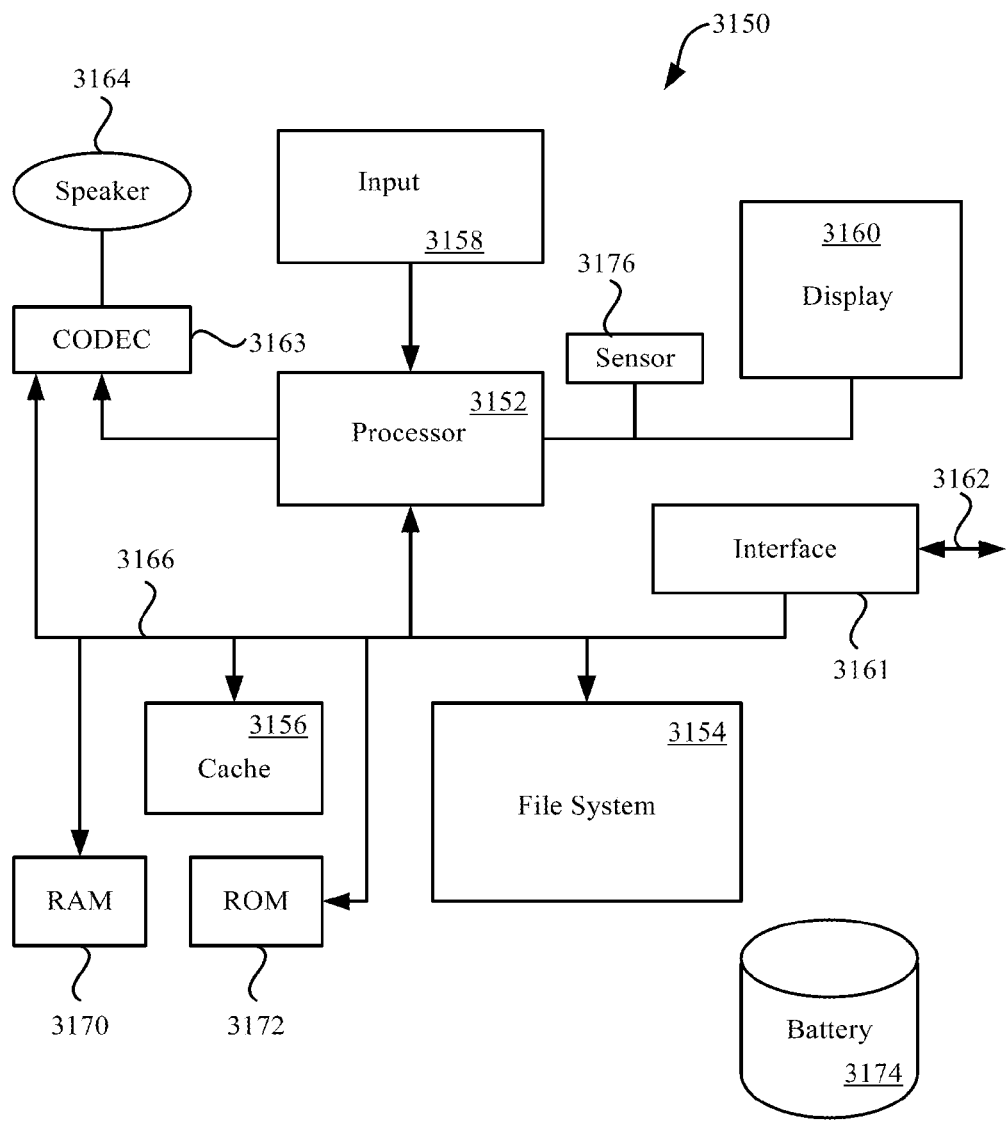
FIG. 41 is a block diagram of an electronic device suitable for use with the described embodiments.

FIG. 41 is a block diagram of an electronic device 3150 suitable for use with the described embodiments. The electronic device 3150 illustrates circuitry of a representative computing device. The electronic device 3150 includes a processor 3152 that pertains to a microprocessor or controller for controlling the overall operation of the electronic device 3150. The electronic device 3150 stores media data pertaining to media items in a file system 3154 and a cache 3156. The file system 3154 is, typically, a storage disk or a plurality of disks. The file system 3154 typically provides high capacity storage capability for the electronic device 3150. However, since the access time to the file system 3154 is relatively slow, the electronic device 3150 can also include a cache 3156. The cache 3156 is, for example, Random-Access Memory (RAM) provided by semiconductor memory. The relative access time to the cache 3156 is substantially shorter than for the file system 3154. However, the cache 3156 does not have the large storage capacity of the file system 3154. Further, the file system 3154, when active, consumes more power than does the cache 3156. The power consumption is often a concern when the electronic device 3150 is a portable media device that is powered by a battery 3174. The electronic device 3150 can also include a RAM 3170 and a Read-Only Memory (ROM) 3172. The ROM 3172 can store programs, utilities or processes to be executed in a non-volatile manner. The RAM 3170 provides volatile data storage, such as for the cache 3156.

The electronic device 3150 also includes a user input device 3158 that allows a user of the electronic device 3150 to interact with the electronic device 3150. For example, the user input device 3158 can take a variety of forms, such as a button, keypad, dial, touch screen, audio input interface, visual/image capture input interface, input in the form of sensor data, etc. Still further, the electronic device 3150 includes a display 3160 (screen display) that can be controlled by the processor 3152 to display information to the user. A data bus 3166 can facilitate data transfer between at least the file system 3154, the cache 3156, the processor 3152, and the CODEC 3163.

In one embodiment, the electronic device 3150 serves to store a plurality of media items (e.g., songs, podcasts, etc.) in the file system 3154. When a user desires to have the electronic device play a particular media item, a list of available media items is displayed on the display 3160. Then, using the user input device 3158, a user can select one of the available media items. The processor 3152, upon receiving a selection of a particular media item, supplies the media data (e.g., audio file) for the particular media item to a coder/decoder (CODEC) 3163. The CODEC 3163 then produces analog output signals for a speaker 3164. The speaker 3164 can be a speaker internal to the electronic device 3150 or external to the electronic device 3150. For example, headphones or earphones that connect to the electronic device 3150 would be considered an external speaker.

The electronic device 3150 also includes a network/bus interface 3161 that couples to a data link 3162. The data link 3162 allows the electronic device 3150 to couple to a host computer or to accessory devices. The data link 3162 can be provided over a wired connection or a wireless connection. In the case of a wireless connection, the network/bus interface 3161 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 3176 can take the form of circuitry for detecting any number of stimuli. For example, sensor 3176 can include a Hall Effect sensor responsive to external magnetic field, an audio sensor, a light sensor such as a photometer, and so on.

The magnetic attachment feature can be used to magnetically attach at least two objects. The objects can take many forms and perform many functions. When magnetically attached to each other, the objects can communicate and interact with each other to form a cooperative system. The cooperating system can perform operations and provide functions that cannot be provided by the separate objects individually. For example, at least a first object and a second object can be magnetically attached to each other such that the first object can be configured to provide a support mechanism to the second object. The support mechanism can be mechanical in nature. For example, the first object can take the form of a stand that can be used to support the second object on a working surface such as a table. In another example, the first object can take the form of a hanging apparatus. As such, the first object can be used to hang the second object that can then be used as a display for presenting visual content such as a visual, still images like a picture, art work, and so on. The support mechanism can also be used as a handle for conveniently grasping or holding the second object. This arrangement can be particularly useful when the second object can present visual content such as images (still or visual), textual (as in an e-book) or has image capture capabilities in which case the second object can be used as an image capture device such as a still or visual camera and the first object can be configured to act as a support such as a tripod or handle.

The described embodiments can take many forms. For example, the attachment can occur between a first and second object where the first object and second object can take the form of electronic devices. The electronic devices can be magnetically attached to each other to form a cooperative electronic system in which the electronic devices can communicate with each other. As part of this communication, information can be passed between the first and second electronic devices. The information can be processed in whole or in part at either the first or second electronic device depending upon the nature of the processing. In this way, the cooperative electronic system can take advantage of the synergistic effect of having multiple electronic devices magnetically attached and in communication with each other. In one implementation, the communication can be carried out wirelessly using any suitable wireless communication protocol such as Bluetooth (BT), GSM, CDMA, WiFi, and so on.

The cooperative electronic system can take the form of an array of electronic devices. In one embodiment, the array of electronic devices can act as a single unified display (along the lines of a mosaic). In another embodiment, the array of electronic devices can provide a single or a set of functions (such as virtual keyboard). In still another embodiment, at least one of the electronic devices can take the form of a power providing device that can be attached to the electronic device using the magnetic attachment feature. The power providing device can utilize a mechanical connection such as a power port, or in some cases a magnetically based charging mechanism, to provide current to the electronic device. The current can be used to charge a battery if necessary while providing power to operate the cooperative electronic system. The power provided can be passed from one device to another as in a bucket brigade to even out the power distribution and battery charge levels in the cooperative electronic system.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The computer readable medium is defined as any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

The advantages of the embodiments described are numerous. Different aspects, embodiments or implementations can yield one or more of the following advantages. Many features and advantages of the present embodiments are apparent from the written description and, thus, it is intended by the appended claims to cover all such features and advantages of the invention. Further, since numerous modifications and changes will readily occur to those skilled in the art, the embodiments should not be limited to the exact construction and operation as illustrated and described. Hence, all suitable modifications and equivalents can be resorted to as falling within the scope of the invention.

What is claimed is:

1. A protective cover suitable for releasable attachment to an electronic device having a display with an outer protective layer and configured to present visual content, a sensor, and a processor coupled to the display and the sensor, comprising:
   a flexible flap having a size and shape in accordance with the display and foldable into a folded state with respect to the electronic device comprising:
   a first surface and a second surface most of which is configured to come into direct contact with the outer protective layer in a closed configuration, and
   a magnet disposed within the flap between the first and second surfaces and configured to provide a magnetic field at least through the second surface that is detectable by the sensor, wherein the processor uses the detectability of the magnetic field by the sensor to determine a folded state of the cover with respect to the electronic device and subsequently alter an operation of the electronic device in accordance with the folded state.

2. The protective cover as recited in claim 1, the processor altering the operation of the electronic device in accordance with the folded state comprising causing the display to present visual content in accordance with an amount of that display that is viewable.

3. The protective cover as recited in claim 2, the flap further comprising:
   a plurality of independently foldable segments comprising a first segment at the first side of the flap and a second segment at the second side of the flap, the second segment comprising the magnet, wherein the plurality of independently foldable segments fold with respect to each other and the electronic device to form the folded state of the protective cover.

4. The protective cover as recited in claim 3, a first folded state comprising the first and second segments folded in such a way that the magnetic field is not detected by the sensor and the first segment is in substantial contact with the outer protective layer such that only a first portion of the display is viewable.

5. The protective cover as recited in claim 4, the magnetic field is not detected when the second segment is folded away from the outer protective layer.

6. The protective cover as recited in claim 5, the flap further comprising:
   a third independently foldable segment disposed between the first segment and the second segment.

7. The protective cover as recited in claim 6, the electronic device further comprising a second sensor disposed in the housing and coupled to the processor and configured to detect the third foldable segment.

8. The protective cover as recited in claim 7, a second folded state comprising the flap folded in such a way that the first segment is in substantial contact with the outer protective layer, the sensor does not detect the magnetic field and the second sensor does not detect the third segment.

9. The protective cover as recited in claim 8, the protective cover configured in the second folded state reveals a second viewable portion of the display that includes at least the first viewable portion.

10. The protective cover as recited in claim 9, wherein the sensor is a Hall Effect sensor arranged to detect the magnetic field when the magnet is in proximity to the outer protective layer.

11. The protective cover as recited in claim 10 wherein the second sensor is an optical sensor configured to detect an amount of ambient light only in accordance with the third segment being folded away from the outer protective layer of the display.

12. The protective cover as recited in claim 10, wherein the third segment comprises a second magnet and the second sensor comprises a second Hall Effect sensor arranged to detect the second magnet indicating that that the third segment is at least in proximity to the outer protective layer.

13. The protective cover as recited in claim 1, the flap further comprising an electronic circuit, the electronic circuit in communication with the processor and operable in accordance with the folded state of the flap.

14. The protective cover as recited in claim 13, the electronic circuit comprising an input device arranged to receive a tactile input and pass a corresponding input signal to the processor for interpretation.

15. The protective cover as recited in claim 14, wherein processor interprets the input signal as a control signal used to control an associated operation of the electronic device.

16. The protective cover as recited in claim 15, wherein the input device is a keyboard apparatus.

17. The protective cover as recited in claim 1, wherein in the closed configuration, the processor causes the electronic device to enter a low power operating state.

18. The protective cover as recited in claim 1, further comprising an attachment mechanism used to releasably attach the protective cover to the electronic device.

19. The protective cover as recited in claim 18, the attachment mechanism comprising at least a magnetic element, the magnetic element magnetically configured to form a magnetic attachment to a corresponding magnetic element disposed in the electronic device.

20. The protective cover as recited in claim 1, the flap further comprising another magnet separate from the magnet arranged to form a magnetic attachment with a magnet disposed beneath the outer protective layer that is used to secure the flap to the outer protective layer.

* * * * *